(12) United States Patent
Ito et al.

(10) Patent No.: US 10,270,036 B2
(45) Date of Patent: Apr. 23, 2019

(54) POLYMER, COMPOSITION INCLUDING THE POLYMER, AND ORGANIC LIGHT-EMITTING DEVICE INCLUDING THE POLYMER

(71) Applicant: Samsung Electronics Co., Ltd., Suwon-si, Gyeonggi-do (KR)

(72) Inventors: Mitsunori Ito, Yokohama (JP); Takao Motoyama, Yokohama (JP); Keisuke Korai, Yokohama (JP); Daeyoung Chung, Suwon-si (KR); Eunjoo Jang, Suwon-si (KR); Taehyung Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/855,061

(22) Filed: Dec. 27, 2017

(65) Prior Publication Data
US 2018/0182967 A1 Jun. 28, 2018

(30) Foreign Application Priority Data

Dec. 27, 2016 (JP) .................................. 2016-253657
Oct. 30, 2017 (JP) .................................. 2017-209849
Nov. 27, 2017 (KR) ........................ 10-2017-0159693

(51) Int. Cl.
*H01L 51/00* (2006.01)
*C08G 61/02* (2006.01)
*H01L 51/52* (2006.01)
*H01L 51/50* (2006.01)

(52) U.S. Cl.
CPC .......... *H01L 51/0039* (2013.01); *C08G 61/02* (2013.01); *H01L 51/0035* (2013.01);
(Continued)

(58) Field of Classification Search
CPC .. C07D 333/76; C07D 307/91; C07D 209/86; C07C 211/54; C07C 211/61; C07C 209/68; C07C 209/60; C07C 2603/18; C07C 2603/26; C07C 2603/09; C09K 11/06; C09K 2211/1022; C09K 2211/1029; C09K 2211/1033; C09K 2211/1037; C09K 2211/1044; C09K 2211/1092; C09K 2211/185; H01L 51/0061; H01L 51/006; H01L 51/0058; H01L 51/0073; H01L 51/0074; H01L 51/0056; H01L 51/5096; H01L 51/5088; H01L 51/5056; H01L 51/0072; H01L 51/0052; H01L 51/0085; H01L 51/0087; H01L 51/0039; H01L 51/0035; H01L 51/0043; H01L 51/5016; H01L 51/502; H01L 51/5206; H01L 51/5221; Y02E 10/549; C08G 2261/12;
(Continued)

(56) References Cited

U.S. PATENT DOCUMENTS 8,142,908 B2 * 3/2012 Nakatani ............... C08G 61/12
                                                                    252/301.35
8,440,325 B2   5/2013 McKiernan et al.
(Continued)

FOREIGN PATENT DOCUMENTS

JP   2012-007021 A   1/2012
JP   2013-074945 A   4/2013
(Continued)

*Primary Examiner* — Nikolay K Yushin
(74) *Attorney, Agent, or Firm* — Cantor Colburn LLP

(57) ABSTRACT

Provided are a polymer, a composition including the polymer, and an organic light-emitting device including the polymer.

20 Claims, 2 Drawing Sheets

(52) U.S. Cl.
CPC ...... *H01L 51/0043* (2013.01); *C08G 2261/12* (2013.01); *C08G 2261/148* (2013.01); *C08G 2261/149* (2013.01); *C08G 2261/1412* (2013.01); *C08G 2261/1414* (2013.01); *C08G 2261/1434* (2013.01); *C08G 2261/95* (2013.01); *H01L 51/502* (2013.01); *H01L 51/5016* (2013.01); *H01L 51/5206* (2013.01); *H01L 51/5221* (2013.01)

(58) Field of Classification Search
CPC .... C08G 2261/1412; C08G 2261/1414; C08G 2261/1434; C08G 2261/148; C08G 2261/149; C08G 2261/95; C08G 61/02; C08G 61/161; C08G 61/123; C08G 61/124; C08G 61/122; C08G 61/12
See application file for complete search history.

(56) References Cited

U.S. PATENT DOCUMENTS

| 8,466,256 | B2 * | 6/2013 | Min | C08G 61/02 428/690 |
| 8,932,493 | B2 * | 1/2015 | Huh | H01B 1/124 252/500 |
| 9,096,425 | B2 * | 8/2015 | Coe-Sullivan | B82Y 30/00 |
| 9,196,835 | B2 * | 11/2015 | Yang | C08G 73/0644 |
| 9,728,725 | B2 * | 8/2017 | Carroll | C08G 61/123 |
| 9,761,820 | B2 | 9/2017 | Pillow et al. | |
| 9,920,167 | B2 * | 3/2018 | Yang | C08G 73/06 |
| 2010/0084965 | A1 | 4/2010 | Nakatani et al. | |
| 2014/0231771 | A1 | 8/2014 | Yomogita et al. | |
| 2015/0255724 | A1 | 9/2015 | Pan | |
| 2017/0018710 | A1 | 1/2017 | Mujica-Fernaud et al. | |

FOREIGN PATENT DOCUMENTS

| JP | 2013-087216 A | 5/2013 |
| JP | 5274755 B2 | 5/2013 |
| JP | 5372519 B2 | 9/2013 |
| JP | 2015-063657 A | 4/2015 |
| JP | 2016-501915 A | 1/2016 |
| JP | 2016-503087 A | 2/2016 |
| JP | 2016-084370 A | 5/2016 |
| KR | 10-1445002 B1 | 9/2014 |
| KR | 10-2016-0099093 A | 8/2016 |

* cited by examiner

POLYMER, COMPOSITION INCLUDING THE POLYMER, AND ORGANIC LIGHT-EMITTING DEVICE INCLUDING THE POLYMER

CROSS-REFERENCE TO RELATED APPLICATIONS

This application claims priority to Japanese Patent Application No. 2016-253657, filed on Dec. 27, 2016, Japanese Patent Application No. 2017-209849, filed on Oct. 30, 2017, in the Japanese Patent Office, and Korean Patent Application No. 10-2017-0159693, filed on Nov. 27, 2017, in the Korean Intellectual Property Office, and all the benefits accruing therefrom under 35 U.S.C. § 119, the contents of which are incorporated herein in their entireties by reference.

BACKGROUND

1. Field

One or more embodiments relate to a polymer, a composition including the polymer, and an organic light-emitting device including the polymer.

2. Description of the Related Art

Organic light-emitting devices (OLEDs) are self-emission devices, which have wide viewing angles, high contrast ratios, short response times, display excellent characteristics in terms of brightness, driving voltage, and response speed, and produce full-color images.

In an example, an organic light-emitting device includes an anode, a cathode, and an organic layer between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide a polymer, a composition including the polymer, and an organic light-emitting device including the polymer.

The polymer may have a high minimum excitation triplet energy level, and the organic light-emitting device including the polymer may have a low driving voltage, high current efficiency, and a long lifespan.

The polymer may provide characteristics suitable for use in solution coating.

Additional aspects will be set forth in part in the description which follows and, in part, will be apparent from the description, or may be learned by practice of the presented embodiments.

An aspect of the present disclosure provides a polymer including a first repeating unit represented by Formula 1 and a second repeating unit represented by Formula 2:

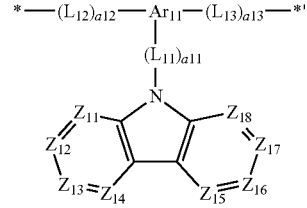

Formula 1

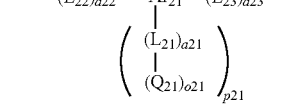

Formula 2

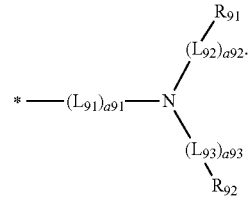

Formula 9

In Formulae 1, 2, and 9, $Z_{11}$ may be selected from N and $C(R_{11})$, $Z_{12}$ may be selected from N and $C(R_{12})$, $Z_{13}$ may be selected from N and $C(R_{13})$, $Z_{14}$ may be selected from N and $C(R_{14})$, $Z_{15}$ may be selected from N and $C(R_{15})$, $Z_{16}$ may be selected from N and $C(R_{16})$, $Z_{17}$ may be selected from N and $C(R_{17})$, and $Z_{18}$ may be selected from N and $C(R_{18})$, $Ar_{11}$ and $Ar_{21}$ may each independently be selected from a substituted or unsubstituted $C_5$-$C_{30}$ carbocyclic group and a substituted or unsubstituted $C_1$-$C_{30}$ heterocyclic group;

$L_{11}$ to $L_{13}$, $L_{21}$ to $L_{23}$, and $L_{91}$ to $L_{93}$ may each independently be selected from a single bond, a substituted or unsubstituted $C_1$-$C_{24}$ alkylene group, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, and a substituted or unsubstituted divalent non-aromatic condensed heteropolycyclic group;

a11 to a13, a21 to a23, and a91 to a93 may each independently be selected from 0, 1, 2, and 3;

$R_{11}$ to $R_{18}$ may each independently be selected from a group represented by Formula 9, hydrogen, a substituted or unsubstituted $C_1$-$C_{24}$ alkyl group, a substituted or unsubstituted $C_1$-$C_{24}$ alkoxy group, a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group, wherein at least one of $R_{11}$ to $R_{18}$ is a group represented by Formula 9, and two neighboring groups selected from $R_{11}$ to $R_{18}$ are optionally linked to form a ring, $R_{91}$ and $R_{92}$ may each independently be selected from a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group, $Q_{21}$ may be a crosslinking group, o21 may be an integer greater than or equal to 1, p21 may be an integer greater than or equal to 1, and

* and *' each indicate a binding site to a neighboring atom.

Another aspect of the present disclosure provides a composition including the polymer described above.

Another aspect of the present disclosure provides a light-emitting device including:

a first electrode;

a second electrode; and an intermediate layer disposed between the first electrode and the second electrode, wherein the intermediate layer includes an emission layer, and wherein the intermediate layer includes the polymer described above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
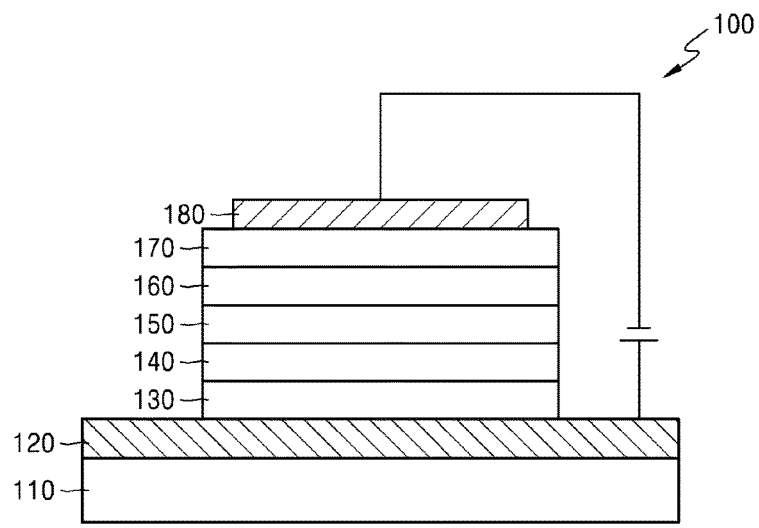
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

A first repeating unit represented by Formula 1, a second repeating unit represented by Formula 2, and a third repeating unit represented by Formula 3 are respectively referred to as a first repeating unit, a second repeating unit, and a third repeating unit.

Also, the operations and physical properties have been measured at a temperature of 20° C. to 25° C. and a relative humidity of 40% RH to 50% RH, unless otherwise specified.

The term "$C_1$-$C_{24}$ alkyl group" as used herein refers to a linear or branched saturated aliphatic hydrocarbon monovalent group having 1 to 24 carbon atoms, and examples thereof include a methyl group, an ethyl group, a propyl group, an isobutyl group, a sec-butyl group, a tert-butyl group, a pentyl group, an iso-amyl group, and a hexyl group.

The term "$C_1$-$C_{24}$ alkylene group" as used herein refers to a divalent group having the same structure as the $C_1$-$C_{24}$ alkyl group.

The term "$C_1$-$C_{24}$ alkoxy group" as used herein refers to a monovalent group represented by —$OA_{101}$ (wherein $A_{101}$ is the $C_1$-$C_{24}$ alkyl group), and examples thereof include a methoxy group, an ethoxy group, and an isopropyloxy group.

The term "$C_1$-$C_{24}$ alkythio group" as used herein refers to a monovalent group represented by —$SA_{102}$ (wherein $S_{102}$ is the $C_1$-$C_{24}$ alkyl group).

The term "$C_3$-$C_{30}$ cycloalkyl group" as used herein refers to a monovalent saturated hydrocarbon monocyclic group having 3 to 30 carbon atoms, and examples thereof include a cyclopropyl group, a cyclobutyl group, a cyclopentyl group, a cyclohexyl group, and a cycloheptyl group. The term "$C_3$-$C_{30}$ cycloalkylene group" as used herein refers to a divalent group having the same structure as the $C_3$-$C_{30}$ cycloalkyl group.

The term "$C_3$-$C_{30}$ cycloalkenyl group" as used herein refers to a monovalent monocyclic group that has 3 to 30 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{30}$ cycloalkenylene group," used herein, refers to a divalent group having the same structure as the $C_3$-$C_{30}$ cycloalkenyl group.

The term "$C_1$-$C_{30}$ heterocycloalkenyl group" as used herein refers to a monovalent monocyclic group that has at least one heteroatom selected from N, O, P, Si, and S as a ring-forming atom, 1 to 30 carbon atoms, and at least one carbon-carbon double bond in its ring. Examples of the $C_1$-$C_{30}$ heterocycloalkenyl group are a 2,3-dihydrofuranyl group, and a 2,3-dihydrothiophenyl group. The term "$C_1$-$C_{30}$ heterocycloalkenylene group," used herein, refers to a divalent group having the same structure as the $C_1$-$C_{30}$ heterocycloalkenyl group.

The term "$C_6$-$C_{30}$ aryl group" as used herein refers to a monovalent group having a carbocyclic aromatic system having 6 to 30 carbon atoms that are involved in the ring formation, and a $C_6$-$C_{60}$ arylene group used herein refers to a divalent group having a carbocyclic aromatic system having 6 to 60 carbon atoms. Examples of the $C_6$-$C_{30}$ aryl group are a phenyl group, a naphthyl group, an anthracenyl group, a phenanthrenyl group, a pyrenyl group, and a chrysenyl group. When the $C_6$-$C_{30}$ aryl group and the $C_6$-$C_{30}$ arylene group each include two or more rings, the rings may be fused to each other.

The term "$C_6$-$C_{30}$ aryloxy group" as used herein refers to a monovalent group represented by —$OA_{103}$ (wherein $A_{103}$ is the $C_6$-$C_{30}$ aryl group).

The term "$C_6$-$C_{30}$ arylthio group" as used herein refers to a monovalent group represented by —$SA_{104}$ (wherein $A_{104}$ is the $C_6$-$C_{30}$ aryl group).

The term "$C_1$-$C_{30}$ heteroaryl group" as used herein refers to a monovalent group having a carbocyclic aromatic system that has at least one heteroatom selected from N, O, Si, P, and S as a ring-forming atom, in addition to 1 to 30 carbon atoms that are involved in the ring formation. The term "$C_1$-$C_{30}$ heteroarylene group" as used herein refers to a divalent group having a carbocyclic aromatic system that has at least one heteroatom selected from N, O, Si, P, and S as a ring-forming atom, in addition to 1 to 60 carbon atoms that are involved in the ring formation. Examples of the $C_1$-$C_{30}$ heteroaryl group include a pyridinyl group, a pyrimidinyl group, a pyrazinyl group, a pyridazinyl group, a triazinyl group, a quinolinyl group, and an isoquinolinyl group. When the $C_5$-$C_{30}$ heteroaryl group and the $C_5$-$C_{30}$ heteroarylene group each include two or more rings, the rings may be fused to each other.

The term "$C_7$-$C_{30}$ arylalkyl group" as used herein refers to a monovalent group in which an alkyl group is substituted with an aryl group and the sum of carbon atoms of the constituting groups, i.e., the alkyl group and the aryl group, is 7 to 30. Examples of the $C_7$-$C_{30}$ arylalkyl group include a benzyl group, a phenylethyl group, a methylbenzyl group, and a naphthyl methyl group.

The term "$C_6$-$C_{30}$ arylalkyloxy group" as used herein refers to a monovalent group represented by —$OA_{105}$ (wherein $A_{105}$ is the $C_7$-$C_{30}$ arylalkyl group).

The term "$C_6$-$C_{30}$ aryl alkylthio group: as used herein refers to a monovalent group represented by —$SA_{106}$ (wherein $A_{106}$ is the $C_7$-$C_{30}$ arylalkyl group).

The term "$C_8$-$C_{30}$ arylalkenyl group" as used herein refers to a monovalent group in which an alkenyl group is substituted with an aryl group and the sum of carbon atoms of the constituting groups, i.e., the alkenyl group and the aryl group, is 8 to 30.

The term "$C_8$-$C_{30}$ arylalkynyl group" as used herein refers to a monovalent group in which an alkynyl group is substituted with an aryl group and the sum of carbon atoms of the constituting groups, i.e., the alkynyl group and the aryl group, is 8 to 30.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only.

The term "$C_5$-$C_{30}$ carbocyclic group" as used herein refers to a monocyclic group or a polycyclic group, and, according to its chemical structure, may be a monovalent, divalent, trivalent, tetravalent, pentavalent, or hexavalent group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The term "$C_1$-$C_{30}$ heterocyclic group" as used herein refers to a monocyclic group or a polycyclic group, and, according to its chemical structure, may be a monovalent, divalent, trivalent, tetravalent, pentavalent, or hexavalent group.

At least one substituent in any of the above groups may be selected from:
  deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
  a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);
  a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;
  a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, Si($Q_{21}$)($Q_{22}$)($Q_{23}$), —N($Q_{24}$)($Q_{25}$), and —B($Q_{26}$)($Q_{27}$); and
  Si($Q_{31}$)($Q_{32}$)($Q_{33}$), —N($Q_{34}$)($Q_{35}$), and —B($Q_{36}$)($Q_{37}$), and
  $Q_{11}$ to $Q_{17}$, $Q_{21}$ to $Q_{27}$, and $Q_{31}$ to $Q_{37}$ may each independently be selected from hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, embodiments of the present disclosure will be described. Also, the present disclosure is not limited to the embodiments.

Polymer

A polymer according to an embodiment will be described in detail below.

First Repeating Unit and Second Repeating Unit

The polymer according to an embodiment includes a first repeating unit represented by Formula 1 and a second repeating unit represented by Formula 2. The polymer may include one first repeating unit or may include two or more first repeating units. Also, the polymer may include one second repeating unit or may include two or more second repeating units:

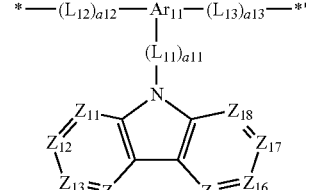

Formula 1

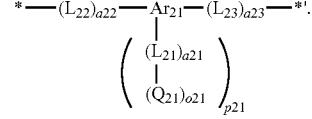

Formula 2

In Formula 1, $Z_{11}$ may be selected from N and C($R_{11}$), $Z_{12}$ may be selected from N and C($R_{12}$), $Z_{13}$ may be selected from N and C($R_{13}$), $Z_{14}$ may be selected from N and C($R_{14}$), $Z_{15}$ may be selected from N and C($R_{15}$), $Z_{16}$ may be selected from N and C($R_{16}$), $Z_{17}$ may be selected from N and C($R_{17}$), and $Z_{18}$ may be selected from N and C($R_{18}$). $R_{11}$ to $R_{18}$ are the same as described below.

For example, in Formula 1,
  $Z_{11}$ may be C($R_{11}$), $Z_{12}$ may be C($R_{12}$), $Z_{13}$ may be C($R_{13}$), $Z_{14}$ may be C($R_{14}$), $Z_{15}$ may be C($R_{15}$), $Z_{16}$ may be C($R_{16}$), $Z_{17}$ may be C($R_{17}$), and $Z_{18}$ may be C($R_{18}$);
  $Z_{11}$ may be N, $Z_{12}$ may be C($R_{12}$), $Z_{13}$ may be C($R_{13}$), $Z_{14}$ may be C($R_{14}$), $Z_{15}$ may be C($R_{15}$), $Z_{16}$ may be C($R_{16}$), $Z_{17}$ may be C($R_{17}$), and $Z_{18}$ may be C($R_{18}$);
  $Z_{11}$ may be C($R_{11}$), $Z_{12}$ may be N, $Z_{13}$ may be C($R_{13}$), $Z_{14}$ may be C($R_{14}$), $Z_{15}$ may be C($R_{15}$), $Z_{16}$ may be C($R_{16}$), $Z_{17}$ may be C($R_{17}$), and $Z_{18}$ may be C($R_{18}$);
  $Z_{11}$ may be C($R_{11}$), $Z_{12}$ may be C($R_{12}$), $Z_{13}$ may be N, $Z_{14}$ may be C($R_{14}$), $Z_{15}$ may be C($R_{15}$), $Z_{16}$ may be C($R_{16}$), $Z_{17}$ may be C($R_{17}$), and $Z_{18}$ may be C($R_{18}$);
  $Z_{11}$ may be C($R_{11}$), $Z_{12}$ may be C($R_{12}$), $Z_{13}$ may be C($R_{13}$), $Z_{14}$ may be N, $Z_{15}$ may be C($R_{15}$), $Z_{16}$ may be C($R_{16}$), $Z_{17}$ may be C($R_{17}$), and $Z_{18}$ may be C($R_{18}$);

$Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be N, $Z_{16}$ may be $C(R_{16})$, $Z_{17}$ may be $C(R_{17})$, and $Z_{18}$ may be $C(R_{18})$;

$Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be N, $Z_{17}$ may be $C(R_{17})$, and $Z_{18}$ may be $C(R_{18})$;

$Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be N, and $Z_{18}$ may be $C(R_{18})$; or $Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be $C(R_{17})$, and $Z_{18}$ may be N, but embodiments of the present disclosure are not limited thereto.

In an embodiment, in Formula 1, $Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be $C(R_{17})$, and $Z_{18}$ may be $C(R_{18})$, and $R_{16}$ may be a group represented by Formula 9, but embodiments of the present disclosure are not limited thereto:

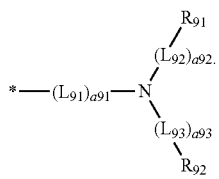

Formula 9

In Formula 9, $L_{91}$ to $L_{93}$, a91 to a93, $R_{91}$, and $R_{92}$ are the same as described below, and

* indicates a binding site to a neighboring atom.

$Ar_{11}$ and $Ar_{21}$ in Formulae 1 and 2 may each independently be selected from a substituted or unsubstituted $C_5$-$C_{30}$ carbocyclic group and a substituted or unsubstituted $C_1$-$C_{30}$ heterocyclic group.

For example, in Formulae 1 and 2, $Ar_{11}$ and $Ar_{21}$ may each independently be selected from:

a benzene group, a pentalene group, an indene group, a naphthalene group, an anthracene group, an azulene group, a heptacene group, an acenaphthalene group, a phenalene group, a fluorene group, an antraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group;

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ may each independently be selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group, but embodiments of the present disclosure are not limited thereto.

In an embodiment, in Formulae 1 and 2, $Ar_{11}$ and $Ar_{21}$ may each independently be selected from:

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group;

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl;

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group that are each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-dococyl group, an n-tricocyl group, an n-tetracocyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, but embodiments of the present disclosure are not limited thereto.

In an embodiment, in Formulae 1 and 2, $Ar_{11}$ and $Ar_{21}$ may each independently be selected from:
- a benzene group, a naphthalene group, a fluorene group, a pyrrole group, a pyridine group, a pyridazine group, a pyrimidine group, and a carbazole group;
- a benzene group, a naphthalene group, a fluorene group, a pyrrole group, a pyridine group, a pyridazine group, a pyrimidine group, and a carbazole group, each substituted with at least one selected from deuterium, —F, —Cl, —Br, —I, a cyano group, a nitro group, a methyl group, an ethyl group, an n-propyl group, an iso-propyl group, a tert-butyl group, a benzyl group, a phenylethyl group, a phenylpropyl group, a phenyl group, a biphenyl group, a fluorenyl group, a naphthyl group, an anthryl group, a terphenyl group, a pyridyl group, a bipyridyl group, a pyrrolyl group, a dibenzofuranyl group, a carbazolyl group, and a dibenzothiophenyl group; and
- a benzene group, a naphthalene group, a fluorene group, a pyrrole group, a pyridine group, a pyridazine group, a pyrimidine group, and a carbazole group, each substituted with at least one selected from a phenyl group, a biphenyl group, a fluorenyl group, a naphthyl group, an anthryl group, a terphenyl group, a pyridyl group, a bipyridyl group, a pyrrolyl group, a dibenzofuranyl group, a carbazolyl group, and a dibenzothiophenyl group that are each substituted with at least one selected from deuterium, —F, —Cl, —Br, —I, a cyano group, a nitro group, a methyl group, an ethyl group, an n-propyl group, an iso-propyl group, a tert-butyl group, a benzyl group, a phenylethyl group, and a phenylpropyl group, but embodiments of the present disclosure are not limited thereto.

In an embodiment, in Formulae 1 and 2, $Ar_{11}$ may be selected from Formulae 4-1 to 4-11, and $Ar_{21}$ may be selected from Formulae 4-12 and 4-13, but embodiments of the present disclosure are not limited thereto:

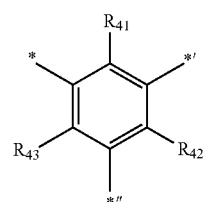

4-1

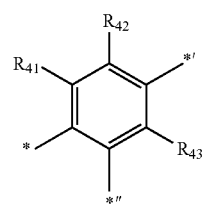

4-2

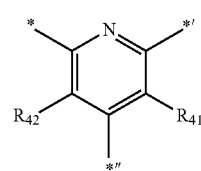

4-3

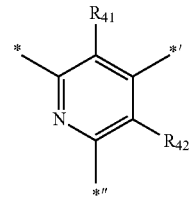

4-4

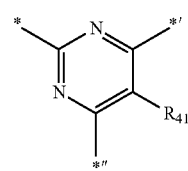

4-5

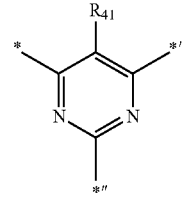

4-6

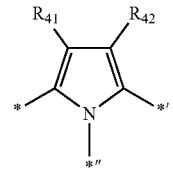

4-7

-continued

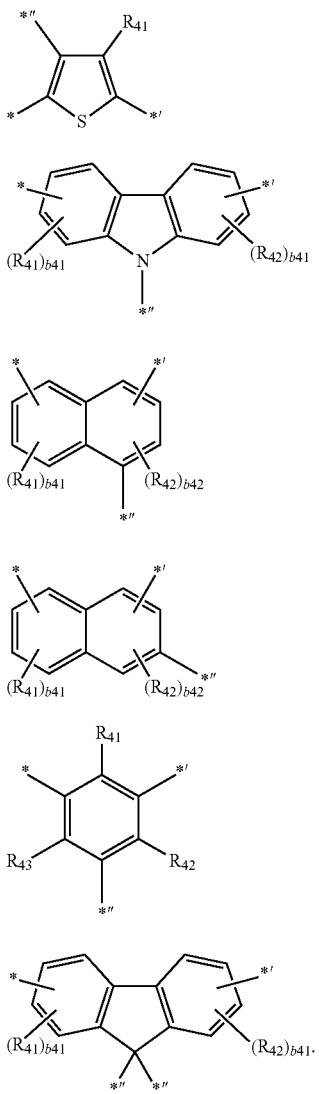

4-8

4-9

4-10

4-11

4-12

4-13

In Formulae 4-1 to 4-11,
$R_{41}$ to $R_{43}$ may each independently be selected from hydrogen, a methyl group, an ethyl group, an n-propyl group, and an iso-propyl group,
b41 may be selected from 1, 2, and 3,
b42 may be 1 or 2,
* and *' each indicate a binding site to an atom constituting a main chain of Formula 1, and
*'' indicates a binding site to an atom constituting a side chain of Formula 1.
In Formulae 4-12 and 4-13,
$R_{41}$ to $R_{43}$ may each independently be selected from hydrogen, a methyl group, an ethyl group, an n-propyl group, and an iso-propyl group,
b41 may be selected from 1, 2, and 3,
b42 may be 1 or 2,
* and *' each indicate a binding site to an atom constituting a main chain of Formula 2, and
*'' indicates a binding site to an atom constituting a side chain of Formula 2.
In Formulae 1, 2, and 9, $L_{11}$ to $L_{13}$, $L_{21}$ to $L_{23}$, and $L_{91}$ to $L_{93}$ may each independently be selected from a single bond, a substituted or unsubstituted $C_1$-$C_{24}$ alkylene group, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, and a substituted or unsubstituted divalent non-aromatic condensed heteropolycyclic group.

For example, in Formulae 1, 2, and 9, $L_{11}$ to $L_{13}$, $L_{21}$ to $L_{23}$ and $L_{91}$ to $L_{93}$ may each independently be selected from:
 a single bond, a methylene group, an ethylene group, a trimethylene group, a propylene group, a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group;
 a methylene group, an ethylene group, a trimethylene group, a propylene group, a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a C₇-C₃₀ aryl alkyl group, a C₇-C₃₀ aryl alkoxy group, a C₇-C₃₀ aryl alkylthio group, a C₈-C₃₀ aryl alkenyl group, a C₈-C₃₀ aryl alkynyl group, a C₁-C₃₀ heteroaryl group, a monovalent non-aromatic condensed polycyclic group, and a monovalent non-aromatic condensed heteropolycyclic group; and a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from a C₆-C₃₀ aryl group, a C₁-C₃₀ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a C₁-C₂₄ alkyl group, a C₁-C₂₄ alkoxy group, a C₁-C₂₄ alkylthio group, —N(Q₃₁)(Q₃₂), —Si(Q₃₁)(Q₃₂)(Q₃₃), —CO(Q₃₁), —O₂C(Q₃₁), —CO₂(Q₃₁), —C(O)N(Q₃₁), an imine group, an imidic acid group, a C₃-C₃₀ cycloalkyl group, a C₁-C₃₀ heterocycloalkyl group, a C₃-C₃₀ cycloalkenyl group, a C₁-C₃₀ heterocycloalkenyl group, a C₆-C₃₀ aryl group, a C₆-C₃₀ aryloxy group, a C₆-C₃₀ arylthio group, a C₇-C₃₀ aryl alkyl group, a C₇-C₃₀ aryl alkoxy group, a C₇-C₃₀ aryl alkylthio group, a C₈-C₃₀ aryl alkenyl group, a C₈-C₃₀ aryl alkynyl group, a C₁-C₃₀ heteroaryl group, a monovalent non-aromatic condensed polycyclic group, and a monovalent non-aromatic condensed heteropolycyclic group, and;

Q₂₁ to Q₂₃ and Q₃₁ to Q₃₃ may each independently be selected from hydrogen, a C₁-C₂₄ alkyl group, a C₁-C₃₀ heterocycloalkyl group, a C₃-C₃₀ cycloalkyl group, a C₆-C₃₀ aryl group, a C₁-C₃₀ heteroaryl group, a monovalent non-aromatic condensed polycyclic group, and a monovalent non-aromatic condensed heteropolycyclic group, but embodiments of the present disclosure are not limited thereto.

In an embodiment, in Formulae 1, 2, and 9, $L_{11}$ to $L_{13}$, $L_{21}$ to $L_{23}$, and $L_{91}$ to $L_{93}$ may each independently be selected from:

a single bond, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group;

a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group;

a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group that are each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-dococyl group, an n-tricocyl group, an n-tetracocyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, but embodiments of the present disclosure are not limited thereto.

In an embodiment, in Formula 1, 2, and 9, $L_{11}$ to $L_{13}$, $L_{21}$ to $L_{23}$, and $L_{91}$ to $L_{93}$ may each independently be selected from:

a single bond, a phenylene group, a biphenylene group, a terphenylene group, a naphthylene group, an anthracenylene group, a fluorenylene group, a naphthacenylene group, a phenanthrenylene group, and a pyrenylene group;

a phenylene group, a biphenylene group, a terphenylene group, a naphthylene group, an anthracenylene group, a fluorenylene group, a naphthacenylene group, a phenanthrenylene group, and a pyrenylene group, each substituted with at least one selected from deuterium, —F, —Cl, —Br, —I, a cyano group, a nitro group, a methyl group, an ethyl group, an n-propyl group, an iso-propyl group, a tert-butyl group, a benzyl group, a phenylethyl group, a phenylpropyl group, a phenyl group, a biphenyl group, a fluorenyl group, a naphthyl group, an anthryl group, a terphenyl group, a pyridyl group, a bipyridyl group, a pyrrolyl group, a dibenzofuranyl group, a carbazolyl group, and a dibenzothiophenyl group;

a phenylene group, a biphenylene group, a terphenylene group, a naphthylene group, an anthracenylene group, a fluorenylene group, a naphthacenylene group, a phenanthrenylene group, and a pyrenylene group, each substituted with at least one selected from a phenyl group, a biphenyl group, a fluorenyl group, a naphthyl group, an anthryl group, a terphenyl group, a pyridyl group, a bipyridyl group, a pyrrolyl group, a dibenzofuranyl group, a carbazolyl group, and a dibenzothiophenyl group that are each substituted with at least one selected from deuterium, —F, —Cl, —Br, —I, a cyano group, a nitro group, a methyl group, an ethyl group, an n-propyl group, an iso-propyl group, a tert-butyl group, a benzyl group, a phenylethyl group, and a phenylpropyl group, but embodiments of the present disclosure are not limited thereto.

In an embodiment, in Formula 1, 2, and 9, $L_{11}$ to $L_{13}$, $L_{21}$ to $L_{23}$, and $L_{91}$ to $L_{93}$ may each independently be selected from a single bond, a phenylene group, a biphenylene group, a terphenylene group, and a fluorenylene group, but embodiments of the present disclosure are not limited thereto.

In Formulae 1, 2, and 9, $L_{11}$ to $L_{13}$, $L_{21}$ to $L_{23}$, and $L_{91}$ to $L_{93}$ are selected as described above, thereby increasing the minimum excitation triplet energy level of the polymer and improving the hole transport and/or hole injection capability of the polymer. Furthermore, the solubility and coatability of the polymer may be improved.

In Formulae 1, 2, and 9, a11 to a13, a21 to a23, and a91 to a93 may each independently be selected from 0, 1, 2, and 3. In Formulae 1, 2, and 9, when a11 to a13, a21 to a23, and a91 to a93 are zero, $(L_{11})_{a11}$, $(L_{12})_{a12}$, $(L_{13})_{a13}$, $(L_{21})_{a21}$, $(L_{22})_{a22}$, $(L_{23})_{a23}$, $(L_{91})_{a91}$, $(L_{92})_{a92}$, and $(L_{93})_{a93}$ mean a single bond. In Formulae 1, 2, and 9, when a11 to a13, a21 to a23, and a91 to a93 are two or more, groups $L_{11}$ to $L_{13}$, $L_{21}$ to $L_{23}$, and $L_{91}$ to $L_{93}$ may be identical to or different from each other.

For example, in Formulae 1, 2, and 9, a11 to a13, a21 to a23, and a91 to a93 may each independently be 0 or 1, but embodiments of the present disclosure are not limited thereto.

In an embodiment, in Formula 1, $(L_{12})_{a12}$-$Ar_{11}$-$(L_{13})_{a13}$ may be selected from Formulae 5-1 to 5-9, but embodiments of the present disclosure are not limited thereto:

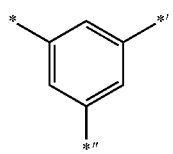

5-1

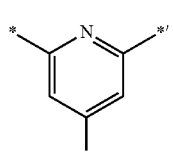

5-2

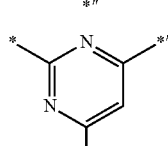

5-3

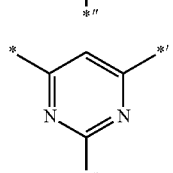

5-4

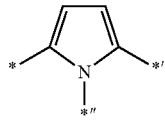

5-5

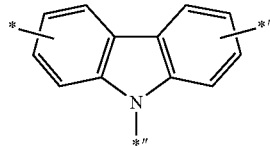

5-6

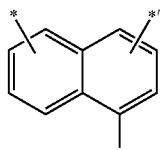

5-7

5-8

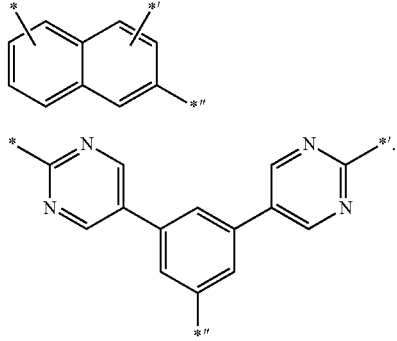

5-9

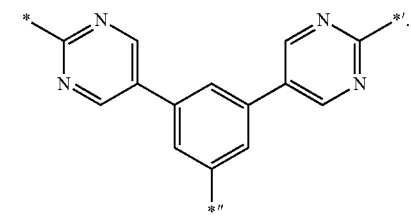

In Formulae 5-1 to 5-9,
* and *' each indicate a binding site to an atom constituting a main chain of Formula 1, and
*'' indicates a binding site to an atom constituting a side chain of Formula 1.

In Formula 1, $(L_{12})_{a12}$-$Ar_{11}$-$(L_{13})_{a13}$ is selected from Formulae 5-1 to 5-9, thus increasing a minimum excitation triplet energy level of the polymer.

In an embodiment, $(L_{22})_{a22}$-$Ar_{21}$-$(L_{23})_{a23}$ in Formula 2 may be selected from Formulae 5-10 to 5-14, but embodiments of the present disclosure are not limited thereto:

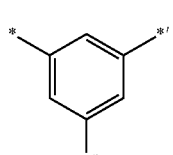

5-10

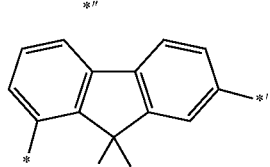

5-11

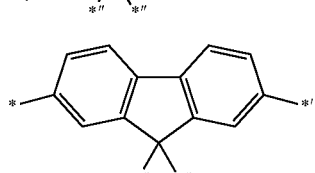

5-12

5-13

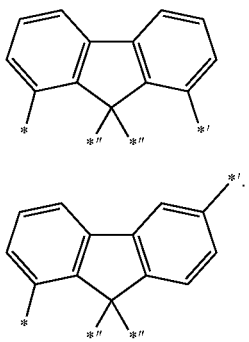

5-14

In Formulae 5-10 to 5-14,
* and *' each indicate a binding site to an atom constituting a main chain of Formula 2, and
*'' indicates a binding site to a side chain of Formula 2.

In Formula 1, $R_{11}$ to $R_{18}$ may each independently be selected from a group represented by Formula 9, hydrogen, a substituted or unsubstituted $C_1$-$C_{24}$ alkyl group, a substituted or unsubstituted $C_1$-$C_{24}$ alkoxy group, a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group, wherein at least one of $R_{11}$ to $R_{18}$ is a group represented by Formula 9, and two neighboring groups selected from $R_{11}$ to $R_{18}$ are optionally linked to form a ring.

For example, in Formula 1, $R_{11}$ to $R_{18}$ may each independently be selected from:

a group represented by Formula 9, hydrogen, a methyl group, an ethyl group, an n-propyl group, an iso-propyl group, an n-butyl group, an isobutyl group, a sec-butyl group, a tert-butyl group, an n-pentyl group, an iso-pentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-eicosyloxy group, a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group;

a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —$O_2$C($Q_{31}$), —$CO_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ may each independently be selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic, but embodiments of the present disclosure are not limited thereto.

In an embodiment, in Formula 1, $R_{11}$ to $R_{18}$ may each independently be selected from:

a group represented by Formula 9, hydrogen, a methyl group, an ethyl group, an n-propyl group, an iso-propyl group, an n-butyl group, an isobutyl group, a sec-butyl group, a tert-butyl group, an n-pentyl group, an iso-pentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-eicosyloxy group, a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-ispropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-haptadecyloxy group, an n-octadecyloxy group, and an n-eicosyloxy group, but embodiments of the present disclosure are not limited thereto.

In an embodiment, in Formula 1, $R_{11}$ to $R_{18}$ may each independently be selected from:
a group represented by Formula 9, hydrogen, a methyl group, an ethyl group, an n-propyl group, an iso-propyl group, an n-butyl group, an isobutyl group, a sec-butyl group, a tert-butyl group, an n-pentyl group, an iso-pentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-ispropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, a phenyl group, a biphenyl group, a terphenyl group, and a fluorenyl group; and
a phenyl group, a biphenyl group, a terphenyl group, and a fluorenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-ispropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, 2-methyl-1-iso-propoxy group, and a 1-tert-butyl-2-methylpropoxy group, but embodiments of the present disclosure are not limited thereto.

In Formula 9, $R_{91}$ and $R_{92}$ may each independently be selected from a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group.

For example, in Formula 9, $R_{91}$ and $R_{92}$ may each independently be selected from:
a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group;

a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ may each independently be selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group, but embodiments of the present disclosure are not limited thereto.

In an embodiment, in Formula 9, $R_{91}$ and $R_{92}$ may each independently be selected from:

a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, and an n-eicosyloxy group, but embodiments of the present disclosure are not limited thereto.

In an embodiment, in Formula 9, $R_{91}$ and $R_{92}$ may each independently be selected from:
a phenyl group, a biphenyl group, a terphenyl group, and a fluorenyl group; and
a phenyl group, a biphenyl group, a terphenyl group, and a fluorenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, 2-methyl-1-iso-propoxy group, and a 1-tert-butyl-2-methylpropoxy group, but embodiments of the present disclosure are not limited thereto.

In an embodiment, in Formula 9, $R_{91}$ and $R_{92}$ may each independently be selected from:
a phenyl group, a biphenyl group, a terphenyl group, and a fluorenyl group; and
a phenyl group, a biphenyl group, a terphenyl group, and a fluorenyl group, each substituted with at least one selected from a methyl group, an ethyl group, an n-propyl group, and an iso-propyl group, but embodiments of the present disclosure are not limited thereto.

In Formula 9, $-(L_{92})_{a92}-R_{91}$ and $-(L_{93})_{a93}-R_{92}$ may each independently be selected from Formulae 8-1 to 8-44, but embodiments of the present disclosure are not limited thereto:

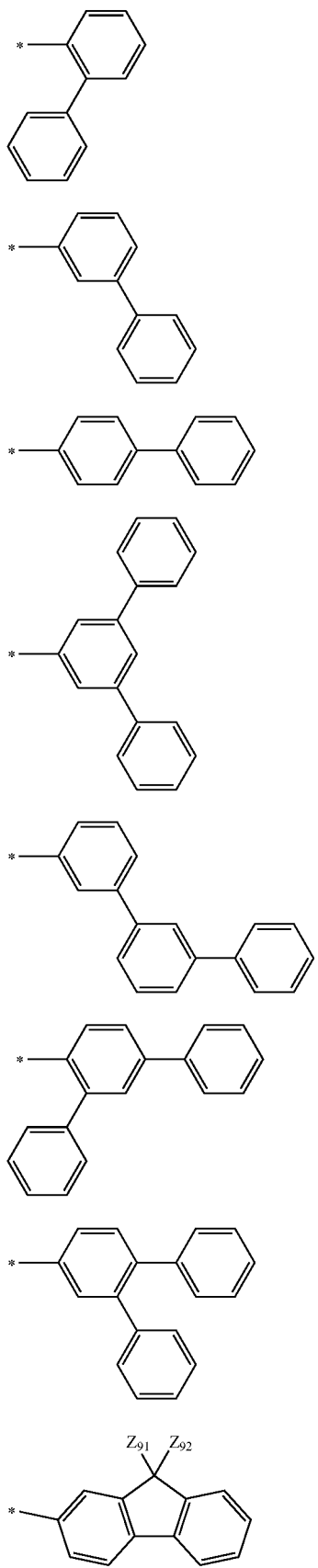

-continued
8-16
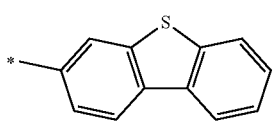
8-17
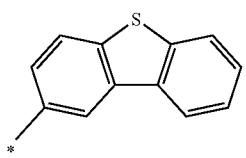
8-18
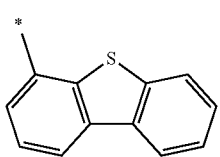
8-19
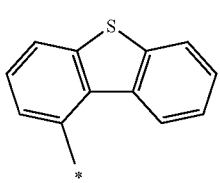
8-20
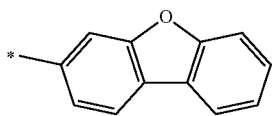
8-21
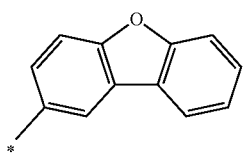
8-22
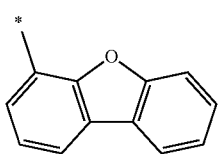
8-23
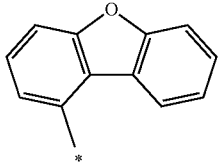
8-24
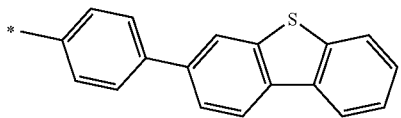
-continued
8-25
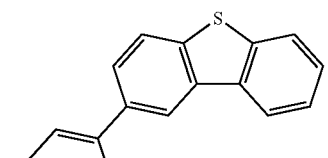
8-26
8-27
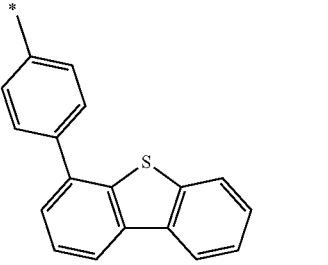
8-28
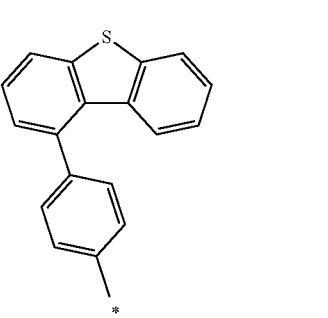
8-29
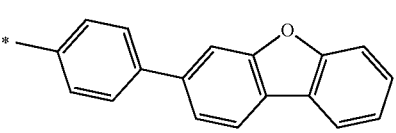
8-30
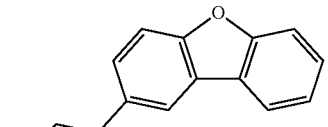

8-31 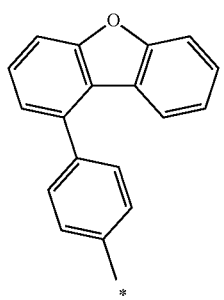
8-32 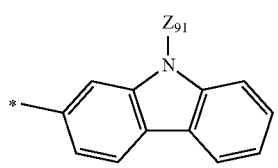
8-33 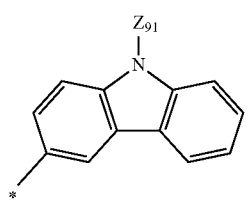
8-34 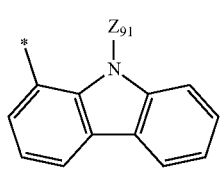
8-35 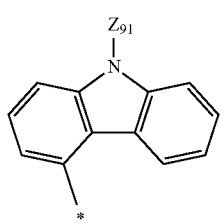
8-36 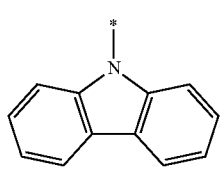
8-37 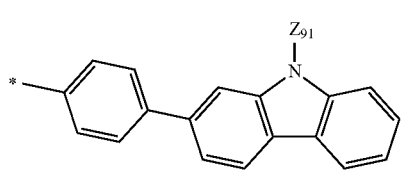
8-38 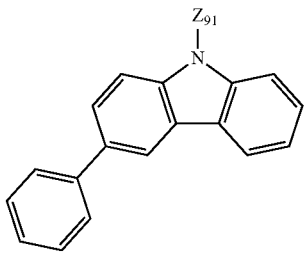
8-39 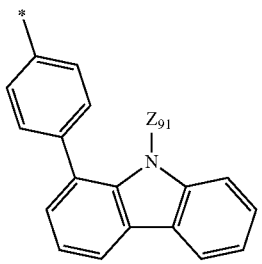
8-40 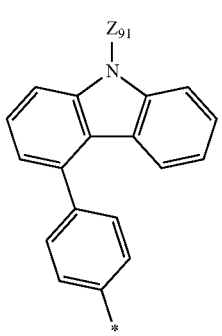
8-41 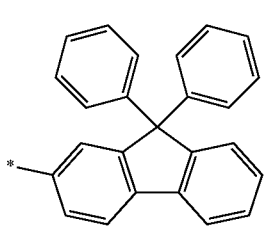
8-42 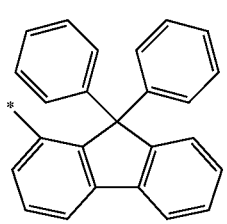
8-43 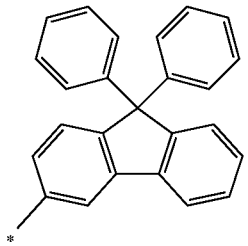

-continued 8-44

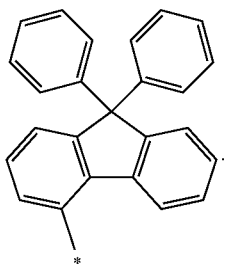

In Formulae 8-1 to 8-44, $Z_{91}$ and $Z_{92}$ may each independently be selected from hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, and a 1-tert-butyl-2-methylpropyl group, and

* indicates a binding site to N of Formula 9.

While not wishing to be bound by theory, it is understood that when $R_{91}$ and $R_{92}$ in Formula 9 are selected as described above, the minimum excitation triplet energy level of the polymer may be increased, the hole transport and/or hole transport capability of the polymer may be improved, and the solubility and coatability of the polymer may be improved.

In Formula 2, $Q_{21}$ may be a crosslinking group. In Formula 2, $Q_{21}$ is not particularly limited as long as $Q_{21}$ is a substituent that can induce a crosslinking reaction by heat and/or active energy rays. However, the following materials may be selected so as to improve the film-forming property, thin film strength, and the like of the obtained polymer.

For example, in Formula 2, $Q_{21}$ may be represented by one of Formulae 6-1 to 6-9, but embodiments of the present disclosure are not limited thereto:

6-1

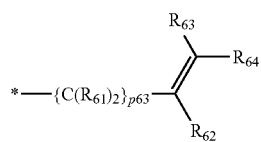

6-2

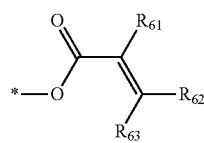

6-3

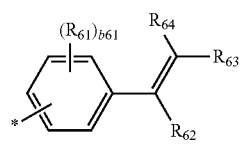

6-4

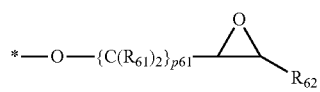

6-5

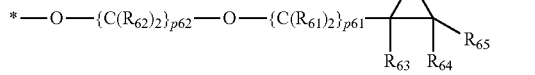

6-6

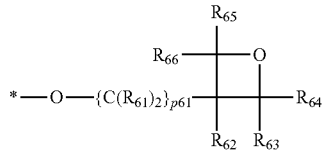

6-7

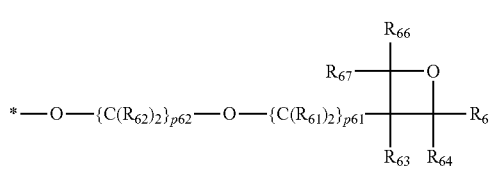

6-8

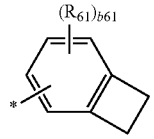

6-9

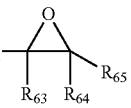

In Formulae 6-1 to 6-9, $R_{61}$ to $R_{68}$ may each independently be selected from hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, and an iso-decyl group, p61 and p62 may each independently be selected from 1, 2, 3 and 4, p63 may be selected from 0, 1, 2, and 3, b61 may be selected from 1, 2, 3, and 4, b62 may be selected from 1, 2, and 3, and

* indicates a binding site to a neighboring atom.

For example, in Formulae 6-1 to 6-9, $R_{61}$ to $R_{68}$ may each independently be selected from hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, and a 1,2-dimethylpropyl group, but embodiments of the present disclosure are not limited thereto.

In an embodiment, in Formulae 6-1 to 6-9, $R_{61}$ to $R_{68}$ may each independently be selected from hydrogen, hydrogen, a methyl group, an ethyl group, an n-propyl group, and an iso-propyl group, but embodiments of the present disclosure are not limited thereto.

In an embodiment, in Formula 2, $Q_{21}$ may be selected from Formulae 7-1 and 7-2, but embodiments of the present disclosure are not limited thereto:

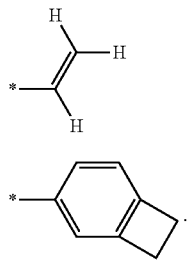

7-1

7-2

In Formulae 7-1 and 7-2,
* indicates a binding site to a neighboring atom.

In Formula 2, o21 indicates the number of groups $Q_{21}$, and o21 may be an integer greater than or equal to 1. When o21 is two or more, two or more groups $Q_{21}$ may be identical to or different from each other.

For example, in Formula 2, o21 may be selected from 1, 2, and 3, but embodiments of the present disclosure are not limited thereto. In an embodiment, in Formula 2, o21 may be 1 or 2, but embodiments of the present disclosure are not limited thereto. In an embodiment, in Formula 2, o21 may be 1, but embodiments of the present disclosure are not limited thereto.

In Formula 2, p21 indicates the number of groups $(L_{21})_{a21}$-$(Q_{21})_{o21}$, and p21 may be an integer greater than or equal to 1.

For example, in Formula 2, p21 may be selected from 1, 2, and 3, but embodiments of the present disclosure are not limited thereto. In an embodiment, in Formula 2, p21 may be 1 or 2, but embodiments of the present disclosure are not limited thereto. In an embodiment, in Formula 2, p21 may be 1, but embodiments of the present disclosure are not limited thereto.

In an embodiment, the first repeating unit represented by Formula 1 may be selected from Formulae 1-1 to 1-42, but embodiments of the present disclosure are not limited thereto:

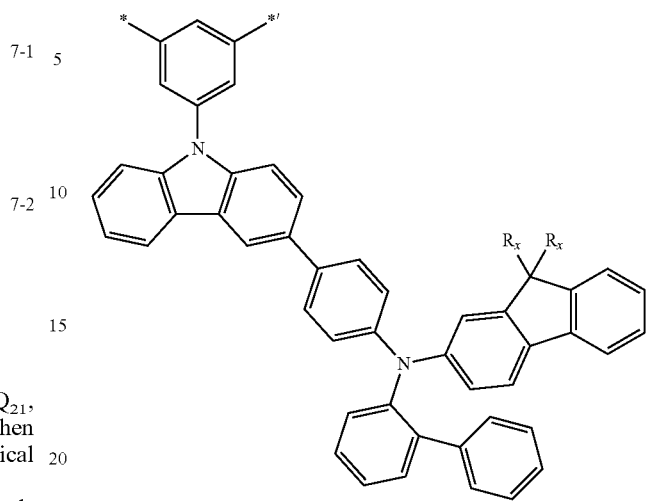

1-2

-continued

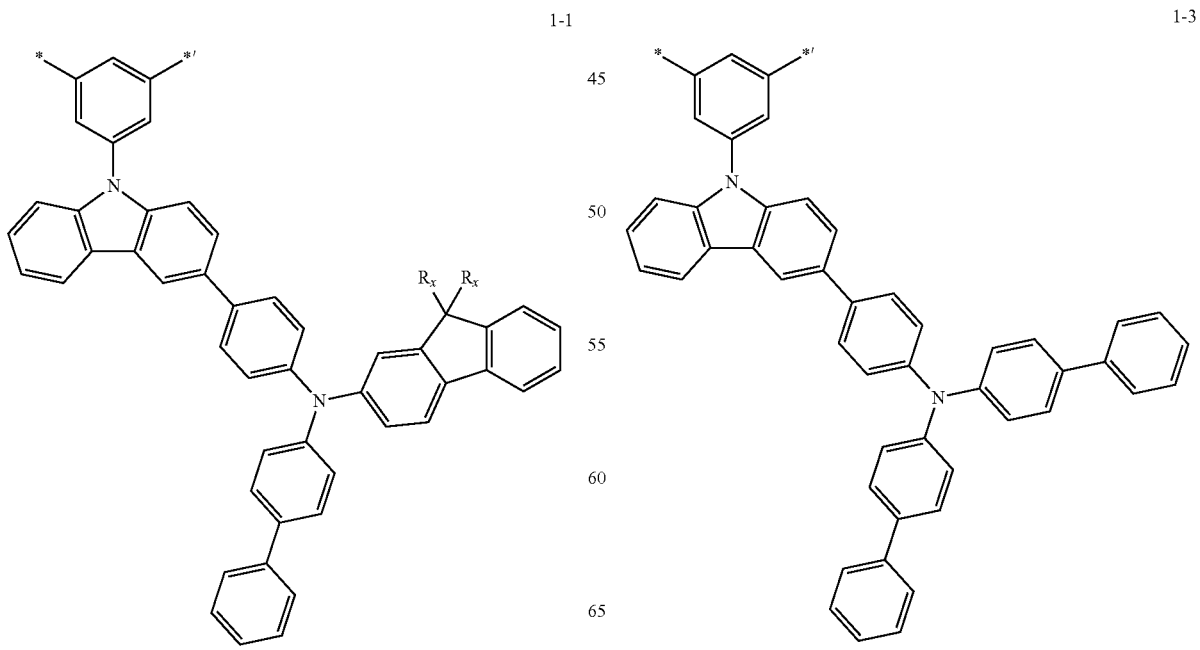

1-1

1-3

1-4
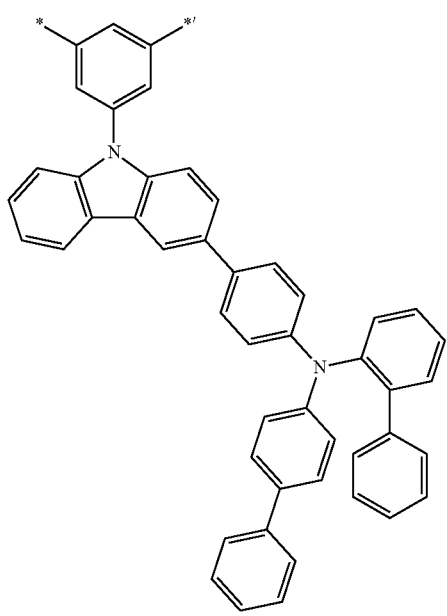
1-6
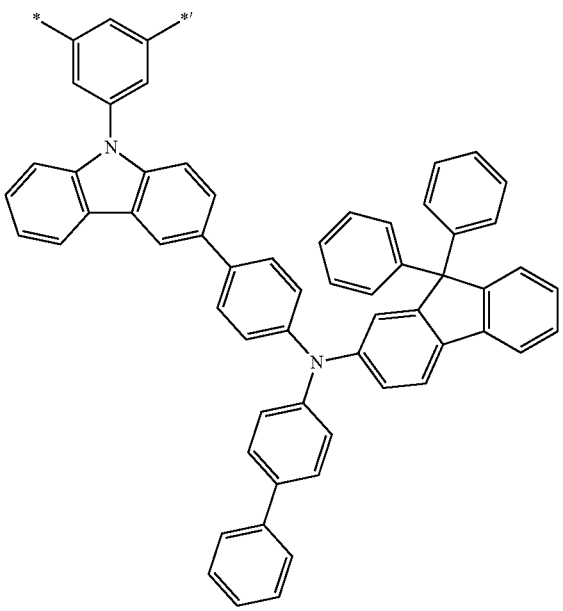
1-5
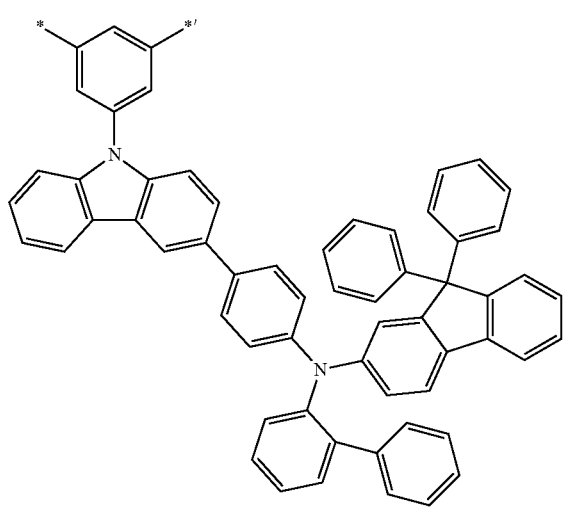
1-7

-continued
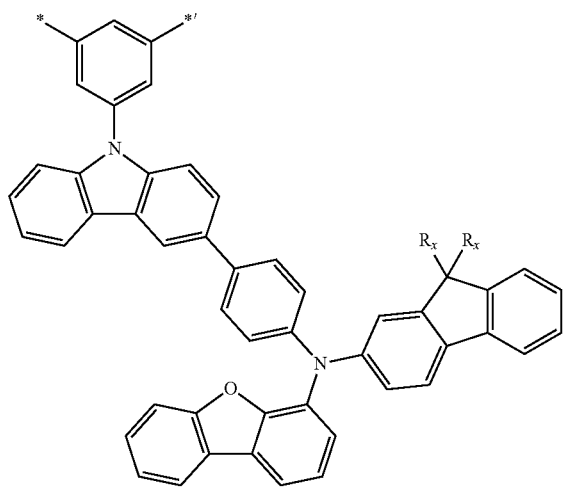
1-8
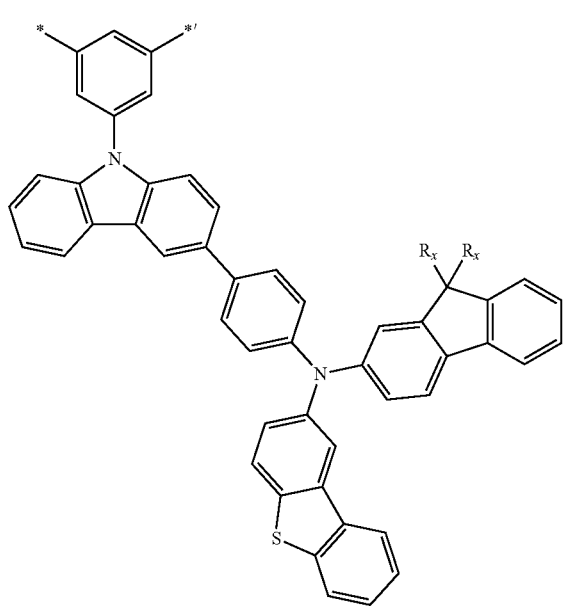
1-9
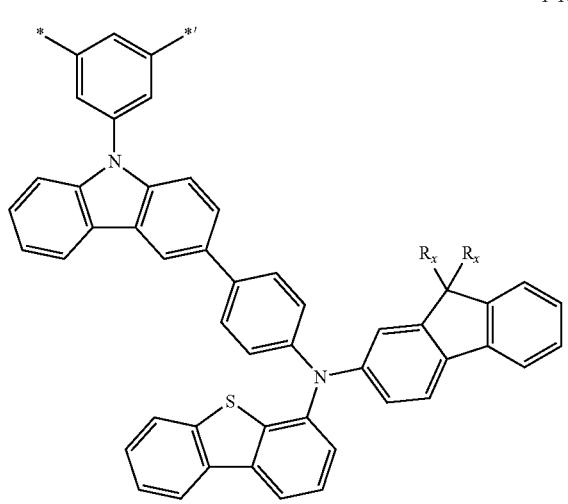
1-10
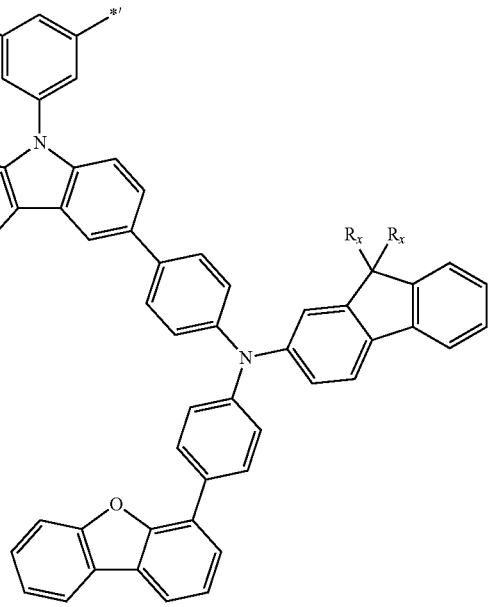
1-11
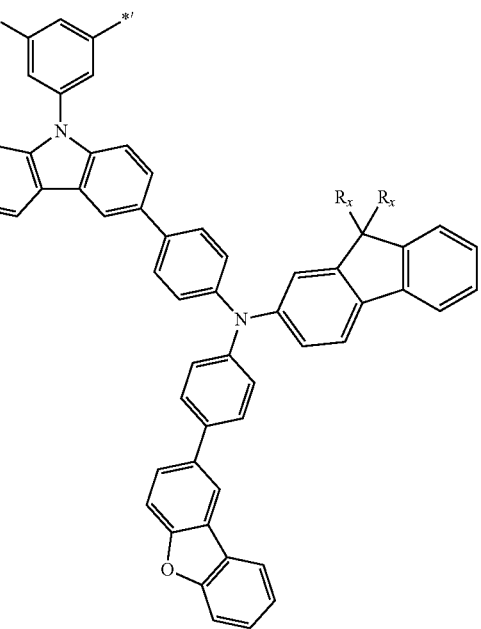
1-12

1-13
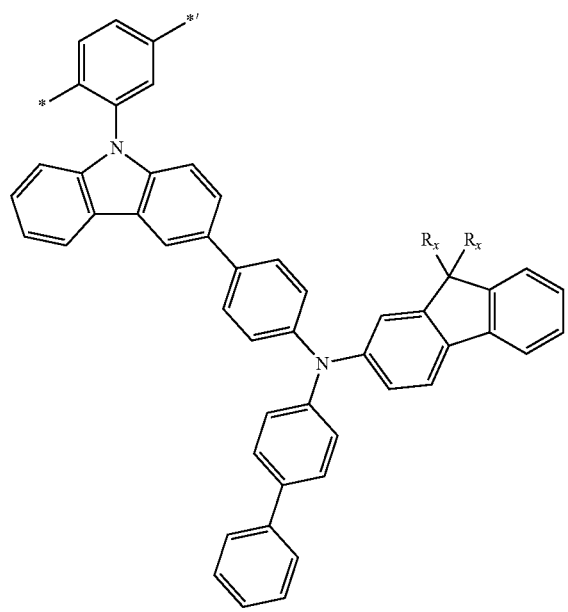
1-15
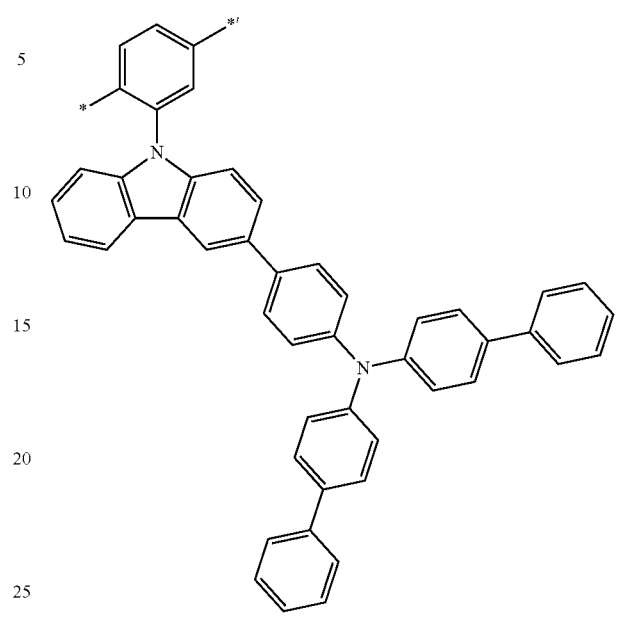
1-14
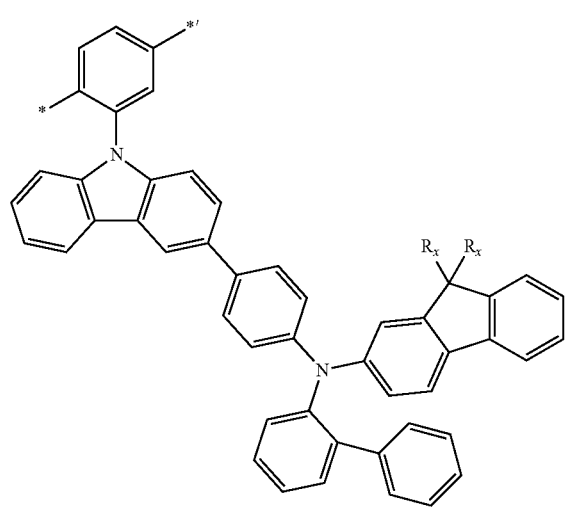
1-16
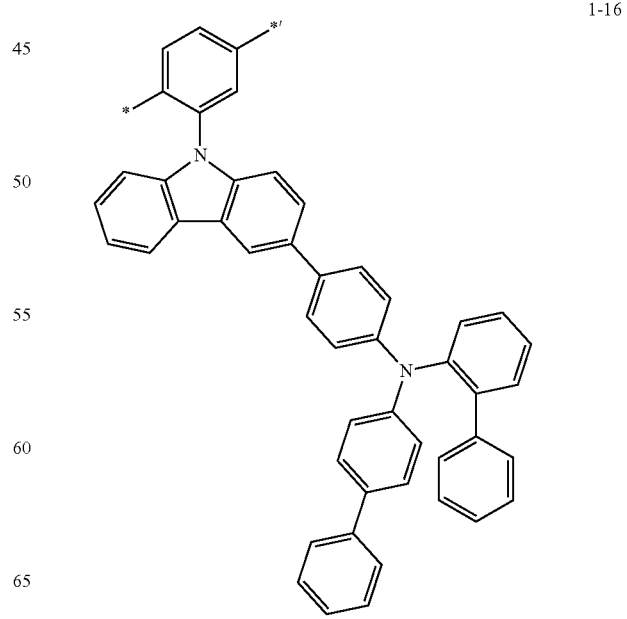

1-17
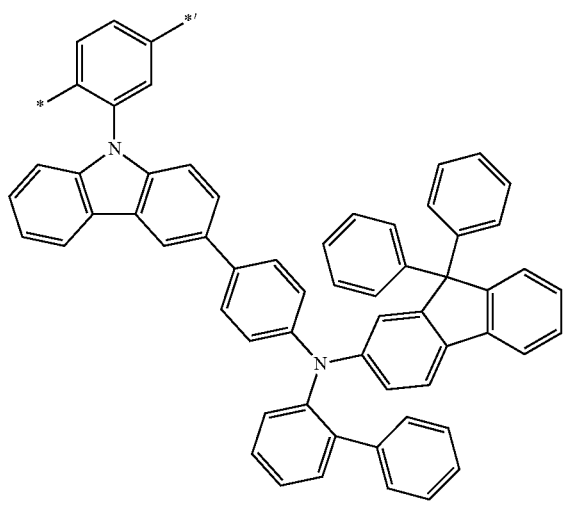
1-18
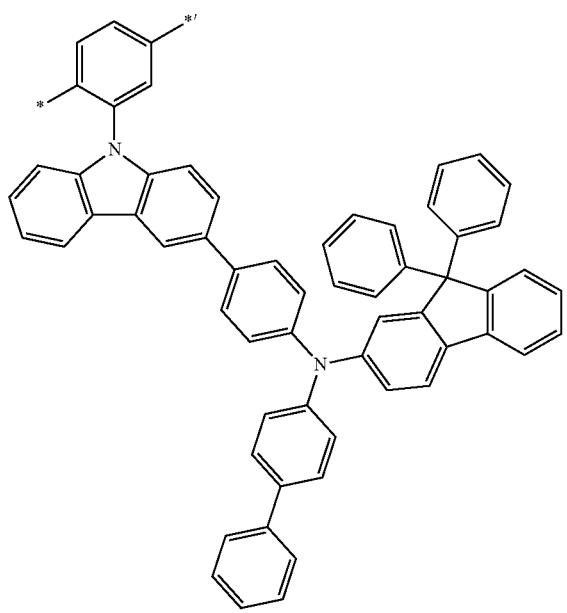
1-19
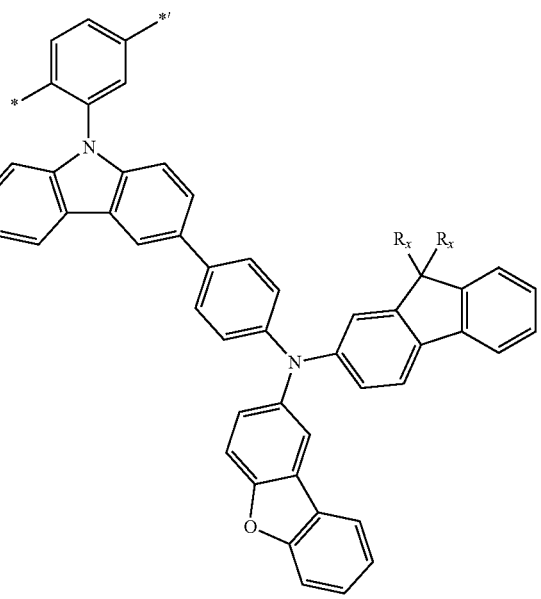
1-20

1-21
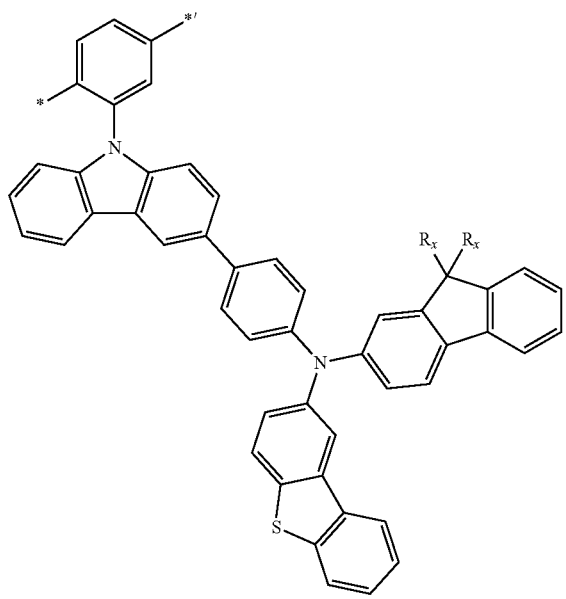
1-22
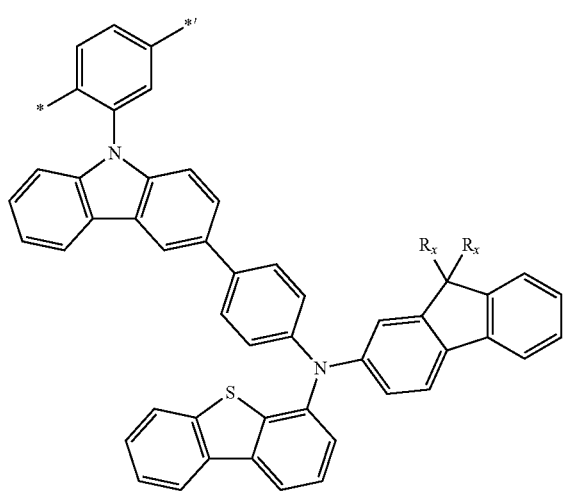
1-23
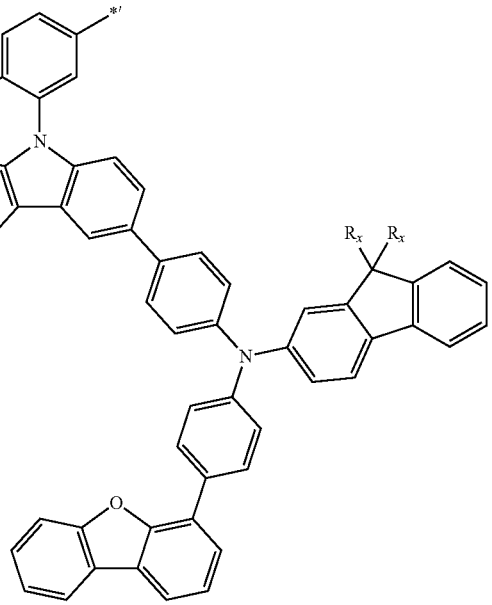
1-24

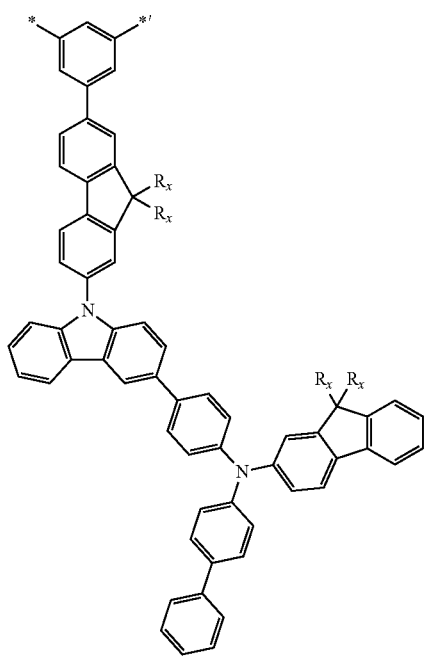
1-25
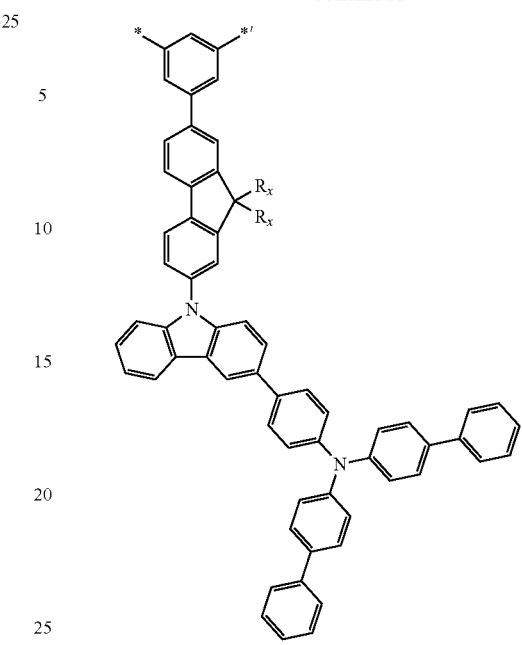
1-27
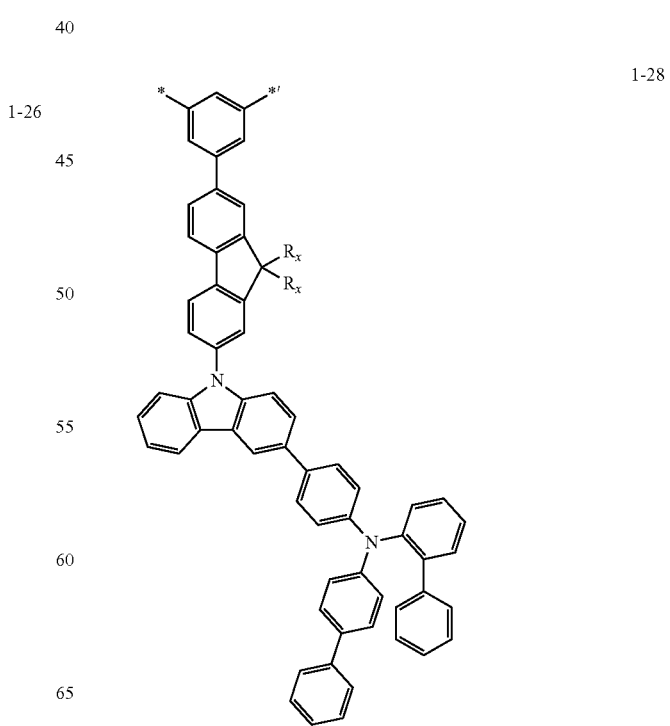
1-28
1-26

1-29
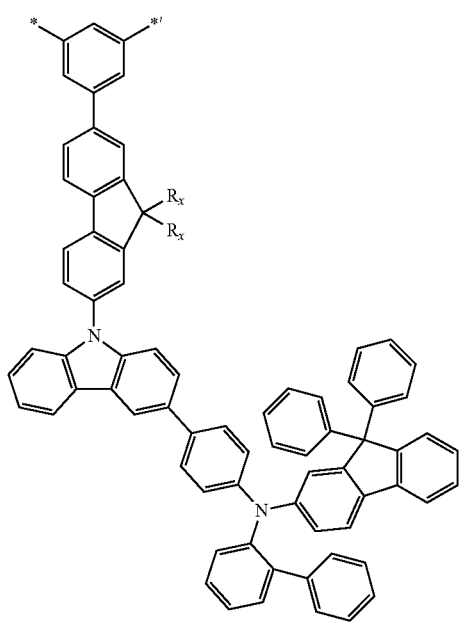
1-31
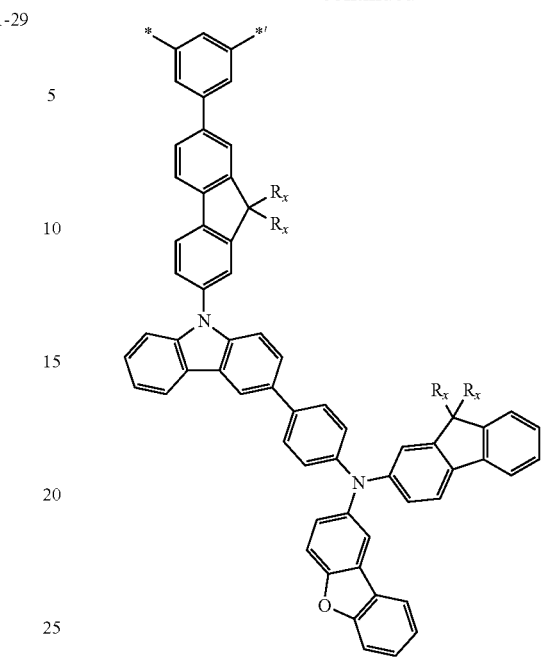
1-30
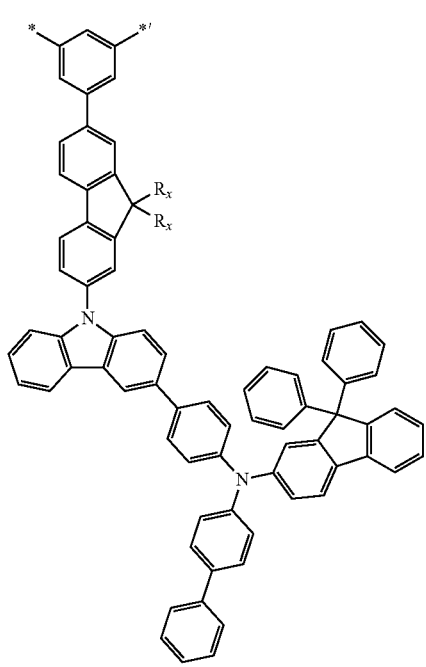
1-32
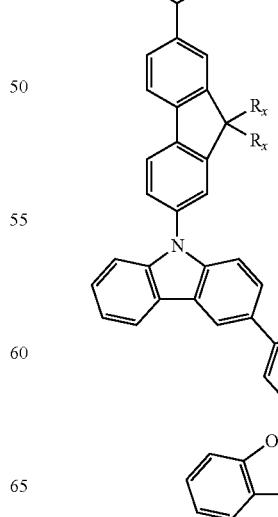

1-33
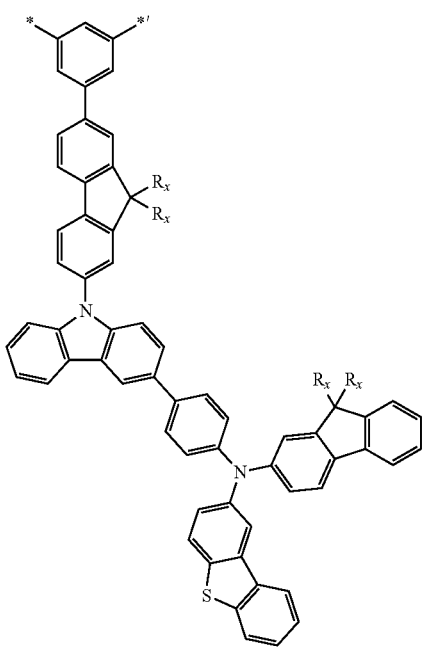
1-34
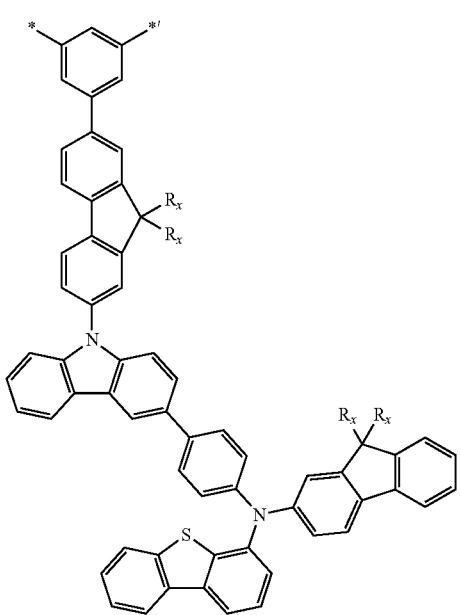
1-35
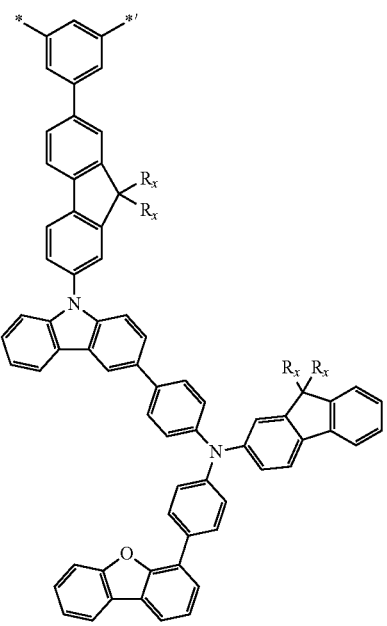
1-36
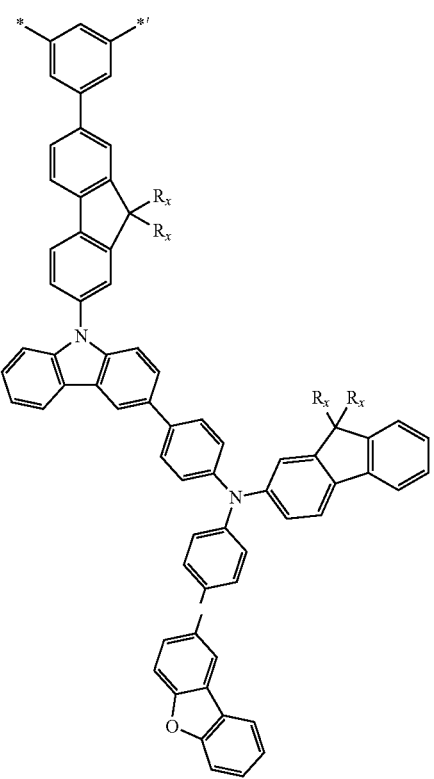

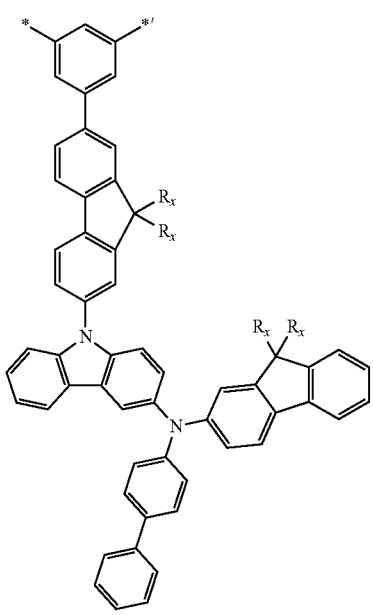
1-37
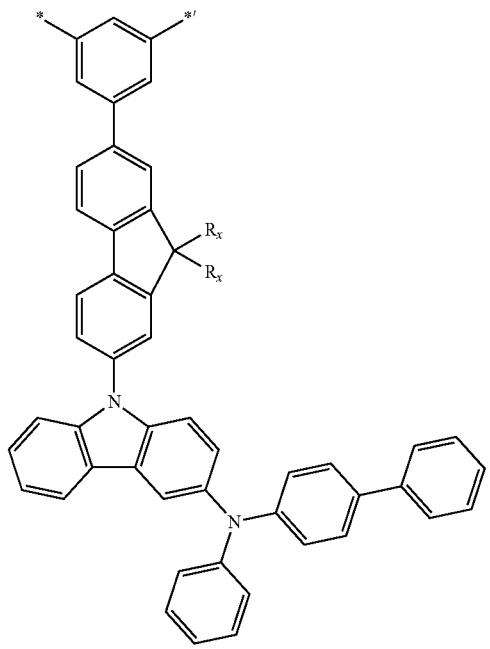
1-39
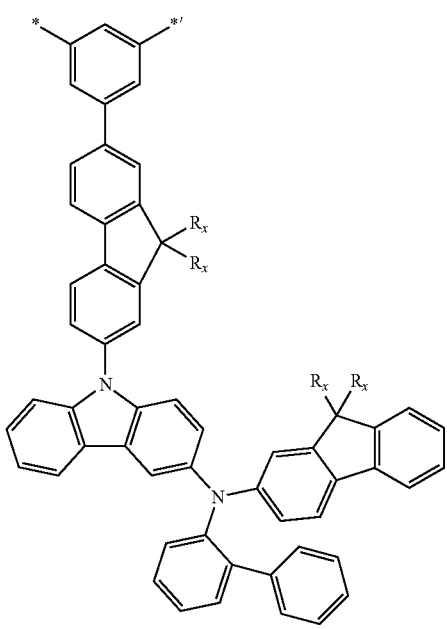
1-38
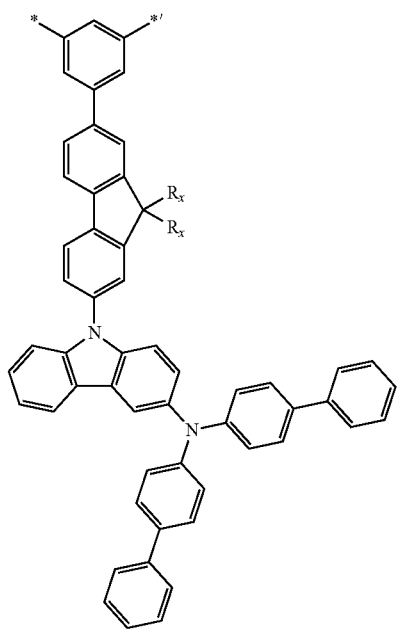
1-40

-continued 1-41

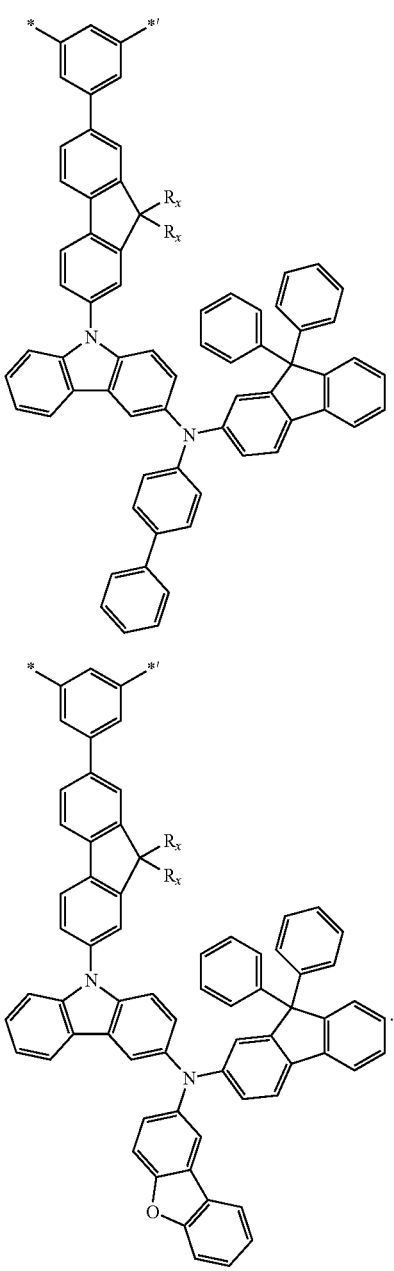

1-42

In formulae 1-1 to 1-42,
$R_x$ may be selected from a methyl group, an ethyl group, an n-propyl group, an group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentade-cyl group, an n-hexadecyl group, an n-heptadecyl group, an n-octadecyl group, and an n-eicosyl group, and

* and *' each indicate a binding site to a neighboring atom.

In an embodiment, the second repeating unit represented by Formula 2 may be selected from Formulae 2-1 to 2-3, but embodiments of the present disclosure are not limited thereto:

2-1

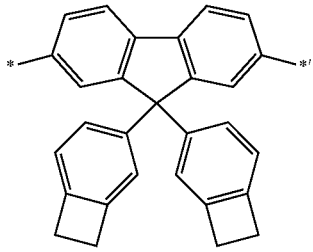

2-2

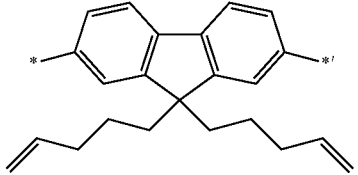

2-3

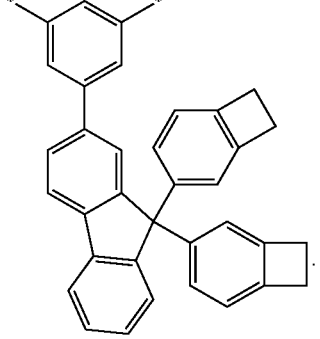

In Formulae 2-1 to 2-3,
* and *' each indicate a binding site to a neighboring atom.

In the polymer according to an embodiment, the proportion of the first repeating unit may be in a range of about 1% to about 99.9% based on the total sum of the first repeating unit and the second repeating unit. When the polymer includes two or more first repeating units, the proportion of the first repeating unit is calculated based on the total amount of the third repeating units.

For example, the proportion of the first repeating unit in the polymer may be in range of about 20% to 95% based on the total sum of the first repeating unit and the second repeating unit, but embodiments of the present disclosure are not limited thereto.

In an embodiment, the proportion of the first repeating unit in the polymer may be in a range of about 40% to about 90% based on the total sum of the first repeating unit and the second repeating unit, but embodiments of the present disclosure are not limited thereto.

While not wishing to be bound by theory, it is understood that when the proportion of the first repeating unit is relatively large within the above range, hole transport capability may be improved and a driving voltage of a device may be reduced, thus improving current efficiency. Also, while not wishing to be bound by theory, it is understood that when the proportion of the first repeating unit is relatively small within the above range, carrier balance in the emission layer becomes good and the number of carriers not contributing to recombination is reduced, thus improving current efficiency.

In the polymer according to the embodiment, the proportion of the second repeating unit may be in a range of about 0.1% to about 99.9% based on the total sum of the first repeating unit and the second repeating unit. When the polymer includes two or more second repeating units, the proportion of the third repeating unit is calculated based on the total amount of the second repeating units.

For example, the proportion of the second repeating unit in the polymer may be in a range of about 1% to about 50% based on the total sum of the first repeating unit and the second repeating unit, but embodiments of the present disclosure are not limited thereto.

In an embodiment, the proportion of the second repeating unit in the polymer may be in a range of about 3% to about 30% based on the total sum of the first repeating unit and the second repeating unit, but embodiments of the present disclosure are not limited thereto.

The structure of the polymer is not particularly limited. For example, the polymer may be one of a random copolymer, an alternating copolymer, a periodic copolymer, and a block copolymer, but embodiments of the present disclosure are not limited thereto.

In order to manufacture a large-area light-emitting device at a lower cost, efforts have been made to use solution coating instead of vacuum deposition. As compared with the vacuum deposition, the solution coating is an efficient method of manufacturing a light-emitting device because the solution coating is high in utilization efficiency of a material for a light-emitting device, facilitates the manufacture of a large-area device, and does requires an expensive vacuum apparatus.

For example, JP 2016-84370 A, JP 2016-503087 A, and JP 2012-7021 A disclose an arylamine polymer as a hole transport material.

It is advantageous to use a phosphorescent material, for example, a tris(2-phenylpyridine)iridium complex ($Ir(ppy)_3$), together with a charge transport material having relatively high minimum excitation triplet energy (2.5 electron volts, eV or higher). Therefore, while not wishing to be bound by theory, it is understood that when the arylamine polymer is used as the charge transport material in the organic light-emitting device using the phosphorescent material, the structure of the constituent unit constituting the arylamine polymer needs to be limited so as to control a minimum excitation triplet energy level and a highest occupied molecular orbital (HOMO) energy level. Also, an organic light-emitting device including an existing arylamine polymer has a problem that cannot obtain sufficient current efficiency and/or driving lifespan.

On the contrary, since the polymer according to the embodiment has a high minimum excitation triplet energy level, a light-emitting device including the polymer may have improved current efficiency. In an embodiment, the polymer essentially includes the first repeating unit, and the first repeating unit essentially includes $Ar_{11}$ in a main chain and a group represented by Formula 9 in a side chain, thus improving the minimum excitation triplet energy level of the polymer.

While not wishing to be bound by theory, it is understood that when the polymer is used in an organic light-emitting device, for example, a hole injection layer and/or a hole transport layer of the organic light-emitting device, the current density of the organic light-emitting device may be improved.

Since the polymer has high charge mobility, the lifespan (durability) of the light-emitting device including the polymer may be improved.

Since the polymer includes a carbazole group in which a group represented by Formula 9 is essentially included in the first repeating unit, the hole transport capability of the polymer may be improved.

Also, since the polymer essentially includes the second repeating unit including the crosslinking group, the stability of the film obtained by solution coating may be improved. While not wishing to be bound by theory, it is understood that the crosslinking group makes it possible to additionally laminate a layer on a polymer thin film by using solution coating. Therefore, even when the light-emitting device is formed to have a stacked structure, the light emission characteristics and stability may be improved.

Third Repeating Unit

A polymer according to another embodiment may further include a third repeating unit represented by Formula 3, in addition to the first repeating unit represented by Formula 1 and the second repeating unit represented by Formula 2. The polymer may include one third repeating unit, or may include two or more third repeating units:

$$*-Ar_{31}-*'. \quad \text{Formula 3}$$

In Formula 3, $Ar_{31}$ may be selected from a substituted or unsubstituted $C_5$-$C_{30}$ carbocyclic group and a substituted or unsubstituted $C_1$-$C_{30}$ heterocyclic group.

For example, in Formula 3, $Ar_{31}$ may be selected from:
a benzene group, a pentalene group, an indene group, a naphthalene group, an anthracene group, an azulene group, a heptacene group, an acenaphthalene group, a phenalene group, a fluorene group, an antraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group;
a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $033$ may each independently be selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group, but embodiments of the present disclosure are not limited thereto.

In an embodiment, in Formula 3, $Ar_{31}$ may be selected from:

a benzene group, a naphthalene group, an anthracene group, a fluorene group, a naphthacene group, a phenanthrene group, and a pyrene group;

a benzene group, a naphthalene group, an anthracene group, a fluorene group, a naphthacene group, a phenanthrene group, and a pyrene group, each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an iso-pentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group; and a benzene group, a naphthalene group, an anthracene group, a fluorene group, a naphthacene group, a phenanthrene group, and a pyrene group, each substituted with at least one selected from a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group that are each substituted with at least one selected from deuterium, —F, —Cl, —Br, —I, a cyano group, a nitro group, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-dococyl group, an n-tricocyl group, an n-tetracocyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, a benzyl group, a phenylethyl group, a phenylpropyl group, a phenyl group, a biphenyl group, a fluorenyl group, a naphthyl group, an anthryl group, a phenanthrenyl group, a naphthacenyl group, a pyrenyl group, a terphenyl group, a pyridyl group, a bipyridyl group, a pyrrolyl group, a pyrazinyl group, a pyrimidinyl group, an indolyl group, a furyl group, a benzofuranyl group, a dibenzofuranyl group, a quinolinyl group, an isoquinolinyl group, a quinoxanyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, but embodiments of the present disclosure are not limited thereto.

In an embodiment, in Formula 3, $Ar_{31}$ may be selected from Formulae 4-14 to 4-16, but embodiments of the present disclosure are not limited thereto:

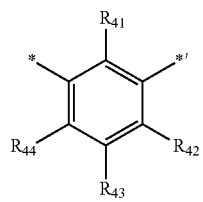

4-14

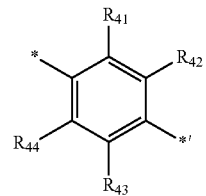

4-15

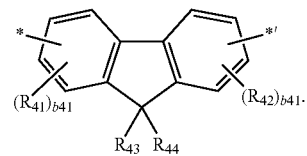

4-16

In Formulae 4-14 to 4-16, $R_{41}$ to $R_{44}$ may each independently be selected from hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, and a 1-tert-butyl-2-methylpropyl group, b41 may be selected from 1, 2, and 3, and

* and *' each indicate a binding site to an atom constituting a main chain of Formula 3.

In an embodiment, the third repeating unit represented by Formula 3 may be selected from Formulae 3-1 and 3-2, but embodiments of the present disclosure are not limited thereto:

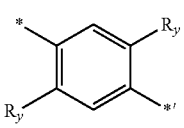

3-1

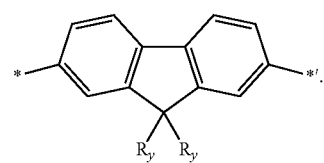

3-2

In Formulae 3-1 and 3-2, $R_y$ may be selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1- isopropylbutyl group, a 2-methyl-1-iso-propyl group, and a 1-tert-butyl-2-methylpropyl group, and

* and *' each indicate a binding site to a neighboring atom.

While not wishing to be bound by theory, it is understood that when the polymer further includes the third repeating unit represented by Formula 3, the solvent solubility of the polymer may be improved. Therefore, a thin film may be more easily formed of the polymer by using solution coating.

In the polymer according to the embodiment, the proportion of the third repeating unit may be in a range of about 0% to 99.9% based on the total sum of the first repeating unit, the second repeating unit, and the third repeating unit. When the polymer includes two or more third repeating units, the proportion of the third repeating unit is calculated based on the total amount of the third repeating units.

For example, the proportion of the third repeating unit in the polymer may be in a range of about 0% to about 90% based on the total sum of the first repeating unit, the second repeating unit, and the third repeating unit, but embodiments of the present disclosure are not limited thereto.

In an embodiment, the proportion of the third repeating unit in the polymer may be in a range of about 0% to about 90% based on the total sum of the first repeating unit, the second repeating unit, and the third repeating unit, but embodiments of the present disclosure are not limited thereto.

While not wishing to be bound by theory, it is understood that when the polymer has the third repeating unit, the solubility of the polymer, for example, the solubility in an organic solvent, may be improved. Therefore, when a light-emitting device having a stacked structure is manufactured by using such a polymer, the light emission characteristics and stability of the light-emitting device may be improved.

Characteristics of Polymer

The structure of the polymer is not particularly limited. For example, the polymer may be one of a random copolymer, an alternating copolymer, a periodic copolymer, and a block copolymer, but embodiments of the present disclosure are not limited thereto.

The number average molecular weight ($M_n$) of the polymer according to the embodiment is not particularly limited, but may be in a range of about 10,000 Daltons (Da) to about 500,000 Da. For example, the number average molecular weight ($M_n$) of the polymer may be in a range of about 30,000 Da to 200,000 Da, but embodiments of the present disclosure are not limited thereto. While not wishing to be bound by theory, it is understood that when the number average molecular weight ($M_n$) of the polymer is within this range, it is possible to appropriately adjust the viscosity of a solution and/or a dispersion liquid used for forming a thin film (for example, a hole injection layer, a hole transport layer, or the like) by using the polymer, and it is possible to uniformly adjust a thickness of a thin film obtained therefrom.

The weight average molecular weight ($M_w$) of the polymer according to the embodiment is not particularly limited, but may be in a range of about 1,000 Da to about 1,000,000 Da. For example, the weight average molecular weight ($M_w$) of the polymer may be in a range of about 10,000 Da to about 500,000 Da, but embodiments of the present disclosure are not limited thereto. For example, the weight average molecular weight ($M_w$) of the polymer may be in a range of about 50,000 Da to about 500,000 Da, but embodiments of the present disclosure are not limited thereto. While not wishing to be bound by theory, it is understood that when the number average molecular weight ($M_w$) of the polymer is within this range, it is possible to appropriately adjust the viscosity of a solution and/or a dispersion liquid used for forming a thin film (for example, a hole injection layer, a hole transport layer, or the like) by using the polymer, and it is possible to uniformly adjust a thickness of a thin film obtained therefrom.

The method of measuring the number average molecular weight ($M_n$) and the weight average molecular weight ($M_w$) is not particularly limited. The number average molecular weight ($M_n$) and the weight average molecular weight ($M_w$) may be measured and calculated by known methods. The number average molecular weight ($M_n$) and the weight average molecular weight ($M_w$) were measured under the following condition.

The weight average molecular weight ($M_w$) was measured under the following conditions by gel permeation chromatography (GPC) using polystyrene as a standard sample.

Analysis apparatus: Prominance (manufactured by Shimadzu Corporation)

Column: PLgel MIXED-B (manufactured by Polymer Laboratories Inc.)

Column temperature: 40° C.

Flow rate: 1.0 milliliters per minute (mL/min)

Dose: 20 microliters (μL)

Eluent: tetrahydrofuran (THF) (concentration: about 0.05% by mass)

Detector: UV-VIS detector (SPD-10AV manufactured by Shimadzu Corporation)

Standard sample: Polystyrene

The main chain terminal of the polymer according to the embodiment is not particularly limited, and may be appropriately modified according to a type of a monomer used. However, the main chain terminal of the polymer may be generally hydrogen.

Method of Preparing Polymer

Hereinafter, a method of preparing a polymer, according to an embodiment, will be described in detail. The method of preparing the polymer, according to the embodiment, may be easily understood by those of ordinary skill in the art by referring to Examples provided below.

In an embodiment, the polymer may be prepared by polymerizing a first monomer represented by Formula M-1 and a second monomer represented by Formula M-2. When the polymer further includes the third repeating unit, the polymer may be prepared by polymerizing the first monomer represented by Formula M-1, the second monomer represented by Formula M-2, and the third monomer represented by Formula M-3:

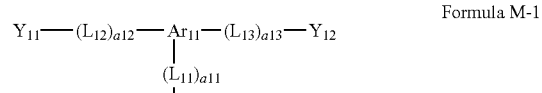
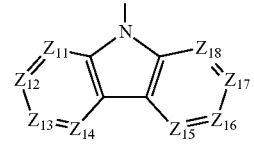

Formula M-1

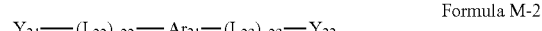
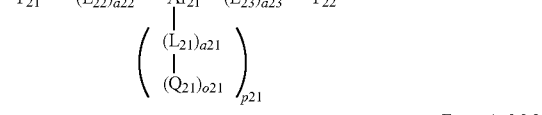

Formula M-2

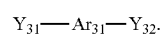

Formula M-3

In Formulae M-1, M-2, and M-3, $Z_{11}$ to $Z_{18}$, $Ar_{11}$ $Ar_{21}$, $Ar_{31}$, $L_{11}$ to $L_{13}$, $L_{21}$ to $L_{23}$, a11 to a13, a21 to a23, $Q_{21}$, o21, and p21 are the same as described in Formulae 1 to 3.

In Formulae M-1, M-2, and M-3, $Y_{11}$, $Y_{12}$, $Y_{21}$, $Y_{22}$, $Y_{31}$, and $Y_{32}$ may each independently be selected from —F, —Cl, —Br, —I, and a group represented by Formula C:

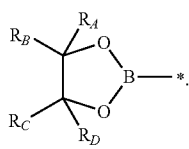

Formula C

In Formula C, $R_A$, $R_B$, $R_C$, and RD may each independently be selected from hydrogen and a $C_1$-$C_3$ alkyl group, and

* indicates a binding site to a neighboring atom.

For example, in Formula C, $R_A$, $R_B$, $R_C$, and RD may each independently be selected from hydrogen, a methyl group, an ethyl group, an n-propyl group, an iso-propyl group, and a sec-propyl group, but embodiments of the present disclosure are not limited thereto.

In an embodiment, in Formula C, $R_A$, $R_B$, $R_C$, and RD may each be a methyl group, but embodiments of the present disclosure are not limited thereto.

The monomer used for the synthesis of the polymer may be synthesized by a known synthesis method, and the structure of the monomer may be identified by NMR and LC-MS or the like.

The polymerization method of synthesizing the polymer is not particularly limited.

For example, the polymer may be prepared by using a known condensation polymerization reaction. For example, a method of polymerizing a monomer by a Suzuki coupling reaction, a method of polymerizing a monomer by a Grignard reaction, a method of polymerizing a monomer by a Ni(0) complex, a method of polymerizing a monomer by an oxidizing agent such as $FeCl_3$, a method of electrochemically oxidizing and polymerizing a monomer, or a method using a decomposition of an intermediate polymer having an appropriate leaving group may be used, but embodiments of the present disclosure are not limited thereto.

The solvent used for the polymerization of the polymer may be selected from, for example, toluene, xylene, diethyl ether, chloroform, ethyl acetate, methylene chloride, tetrahydrofuran, acetone, acetonitrile, N,N-dimethylformamide, dimethyl sulfoxide, anisole, and hexamethylphosphoric triamide. The solvent may be used solely, or two or more solvents may be used together. The monomer used for the polymerization of the polymer according to the embodiment has high solubility in the solvent.

The concentration of the monomer in the solvent (entire monomers when a plurality of monomers are used) may be in a range of about 5 percent by weight (wt %) to about 90 wt % based on the entire reaction solution. For example, the concentration of the monomer in the solvent may be in a range of about 10 wt % to about 80 wt %, but embodiments of the present disclosure are not limited thereto.

The polymerization temperature may be in a range of about 0° C. to about 250° C., for example, 40° C. to about 150° C., in terms of molecular weight control, but embodiments of the present disclosure are not limited thereto.

The polymerization reaction may be performed for about 30 minutes to about 24 hours, but embodiments of the present disclosure are not limited thereto.

The solvent, to which the monomer is added, may be deaerated prior to addition of a catalyst, for example, a polymerization catalyst. For example, the deaeration process may be freeze deaeration or deaeration using an inert gas such as a nitrogen gas, but embodiments of the present disclosure are not limited thereto.

The polymerization catalyst may use, for example, a compound such as a Pd(II) complex, a Pd(0) complex, or a Ni(0) complex, but embodiments of the present disclosure are not limited thereto. The Pd(II) complex may be, for example, a Pd acetate, and the Pd(0) complex may be, for example, $Pd(PPh_3)$ [Ph is a phenyl group], a Pd(II)-$PPh_3$ complex, or $PdCl_2(PPh_3)$, but embodiments of the present disclosure are not limited thereto. For example, when the Pd(II) complex is used as the polymerization catalyst, 2 molar equivalents to 8 molar equivalents of a phosphine compound may be added to a reaction mixture based on 1 mol of the Pd(II) complex, but embodiments of the present disclosure are not limited thereto.

An amount of the catalyst added may be in a range of about 0.00001 moles to about 10 moles, for example, about 0.0001 moles to about 5 moles, for example, about 0.01 to about 2, based on 1 mole of the total monomers used in preparing the polymer.

The main chain terminal of the polymer described above may be appropriately defined according to a kind of a material used, and may be, for example, an aryl group or a heteroaryl group containing a carbon-carbon bond, or a hydrogen atom, but embodiments of the present disclosure are not limited thereto.

Composition

Hereinafter, a composition according to an embodiment will be described in detail.

The composition may include the polymer described above.

For example, the composition may further include at least one selected from a hole transport material, an electron transport material, and a light-emitting material.

In an embodiment, the composition may further include an organometallic compound. The organometallic compound may be a compound that emits light from triplet excitons, that is, a phosphorescent dopant.

In an embodiment, the composition may further include at least one selected from a solvent and a dispersion medium.

Since the above-described polymer has high solubility in an organic solvent, the composition may be very suitable for forming a thin film by solution coating (wet process).

Therefore, the composition according to the embodiment may be used as a material for a light-emitting device (for example, an organic light-emitting device, a quantum-dot light-emitting device, and the like). For example, the composition may be used in a charge injection layer and/or a charge transport layer of a light-emitting device, for example, a hole injection layer and/or a hole transport layer thereof. In addition, the composition may also be used as a host of an emission layer of a light-emitting device. For example, the composition may be used in a hole injection layer and/or a hole transport layer.

Light-Emitting Device

Hereinafter, a light-emitting device according to an embodiment will be described in detail.

The light-emitting device according to the embodiment may include:

a first electrode;

a second electrode; and an intermediate layer disposed between the first electrode and the second electrode, wherein the intermediate layer includes an emission layer, and wherein the intermediate layer includes the polymer described above.

For example, the emission layer may include at least one selected from an organic compound and a semiconductor compound, but embodiments of the present disclosure are not limited thereto. For example, when the emission layer includes the organic compound, the light-emitting device may be referred to as organic light-emitting device.

In an embodiment, the organic compound may be a compound that emits light from triplet excitons. That is, the light-emitting device may be a phosphorescent organic light-emitting device.

For example, the semiconductor compound may be a quantum dot. That is, the light-emitting device may be a quantum-dot light-emitting device.

The quantum dot means a crystal of the semiconductor compound, and may cover all materials that emit emission wavelengths having different lengths according to the size of the crystal. Therefore, a type of a compound constituting the quantum dot is not particularly limited.

The polymer may be included in the hole transport layer and/or the hole injection layer between the first electrode and the emission layer, but embodiments of the present disclosure are not limited thereto.

Hereinafter, the light-emitting device will be described as an organic light-emitting device. The light-emitting device according to the embodiment will be described with reference to FIG. 1. FIG. 1 is a schematic view of an organic light-emitting device 100 according to an embodiment.

The organic light-emitting device 100 according to the embodiment includes a substrate 10, a first electrode 120 on the substrate 10, a hole injection layer 130 on the first electrode 120, a hole transport layer 140 on the hole injection layer 130, an emission layer 150 on the hole transport layer 140, an electron transport layer 160 on the emission layer 150, an electron injection layer 170 on the electron transport layer 160, and a second electrode 180 on the electron injection layer 170.

The polymer may be included in, for example, one of the organic layers disposed between the first electrode 120 and the second electrode 180 (for example, the hole injection layer 130, the hole transport layer 140, the emission layer 150, the electron transport layer 160, and the electron injection layer 170). For example, the polymer may be included in the hole injection layer 130 as a hole injection material, may be included in the hole transport layer 140 as a hole transport material, or may be included in the emission layer 150 as a hole transport host. Alternatively, the polymer may be included in other organic layers except for the emission layer 150. For example, the polymer may be included in the hole injection layer 130 and/or the hole transport layer 140 as a hole transport material. For example, the polymer may be included in the hole transport layer 140.

Also, the organic layer including the polymer may be formed by, for example, solution coating. For example, the organic layer including the polymer is formed by using solution coating, for example, spin coating, casting, micro gravure coating, gravure coating, bar coating, roll coating, wire bar coating, dip coating, spray coating, screen printing, flexographic printing, offset printing, and ink-jet printing.

According to the solution coating, the organic layer may be formed by coating the composition including the polymer. In this embodiment, the composition including the polymer may include a solvent. The composition including the solvent may be, for example, an ink composition used in ink-jet printing, or a film-forming composition used in spin coating, but embodiments of the present disclosure are not limited thereto. The solvent included in the composition including the polymer is not limited as long as the solvent can dissolve the polymer, and may be appropriately selected according to the polymer. For example, the solvent may include tolyene, xylene, diethyl ether, chloroform, ethyl acetate, dichloromethane, tetrahydrofuran, acetone, acetonitrile, N,N-dimethylformamide, dimethylsulfoxide, anisole, hexamethylphosphoric acid triamide, 1,2-dichloro ethane, 1,1,2-trichloroethane, chlorobenzene, o-dichlorobenzene, dioxane, cyclohexane, n-haptane, n-hexane, n-heptane, n-octane, n-nonane, n-decane, methylethyl ketone, cyclohexanone, butyl acetate, ethyl cellosolve acetate, ethylene glycol, ethylene glycol monobutyl ether, ethylene glycol monoethyl ether, ethylene glycol monoethyl ether, dimethoxyethane, propylene glycol, diethoxy methane, triethylene glycol monoethyl ether, glycerin, 1,2-hexanediol, methanol, ethanol, propanol, isopropanol, cyclohexanol, and N-methyl-2-pyrrolidone, but embodiments of the present disclosure are not limited thereto. For example, the concentration of the polymer in the composition may be in a range of about 0.1 wt % to about 10 wt %, for example, about 0.5 wt % to about 5 wt %, by taking into account coatability, but embodiments of the present disclosure are not limited thereto.

Also, a method of forming layers other than the layer including the polymer is not particularly limited. The layers other than the layer including the polymer may be formed by, for example, vacuum deposition or solution coating.

The substrate 110 may be any suitable substrate generally used in organic light-emitting devices. For example, the substrate 110 may be a glass substrate, a silicon substrate, or a transparent plastic substrate, but embodiments of the present disclosure are not limited thereto.

The first electrode 120 is formed on the substrate 10. In an embodiment, the first electrode 120 may be an anode. The first electrode 120 may include a material with a high work function selected from a metal, an alloy, and a conductive compound.

For example, the first electrode 120 may be formed as a transparent electrode including indium tin oxide ($In_2O_3$—$SnO_2$: ITO), indium zinc oxide ($In_2O_3$—ZnO), tin oxide ($SnO_2$), or zinc oxide (ZnO), each having excellent transparency and conductivity. The first electrode 120 may be formed as a reflective electrode by laminating magnesium (Mg), aluminum (Al), or the like on the transparent electrode.

The hole injection layer 130 is formed on the first electrode 120. The hole injection layer 130 facilitates hole injection from the first electrode 120. The hole injection layer 130 may be formed to a thickness of about 10 nanometers (nm) to about 1,000 nm, for example, about 10 nm to about 100 nm.

The hole injection layer 130 may include a known material, for example, poly(ether ketone)-containing triphenylamine (TPAPEK), 4-isopropyl-4'-methyldiphenyliodonium tetrakis(pentafluorophenyl)borate (PPBI), N,N'-diphenyl-N,N'-bis-[4-(phenyl-m-tolylamino)-phenyl]-biphenyl-4,4'-diamine (DNTPD), phthalocyanine compound such as copper phthalocyanine, 4,4',4"-tris(3-methylphenyl phenylamino)triphenylamine (m-MTDATA), N,N'-di(1-naphthyl)-N,N'-diphenylbenzidine (NPB), 4,4',4"-tris{N,N-diphenylamino}trisphenylamine (TDATA), 4,4',4"-tris(N,N-2-naphthylphenylamino)triphenylamine (2-TNATA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), and polyaniline)/poly(4-styrene sulfonate) (PANI/PSS).

The hole transport layer 140 may be formed on the hole injection layer 130. The hole transport layer 140 transports hole and may be formed to a thickness of about 10 nm to about 150 nm. Also, the hole transport layer 140 may include the polymer. The hole transport layer 140 may be formed by providing the polymer by solution coating. According to the above method, a film may be efficiently formed to a large area by using the polymer capable of improving the current efficiency (further, operation lifespan) of the organic light-emitting device 100.

However, when other organic layers except that the hole transport layer 140 in the organic light-emitting device 100 include the polymer according to the embodiment, the hole transport layer 140 may include a known hole transport material. Examples of the known hole transport material include 1,1-bis[(di-4-tolylamino)phenyl]cyclohexane (TAPC), a carbazole derivative such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-bis(naphthalen-2-yl)-N,N'-bis(phenyl)-benzidine (NPB), and poly(9,9-dioctyl-fluorene-co-N-(4-butylphenyl)-diphenylamine (TFB).

The emission layer 150 is formed on the hole transport layer 140. The emission layer 150 emits light such as phosphorescence or fluorescence, and may be formed on the hole transport layer 140 by using vacuum deposition, spin coating, or ink-jet printing. The emission layer 150 may be formed to a thickness of about 10 nm to about 60 nm. The emission layer 150 includes a known light-emitting material. For example, the emission layer 150 may include a light-emitting material capable of emitting light from triplet excitons (that is, emission by photoluminescence). In this embodiment, the driving lifespan of the organic light-emitting device 100 may be further improved.

The emission layer 150 may include, for example, a carbazole compound, a dicarbazole compound, a biscarbazole compound, a dibenzofuran compound, a spiro-bifluorene compound, a triazine-containing compound, an amine compound, and a polymer including these compounds as a substructure. For example, the emission layer 150 may further include 9,9'-diphenyl-3,3'-bi[9H-carbazole], tris(8-quinolinato)aluminium (Alq₃), 4,4'-bis(carbazol-9-yl)biphenyl (CBP), poly(n-vinylcarbazole) (PVK), 9,10-di(naphthalene)anthracene (ADN), 4,4',4"-tris(N-carbazolyl) triphenylamine (TCTA), 1,3,5-tris(N-phenyl-benzimidazol-2-yl)benzene (TPBi), 3-tert-butyl-9,10-di(naphth-2-yl) anthracene (TBADN), distyrylarylene (DSA), 4,4'-bis(9-carbazole)-2,2'-dimethyl-bipheny (dmCBP), Compound h-1, or Compound h-2.

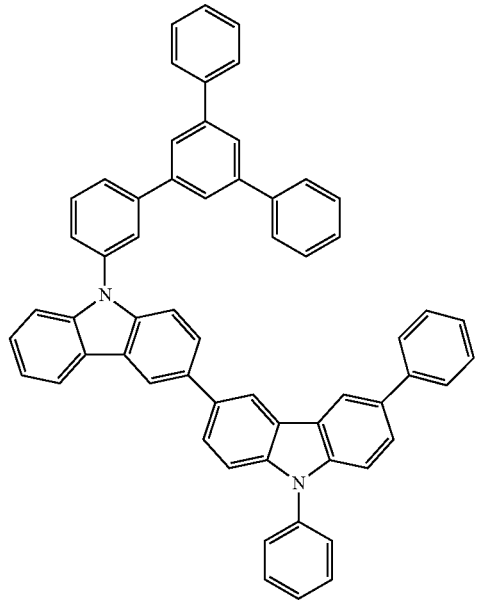

Compound h-1

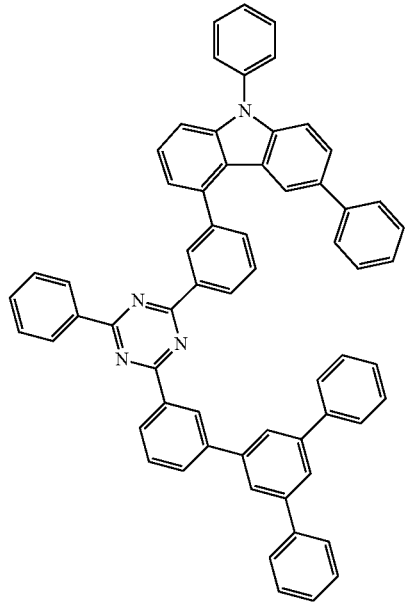

Compound h-2

Also, the emission layer 150 is not particularly limited, and may include any compound dopant material as long as the compound is capable of emitting fluorescence and phosphorescence. For example, the emission layer 150 may include a dye compound, an iridium complex, a platinum complex, and the like. For example, the emission layer 150 may include perylene and a derivative thereof, rubrene and a derivative thereof, coumarin and a derivative thereof, 4-dicyanomethylene-2-(p-dimethylaminostyryl)-6-methyl-4H-pyran (DCM) and a derivative thereof, an iridium complex such as bis[2-(4,6-difluorophenyl)pyridinate]picolinateiridium(III) (Flrpic), bis(1-phenylisoquinoline) (acetylacetonate)iridium(III) (Ir(piq)₂(acac)), tris(2-phenylpyridine) iridium(III) (Ir(ppy)₃), or tris(2-(3-p-xylyl) phenyl)pyridine iridium(III) (dopant), an osmium complex, and a platinum complex.

The electron transport layer 160 is formed on the emission layer 150. The electron transport layer 160 transports electrons and may be formed by using vacuum deposition, spin coating, or ink-jet printing. The electron transport layer 160 may be formed to a thickness of, for example, about 15 nm to about 50 nm.

The electron transport layer 160 may include a known electron transport material. Examples of the known electron transport material include tris(8-quinolinato) aluminium ($Alq_3$) and a compound having a nitrogen-containing aromatic ring. Specific examples of the compound having the nitrogen-containing aromatic ring include a compound including a pyridine ring such as 1,3,5-tri[(3-pyridyl)-phen-3-yl]benzene, a compound including a triazine ring such as 2,4,6-tris(3'-(pyridin-3-yl)biphenyl-3-yl)-1,3,5-triazine, a compound including an imidazole ring such as 2-(4-(N-phenylbenzimidazolyl-1-yl-phenyl)-9,10-dinaphthylanthracene, and 1,3,5-tris(N-phenyl-benzimidazol-2-yl)benzene (TPBi). Alternatively, as an electron transport material, a commercially available item may be used. Examples of the commercially available item may include KLET-01, KLET-02, KLET-03, KLET-10, and KLET-M1 (available from Chemipro Kasei Corporation).

The electron injection layer 170 is formed on the electron transport layer 160. The electron injection layer 170 facilitates electron injection from the second electrode 180, and may be formed by using vacuum deposition. The electron injection layer 170 may be formed to a thickness of about 0.3 nm to about 9 nm. The electron injection layer 170 may include a known electron injection material. For example, the electron injection layer 170 may include a lithium compound such as (8-hydroxyquinolinato)lithium (LiQ) and lithium fluoride (LiF), sodium chloride (NaCl), cesium fluoride (CsF), lithium oxide ($Li_2O$), or barium oxide (BaO).

The second electrode 180 is formed on the electron injection layer 170. For example, the second electrode 180 may be a cathode, and include a material with a low work function selected from a metal, an alloy, and a conductive compound. For example, the second electrode 180 may be formed as a reflective electrode including a metal such as lithium (Li), magnesium (Mg), aluminum (Al), or calcium (Ca) or an alloy such as aluminum-lithium (Al—Li), magnesium-indium (Mg—In), or magnesium-silver (Mg—Ag). Alternatively, the second electrode 180 may be formed as a transparent electrode having a thickness of about 20 nm or less and including a metal or alloy thin film, a transparent conductive film such as indium tin oxide ($In_2O_3$—$SnO_2$) and indium zinc oxide ($In_2O_3$—ZnO), and the like.

While not wishing to be bound by theory, it is understood that since the organic light-emitting device 100 according to the embodiment has the organic layer including the polymer, the current density (further, operation lifespan) thereof will be improved.

Also, the stacked structure of the organic light-emitting device 100 according to the embodiment is not limited to the above-described examples. The organic light-emitting device 100 according to the embodiment may be formed to have another known stacked structure. For example, in the organic light-emitting device 100, at least one of the hole injection layer 130, the hole transport layer 140, the electron transport layer 160, and the electron injection layer 170 may be omitted. Also, the organic light-emitting device 100 may further include other layers. Each layer of the organic light-emitting device 100 may be a single layer or a multi-layer.

In order to prevent diffusion of triplet excitons or holes to the electron transport layer 160, the organic light-emitting device 100 may further include a hole blocking layer between the hole transport layer 140 and the emission layer 150. The hole blocking layer may be formed using, for example, an oxadiazole derivative a triazole derivative, or a phenanthroline derivative.

On the other hand, the polymer compound according to the embodiment may be applied to the quantum-dot light-emitting devices and organic and inorganic perovskite light-emitting devices as electroluminescent devices other than the organic light-emitting device.

The quantum-dot light-emitting device may be manufactured by forming a quantum-dot emission layer instead of the emission layer 150 of the organic light-emitting device 100.

The quantum-dot emission layer includes a plurality of quantum dots (inorganic nanoparticles) arranged in a single layer or multiple layers. The quantum dot means particles of a predetermined size having a quantum confinement effect. A diameter of the quantum dot is not particularly limited, but may be in a range of, for example, about 1 nm to about 10 nm.

The quantum dots arranged in the quantum-dot emission layer may be synthesized by a wet chemical process, an organometallic chemical vapor deposition process, a molecular beam epitaxy process, or a similar process.

The wet chemical process is a method in which a precursor material is added to an organic solvent to grow grain crystals. When the crystal grows, since the organic solvent naturally acts as a dispersant coordinated to the surface of the quantum dot crystal and controls the growth of the crystal, it is possible to control the growth of inorganic nanoparticles through a process that is easier and less expensive than a vapor deposition method such as metal organic chemical vapor deposition (MOCVD) or molecular beam epitaxy (MBE). Since the energy band gap can be controlled by adjusting the size of the quantum dot, light of various wavelength ranges can be obtained in the quantum-dot emission layer. Therefore, a display that emits light of various wavelengths can be realized by using quantum dots of different sizes. For example, the size of the quantum dot can be selected to emit red, green and blue light so as to implement a color display. In addition, the size of the quantum dot can be configured to emit white light by combining light of various colors.

In an embodiment, the quantum dot may include a semiconductor material selected from group II-VI semiconductor compounds, group Ill-V semiconductor compounds, group IV-VI semiconductor compounds, group IV elements or compounds, a combination thereof.

For example, the group II-VI semiconductor compounds may be selected from: a 2-element compound selected from CdSe, CdTe, ZnS, ZnSe, ZnTe, ZnO, HgS, HgSe, HgTe, and a mixture thereof; a 3-element compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; and a 4-element compound selected from CdZnSeS, CdZnSeTe, CdZnSTe, CdHgSeS, CdHgSeTe, CdHgSTe, HgZnSeS, HgZnSeTe, HgZnSTe, and a mixture thereof, but embodiments of the present disclosure are not limited thereto.

For example, the group Ill-V semiconductor compounds may be selected from: a 2-element compound selected from GaN, GaP, GaAs, GaSb, AlN, AlP, AlAs, AlSb, InN, InP, InAs, InSb, and a mixture thereof; a 3-element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a 4-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but embodiments of the present disclosure are not limited thereto.

For example, the group IV-VI semiconductor compounds may be selected from: a 2-element compound selected from SnS, SnSe, SnTe, PbS, PbSe, PbTe, and a mixture thereof; a 3-element compound selected from SnSeS, SnSeTe, SnSTe, PbSeS, PbSeTe, PbSTe, SnPbS, SnPbSe, SnPbTe, and a mixture thereof; and a 4-element compound selected from SnPbSSe, SnPbSeTe, SnPbSTe, and a mixture thereof, but embodiments of the present disclosure are not limited thereto.

For example, the group IV elements or compounds may be selected from: a single element compound selected from Si, Ge, and a mixture thereof; and a 2-element compound selected from SiC, SiGe, and a mixture thereof, but embodiments of the present disclosure are not limited thereto.

On the other hand, the quantum dot may have a uniform single structure or a core-shell double structure. For example, the core and the shell may include different materials. For example, materials constituting the core and the shell may be different semiconductor compounds. However, an energy band gap of the material constituting the shell may be larger than an energy band gap of the material constituting the core.

Hereinafter, the case of manufacturing the quantum dot having a structure including a core (CdSe) and a shell (ZnS) will be described.

First, crystals are generated by injecting a precursor material such as (CH$_3$)$_2$Cd(dimethylcadmium)TOPSe(trioctylphosphine selenide) in an organic solvent using trioctylphosphine oxide (TOPO) as a surfactant. At this time, in order to grow the crystals to a constant size, the shell is formed on the surface of the already formed core by injecting the precursor material of the shell (ZnS) while being maintained for a predetermined time at a high temperature. As a result, the quantum dot having a sealed CdSe/ZnS in TOPO may be manufactured.

While the present disclosure has been described with reference to the accompanying drawings, the present disclosure is not limited thereto. It will be understood by those of ordinary skill in the art that various modifications in forms and details can be made thereto without departing from the spirit and scope of the present disclosure as defined in the appended claims. It is understood that various changes and modifications are within the technical scope of the present disclosure.

Hereinafter, the polymer and the organic light-emitting device including the polymer according to embodiments will be described in detail with reference to Synthesis Examples and Comparative Examples. Examples described below are provided as examples only, and the polymer and the organic light-emitting device according to embodiments are not limited by Examples provided below.

Further, in Examples provided below, unless otherwise indicated, the operation was carried out at room temperature (25° C.). Also, unless otherwise indicated, "%" and "parts" refer to "% by mass" and "parts by weight", respectively.

EXAMPLES

Synthesis Example 1: Synthesis of Compound 1

Compound 1 was synthesized according to the Reaction Scheme below.

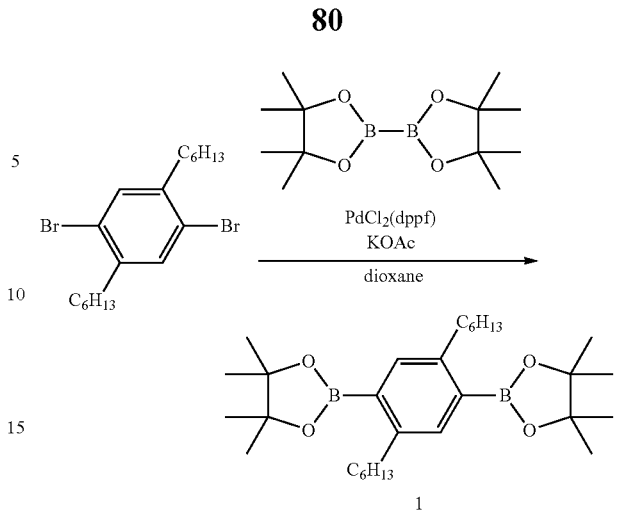

8.08 grams (g) (20.0 millimoles, mmol) of 1,4-dihexyl-2,5-dibromobenzene, 12.19 g (48.0 mmol) of bis(pinacolatodiboron), 0.98 g (1.2 mmol) of 1,1'-bis(diphenylphosphino)ferrocene]palladium(II), 11.78 g (120.0 mmol) of potassium acetate, and 100 milliliters (ml) of dioxane were added to a reaction vessel in an argon atmosphere, and the mixture was stirred for 6 hours under reflux. Toluene and water were added thereto, and the toluene layer was separated and washed with water. Sodium sulfate and activated charcoal were added thereto, and the dried solution was filtered through Celite (registered trademark). The filtrate obtained therefrom was concentrated to obtain 11.94 g of a crude compound. The obtained product was recrystallized with hexane, and the crystals were washed with methanol. The obtained crystals were dried under reduced pressure to obtain 4.23 g of Compound 1. The structure of the obtained compound 1 was identified by 1H-NMR.

1H-NMR (300 MHz, CDCl$_3$): δ 7.59 (bd, 2H), 2.88 (t, 4H), 1.62 (m, 4H), 1.421.39 (bd, 36H), 0.95 (t, 6H).

Synthesis Example 2: Synthesis of Compound

Compound 2 was synthesized according to the Reaction Scheme below:

22.7 g (70.0 mmol) of 2,7-dibromofluorene, 21.9 g (147.0 mmol) of 5-bromo-1-pentene, 16.7 g (297.6 mmol) of potassium hydroxide, 1.2 g (7.2 mmol) of potassium iodide, and 170 ml of dimethylsulfoxide were added to a reaction vessel in an argon atmosphere, and the mixture was allowed to react for 4 hours at a temperature of 80° C. After the reaction was completed, the reaction mixture was cooled to room temperature. Then, 300 ml of water and 300 ml of toluene were added thereto. The toluene layer was separated and washed five times by using 300 ml of saturated brine. The organic layer obtained therefrom was dried by using sodium sulfate, and the solvent was distilled off. Then, the residue obtained therefrom was purified by column chromatography and recrystallized to obtain 24.1 g of Compound 2. The structure of the obtained Compound 2 was identified by 1H-NMR.

1H-NMR (270 MHz, CDCl$_3$): δ 7.537.44 (m, 6H), 5.56 (m, 2H), 4.85 (d, 4H), 1.93 (m, 4H), 1.83 (m, 4H), 0.69 (t, 4H).

Synthesis Example 3: Synthesis of Compound 3

1) Synthesis of Compound 3-1
Compound 3-1 was synthesized according to the Reaction Scheme below.

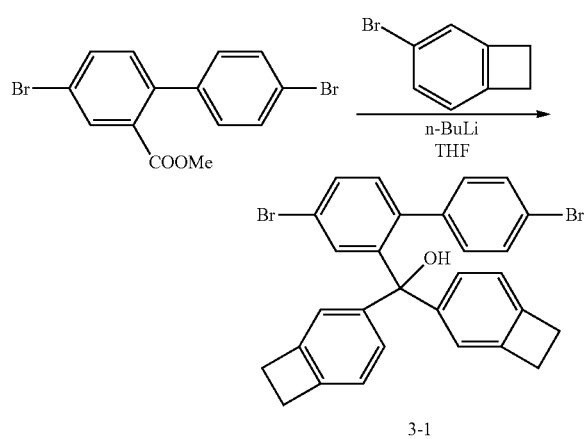

4.1 g (22.4 mmol) of 3-bromobenzocyclobutane and 69 ml of tetrahydrofuran were added to a reaction vessel in an argon atmosphere and cooled to −78° C. in a dry ice-methanol bath. 16.9 ml of n-BuLi was added thereto, and the mixture was stirred for 2 hours. A solution containing 4.1 g of methyl 4,4'-dibromo-[1,1'-biphenyl]-2-carboxylic acid ester dissolved in 12 ml of tetrahydrofuran was added dropwise thereto. The reaction mixture was stirred at a temperature of −78° C. for 2 hours and then further stirred at room temperature for 4 hours. 50 ml of water was slowly added thereto while the reaction mixture was cooled in an ice bath. Then, the reaction mixture was transferred to a separatory funnel and washed twice with 30 ml of water. The organic layer obtained therefrom was dried by using magnesium sulfate, and a solid obtained therefrom was filtered and a solution was concentrated to obtain 4.1 g of Intermediate 3-1.

2) Synthesis of Compound 3
Compound 3 was synthesized according to the Reaction Scheme below.

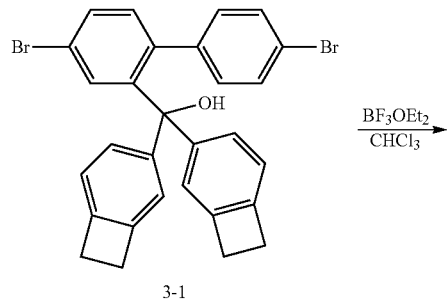

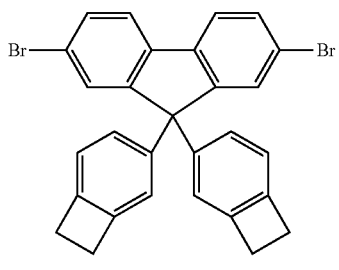

4.1 g (7.51 mmol) of Intermediate 3-1 and 120 ml of chloroform were added to a reaction vessel in an argon atmosphere, and the solution was cooled to 0° C. in an ice bath. Then, 1.0 ml of BF$_3$.Et$_2$O was added. After the reaction mixture was stirred for 1 hour, 1.0 ml of BF$_3$.Et$_2$O was added thereto, and the reaction mixture was stirred for 1 hour and further stirred at room temperature for 5 hours. 100 ml of water was added thereto, and the mixture was stirred and transferred to a separatory funnel. The organic layer was extracted therefrom three times by using 50 ml of chloroform. The combined extracted organic layers were dried by using sodium sulfate, a solution was concentrated, and 30 ml of chloroform was added thereto. Crystals were obtained by adding 300 ml of methanol thereto while heating under reflux, and the obtained crystals were filtered. The crystals were added to 20 ml of chloroform and heated, and 200 ml of methanol was added thereto, and the mixture was stirred at room temperature for 2 hours. The generated crystals were filtered and dried to obtain 2.0 g of Compound 3. The structure of the obtained Compound 3 was identified by 1H-NMR.

1H-NMR (300 MHz, CDCl$_3$): δ 7.56 (d, 2H), 7.49 (d, 2H), 7.45 (dd, 2H), 7.01 (d, 2H), 6.92 (d, 2H), 6.81 (s, 2H), 3.11 (s, 4H).

Synthesis Example 4: Synthesis of Compound 4

1) Synthesis of Compound 4-1
Compound 4-1 was synthesized according to the Reaction Scheme.

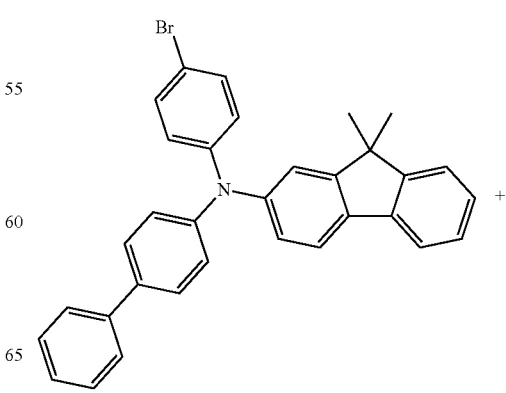

-continued

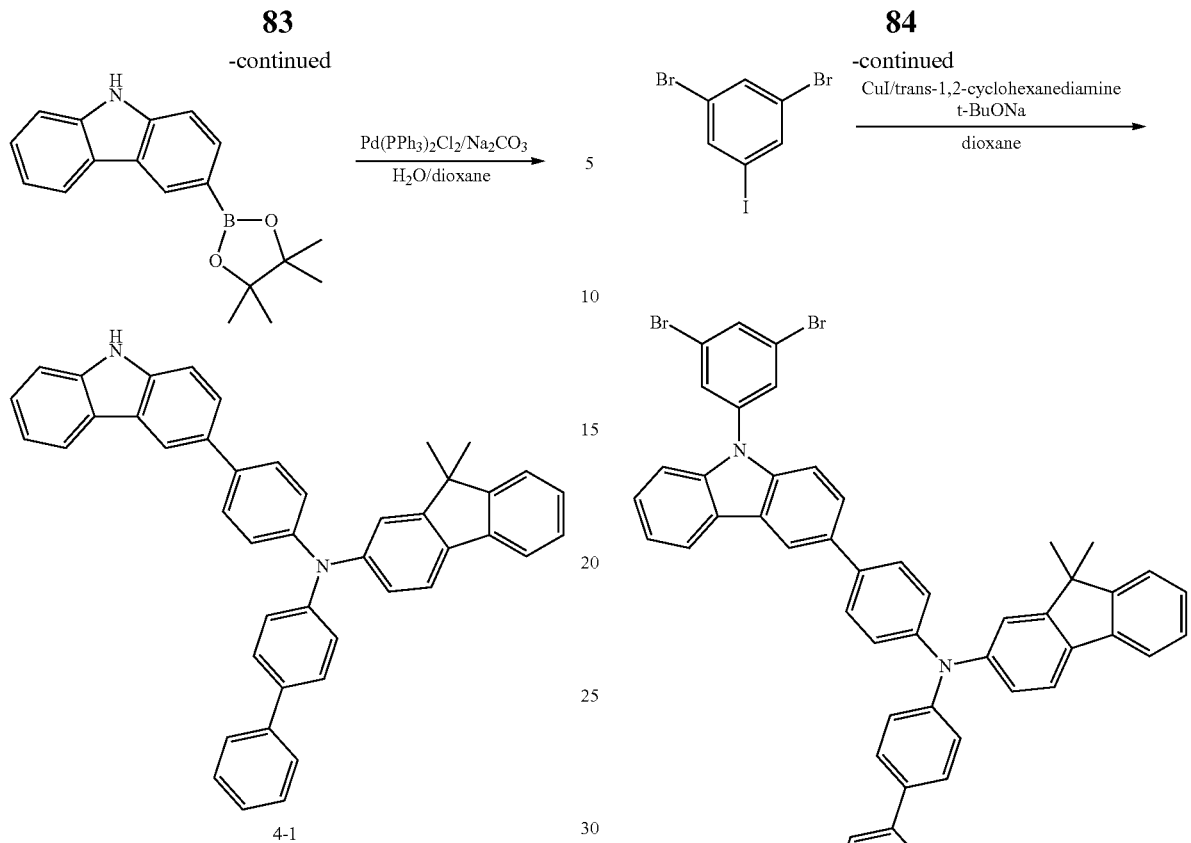

4-1

15.00 g (29.04 mmol) of 2-amino-N-[(1,1'-biphenyl)-4-yl]-N-(4-bromophenyl)-9,9-dimethylfluorene, 7.66 g (26.14 mmol) of 3-(4,4,5,5-tetramethyl-1,3,2-dioxaborolane-2-yl) carbazole, 0.41 g (0.58 mmol) of bis(triphenylphosphine) palladium(II)dichloride, 7.70 g (72.61 mmol) of sodium carbonate, 290 ml of dioxane, and 145 ml of water were added to a reaction vessel in an argon atmosphere, and the mixture was stirred at a temperature of 85° C. for 4 hours. After the reaction was completed, the reaction mixture was cooled to room temperature, and filtered through Celite (registered trademark). The solvent was distilled off, and the residue was purified by column chromatography to obtain 12.7 g of Compound 4-1.

2) Synthesis of Compound 4

Compound 4 was synthesized according to Reaction Scheme below:

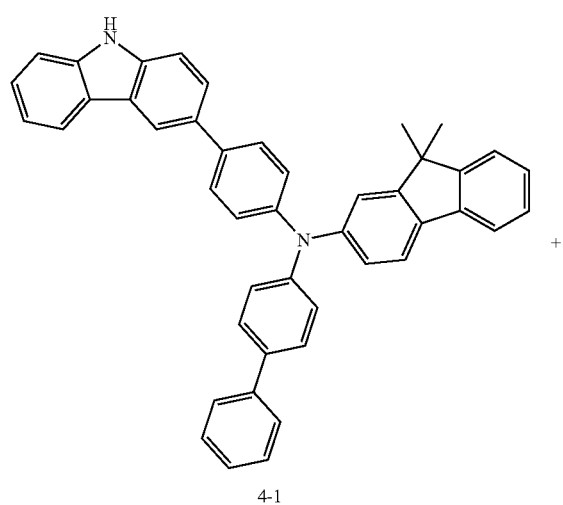

4-1

7.00 g (11.6 mmol) of Compound 4-1, 4.62 g (12.77 mmol) of 1,3-dibromo-5-iodine benzene, 0.11 g (0.58 mmol) of copper(I) iodide, 0.29 g (2.55 mmol) of trans-1,2-cyclohexanediamine, 2.23 g (23.23 mmol) of sodium tert-butoxide, and 35 ml of dioxane were added to a reaction vessel in an argon atmosphere, and the mixture was stirred at a temperature of 90° C. for 6 hours. After the reaction was completed, the mixture was cooled to room temperature and filtered through Celite (registered trademark). The solvent was distilled off, and the residue was purified by column chromatography to obtain 6 g of Compound 4. The structure of the obtained Compound 4 was identified by 1H-NMR.

1H-NMR (300 MHz, CD$_2$Cl$_2$): δ 8.38 (d, 1H), 8.19 (dt, 1H), 7.81 (t, 1H), 7.78 (d, 2H), 7.70~7.20 (m, 24H), 7.14 (dd, 1H), 1.48 (s, 6H).

Synthesis Example 5: Synthesis of Compound 5

Compound 5 was synthesized according to the Reaction Scheme below.

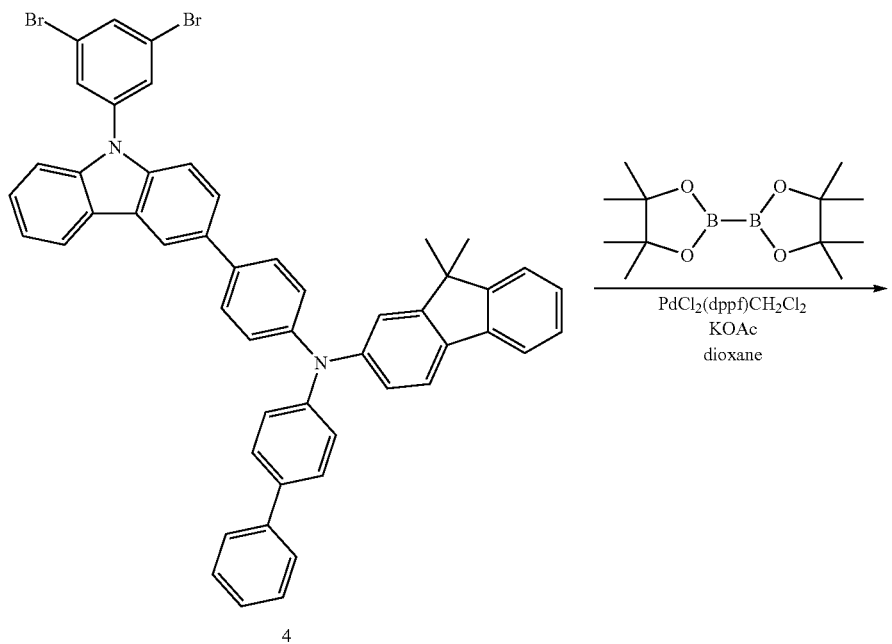

4

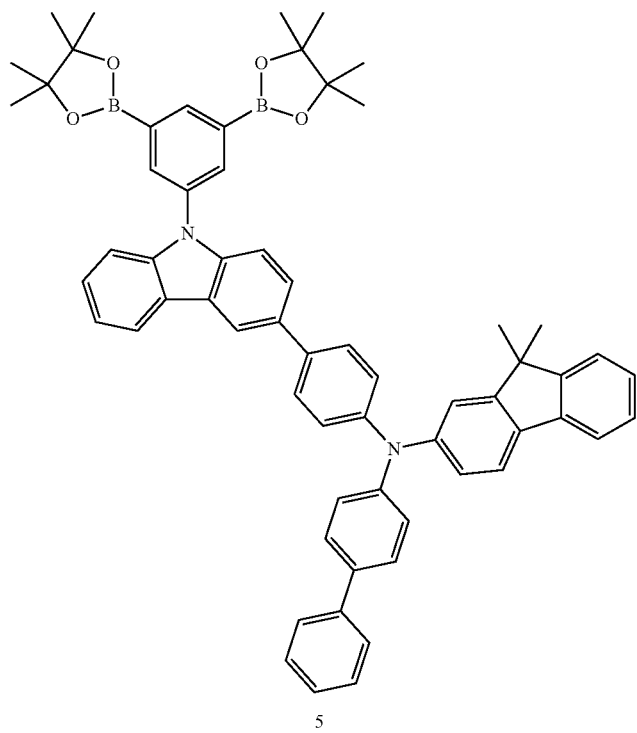

5

4.00 g (4.78 mmol) of Compound 4, 3.64 g (14.34 mmol) of bis(pinacolato)diboron, 2.82 g (28.69 mmol) of potassium acetate, 0.11 g (0.13 mmol) of [bis(diphenylphosphino)ferrocene]dichloropalladium, and 50 ml of dioxane were added to a reaction vessel in an argon atmosphere, and the mixture was stirred at a temperature of 90° C. for 6 hours. After the reaction was completed, the mixture was cooled to room temperature and filtered through Celite (registered trademark). The solvent was distilled off, and the residue was purified by column chromatography to obtain 3 g of Compound 5. The structure of the obtained Compound 5 was identified by 1H-NMR.

1H-NMR (300 MHz, $CD_2Cl_2$): δ 8.30 (s, 1H), 8.29 (t, 1H), 8.22 (d, 1H), 8.07 (d, 2H), 7.70~7.0 (m, 25H), 7.14 (dd, 1H), 1.48 (s, 6H), 1.38 (s, 24H).

Synthesis Example 6: Synthesis of Compound 6

Compound 6 was synthesized according to the Reaction Scheme below.

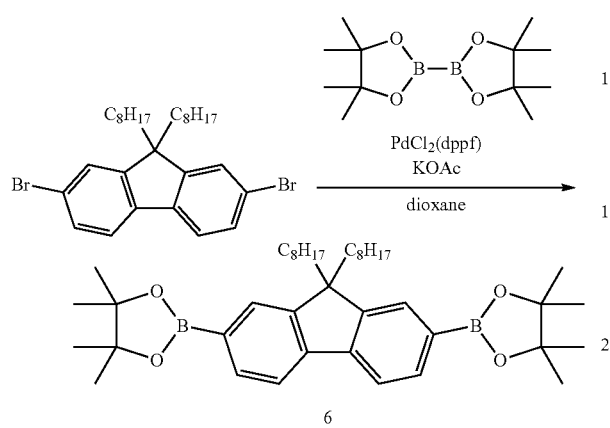

11.00 g (20.0 mmol) of 2,7-dibromo-9,9-dioctylfluorene, 12.19 g (48.0 mmol) of bis(pinacolatodiboron), 0.98 g (1.2 mmol) of 1,1'-bis(diphenylphosphino) ferrocene]palladium (II), 11.78 g (120.0 mmol) of potassium acetate, and 100 ml of dioxane were added to a reaction vessel in an argon atmosphere, and the mixture was stirred for 6 hours under reflux. Toluene and water were added thereto, and the toluene layer was separated and washed with water. Sodium sulfate and activated charcoal were added thereto, and the dried solution was filtered through Celite (registered trademark). The filtrate obtained therefrom was concentrated to obtain 11.9 g of a crude compound. The obtained product was recrystallized with hexane, and the crystals were washed with methanol. The obtained crystals were dried under reduced pressure to obtain 9.8 g of Compound 6.

Synthesis Example 7: Synthesis of Compound 7

1) Synthesis of Compound 7-1

Compound 7-1 was synthesized according to the Reaction Scheme below.

15.00 g (61.19 mmol) of N-phenyl-[1,1'-biphenyl]-4-amine, 21.19 g (61.19 mmol) of tert-butyl-3-bromo-9H-carbazole-9-carboxylic acid ester, 2.8 g (3.06 mmol) of tris(dibenzylidene acetone)dipalladium(0), 0.53 g (1.84 mmol) of tri-tert-butyl phosphonium tetrafluoroborate, 7.06 g (73.43 mmol) of sodium tert-butoxide, and 400 ml of toluene were added to a reaction vessel in an argon atmosphere, and the mixture was stirred at a temperature of 110° C. for 6 hours. After the reaction was completed, the reaction mixture was cooled to room temperature and filtered through Celite (registered trademark). The solvent was distilled off, and the residue was purified by column chromatography to obtain 25 g of Compound 7-1.

2) Synthesis of Compound 7-2

Compound 7-2 was synthesized according to the Reaction Scheme below.

10.2 g (20 mmol) of Compound 7-1, 100 ml of 1,4-dioxane, and 10 ml of hydrochloric acid were added to a reaction vessel in an argon atmosphere, and the mixture was stirred at a temperature of 80° C. for 2 hours. The reaction solution was concentrated, 300 ml of toluene was added thereto and neutralized by saturated aqueous sodium hydrogen carbonate solution to separate the organic layer. The obtained organic layer was concentrated, and the residue was purified by column chromatography to obtain 6.5 g of Compound 7-2.

3) Synthesis of Compound 7-3

Compound 7-3 was synthesized according to the Reaction Scheme below.

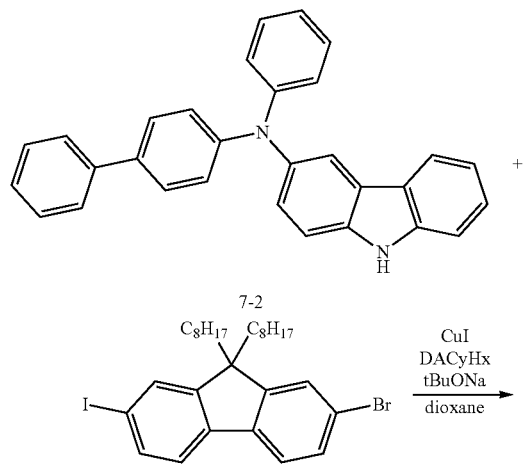

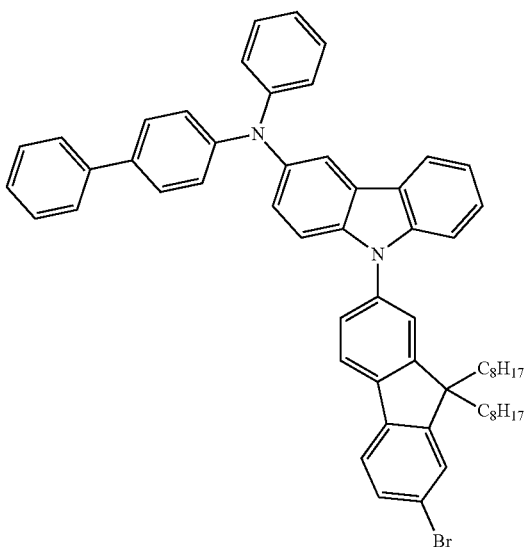

8.00 g (19.49 mmol) of Compound 7-2, 12.76 g (21.44 mmol) of 2-bromo-7-iodine-9,9-dioctylfluorene, 0.19 g (0.97 mmol) of copper(I) iodine, 0.49 g (4.29 mmol) of trans-1,2-cyclohexanediamine, 3.75 g (38.97 mmol) of sodium tert-butoxide, and 60 ml of dioxane were added to a reaction vessel in an argon atmosphere, and the mixture was stirred at a temperature of 90° C. for 6 hours. After the reaction was completed, the mixture was cooled to room temperature and filtered through Celite (registered trademark). The solvent was distilled off, and the residue was purified by column chromatography to obtain 8 g of Compound 7-3.

4) Synthesis of Compound 7-4

Compound 7-4 was synthesized according to the Reaction Scheme below.

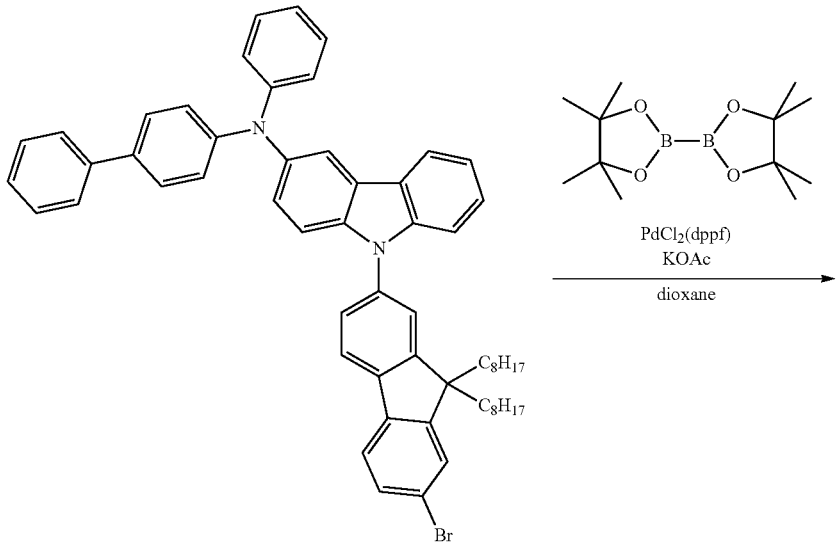

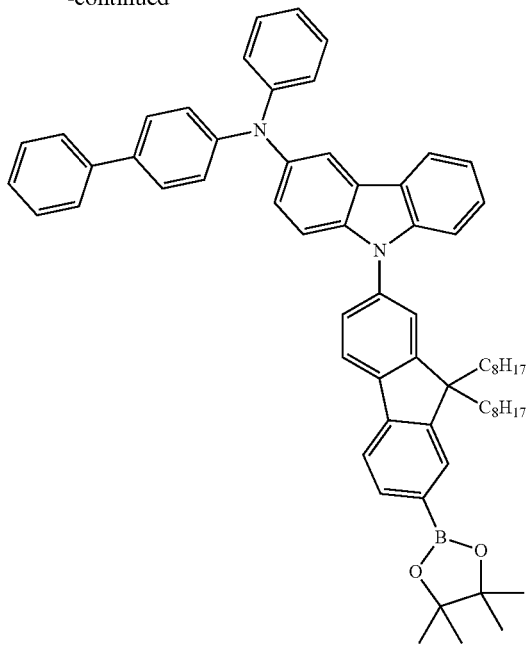

7-4

8.00 g (9.11 mmol) of Compound 7-3, 3.47 g (13.67 mmol) of bis(picolatoboron)diboron, 2.68 g (27.33 mmol) of potassium acetate, 0.1 g (0.13 mmol) of [bis(diphenyl phosphino)ferrocene]dichloropalladium, and 90 ml of dioxane were added to a reaction vessel in an argon atmosphere, and the mixture was stirred at a temperature of 90° C. for 6 hours. After the reaction was completed, the mixture was cooled to room temperature and filtered through Celite (registered trademark). The solvent was distilled off, and the residue was purified by column chromatography to obtain 6 g of Compound 7-4.

5) Synthesis of Compound 7

Compound 7 was synthesized according to the Reaction Scheme below.

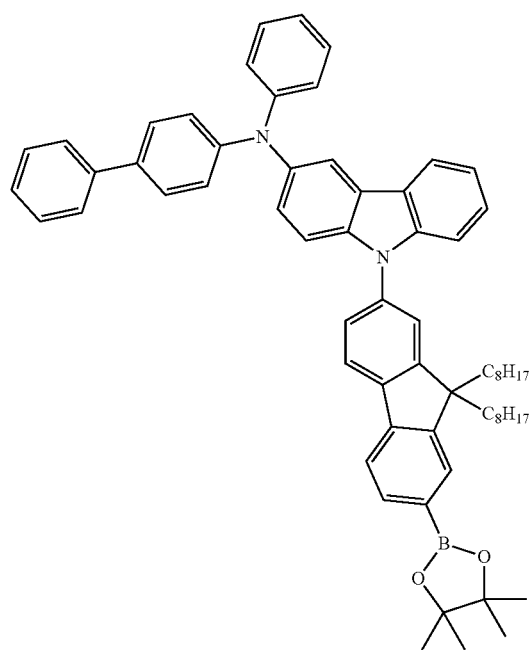

7-4

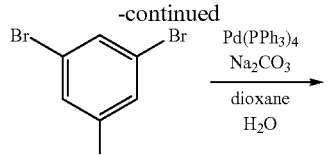

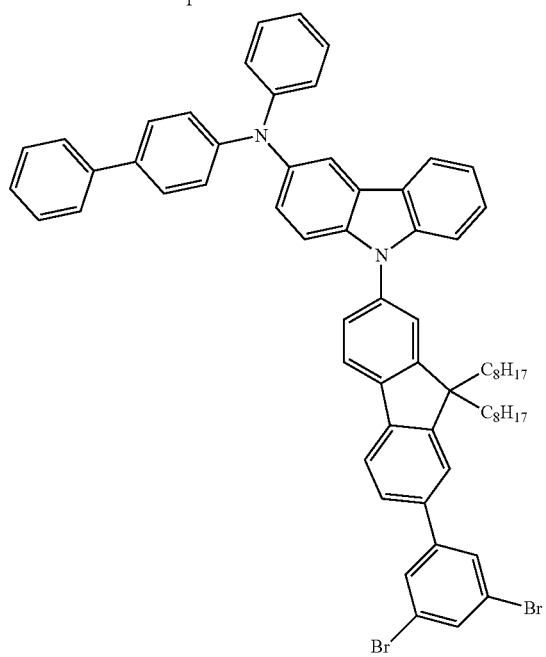

7

6.00 g (6.49 mmol) of Compound 7-4, 2.82 g (7.78 mmol) of 1,3-dibromo-5-iodine benzene, 0.23 g (0.19 mmol) of tetrakis(triphenylphosphine)palladium(0), 2.06 g (19.46 mmol) of sodium carbonate, 78 ml of dioxane, and 39 ml of water were added to a reaction vessel in an argon atmosphere, and the mixture was stirred at a temperature of 85°

C. for 4 hours. After the reaction was completed, the mixture was cooled to room temperature and filtered through Celite (registered trademark). The solvent was distilled off, and the residue was purified by column chromatography to obtain 4 g of Compound 7.

Synthesis Example 8: Synthesis of Compound 8

1) Synthesis of Compound 8-1

Compound 8-1 was synthesized according to the Reaction Scheme below.

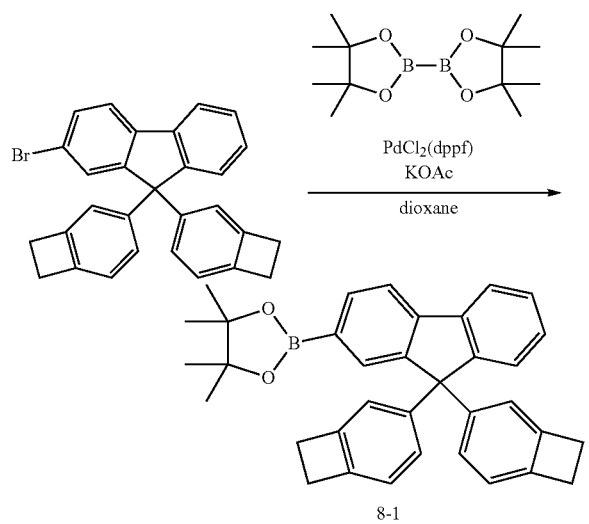

8-1

12.00 g (26.70 mmol) of 9-(bicyclo[4.2.0]octa-1 (6)2,4-trien-3-yl)-9-(bicyclo[4.2.0]octa-1,3,5-trien-3-yl)-2-bromo-9H-fluorene, 10.17 g (40.05 mmol) of pinacol diboran, 0.31 g (0.37 mmol) of PdCl$_2$ (dppf).CH$_2$Cl$_2$, 7.86 g (80.11 mmol) of potassium acetate were added to a 300-ml three-neck flask in an argon atmosphere, and the flask was filled with argon. 267 ml of dehydrated 1,4-dioxane was added to the flask and the mixture was stirred at a temperature of 100° C. for 1 hour. After the reaction was completed, the mixture was cooled to room temperature and filtered through Celite (registered trademark). 10 g of activated charcoal was added to a filtrate, and the mixture was stirred at a temperature of 100° C. for 1 hour. The activated charcoal was removed by using Celite, and the filtrate was concentrated. The obtained solid was washed with 30 ml of acetonitrile at room temperature to obtain 10 g of Compound 8-1.

2) Synthesis of Compound 8

Compound 8 was synthesized according to the Reaction Scheme below.

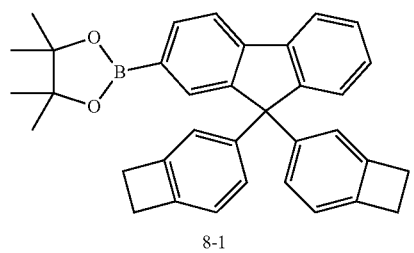

8-1

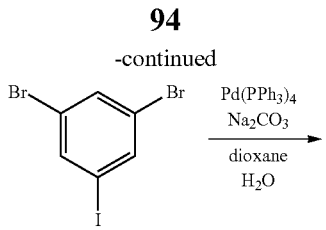

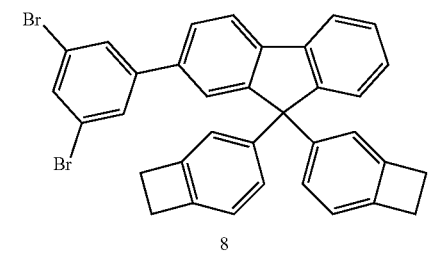

8

10.00 g (20.14 mmol) of Compound 8-1, 7.29 g (20.14 mmol) of 1,3-dibromo-5-iodine benzene, 0.70 g (0.60 mmol) of tetrakis(triphenylphosphine)palladium(0), 6.41 g (60.43 mmol) of sodium carbonate, 240 ml of dioxane, and 120 ml of water were added to a reaction vessel in an argon atmosphere, and the mixture was stirred at a temperature of 85° C. for 4 hours. After the reaction was completed, the mixture was cooled to room temperature and filtered through Celite (registered trademark). The solvent was distilled off, and the residue was purified by column chromatography to obtain 7 g of Compound 8.

Synthesis Example 9: Synthesis of Compound 9

Compound 9 was synthesized according to the Reaction Scheme below.

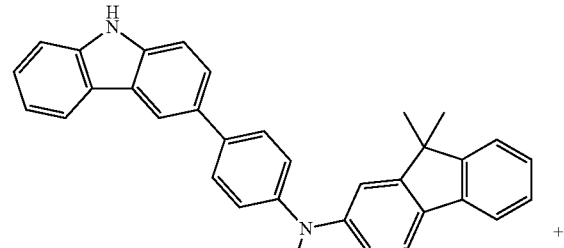

4-1

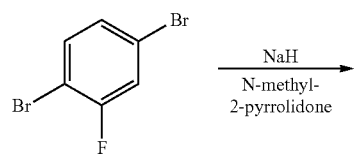

-continued

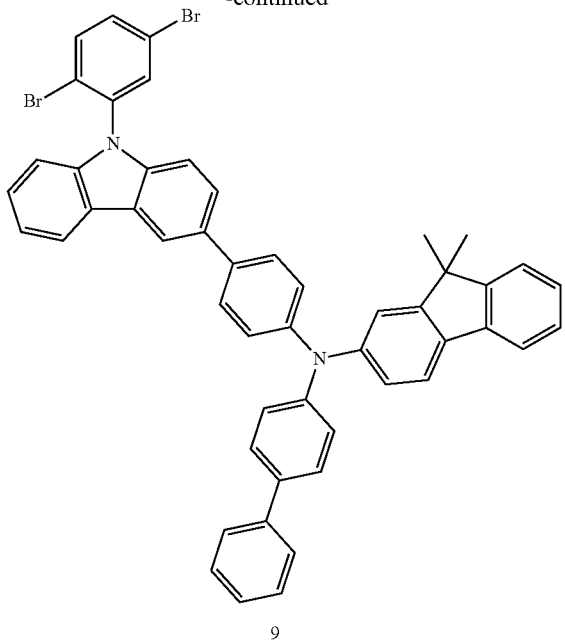

9

7.00 g (11.6 mmol) of Compound 4-1, 3.04 g (12.0 mmol) of 1,4-dibromo-2-fluorobenzene, and 100 ml of N-methylpyrrolidone (NMP) were added to a reaction vessel in an argon atmosphere, and the mixture was stirred at room temperature. 0.478 g (content: 60%, 12.0 mmol) of sodium hydride was added thereto and mixed. The mixture was stirred at a temperature of 180° C. for 5 hours. After the reaction was completed, the mixture was cooled to room temperature. 100 ml of toluene was added thereto, and the mixture was transferred to a separatory funnel and washed three times with 100 ml of water. The solvent was distilled off, and the residue was purified by column chromatography to obtain 6.08 g of Compound 9.

Synthesis Example 10: Synthesis of Compound 10

1) Synthesis of Compound 10-1

Compound 10-1 was synthesized according to the Reaction Scheme below.

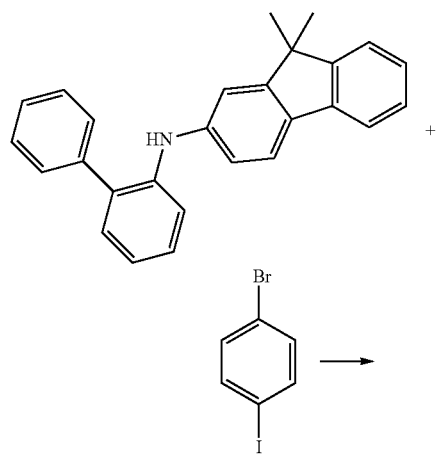

-continued

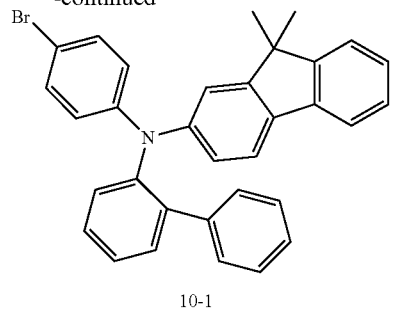

10-1

7.04 g (19.49 mmol) of 2-(2-phenyl-yl)amino-9,9-dimethylfluorene (manufactured by Tokyo Chemical Industry Co., Ltd.), 6.06 g (21.44 mmol) of 1-bromo-4-iodine benzene, 0.19 g (0.97 mmol) of silver (I) iodide, 0.49 g (4.29 mmol) of trans-1,2-cyclohexanediamine, 3.75 g (38.97 mmol) of sodium tert-butoxide, 60 ml of dioxane were added to a reaction vessel in an argon atmosphere. The reaction mixture was stirred at a temperature of 90° C. for 6 hours. After the reaction was completed, the reaction mixture was cooled to room temperature. Then, impurities were filtered through Celite (registered trademark) and discarded. The solvent was distilled off, and the residue was purified by column chromatography to obtain 7.24 g of Compound 10-1.

2) Synthesis of Compound 10-2

Compound 10-2 was synthesized according to the Reaction Scheme below.

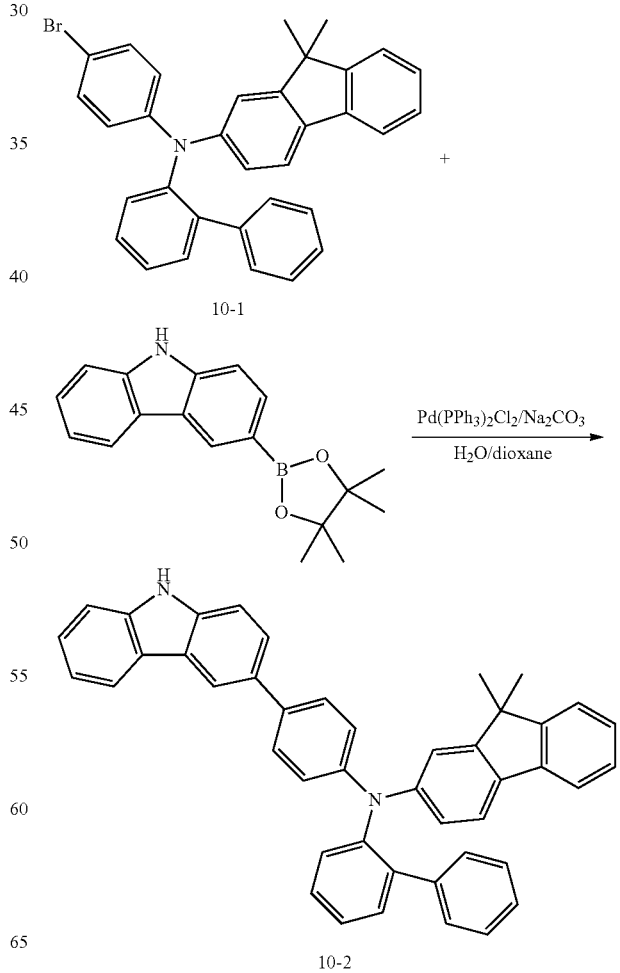

10-2

15.00 g (29.04 mmol) of Compound 10-1, 7.66 g (26.14 mmol) of 3-(4,4,5,5,-tetramethyl-1,3,2-dioxabolane-2-yl) carbazole, 0.41 g (0.58 mmol) of bis(triphenylphosphine) palladium(II) dichloride, 7.70 g (72.61 mmol) of sodium carbonate, 290 ml of dioxane, and 145 ml of water were added to a reaction vessel in an argon atmosphere, and the mixture was stirred. The mixture was stirred at a temperature of 85° C. for 4 hours. After the reaction was completed, the reaction mixture was cooled to room temperature. The impurities were filtered through Celite (registered trademark) and discarded. The solvent was distilled off, and the residue was purified by column chromatography to obtain 10.7 g of Compound 10-2.

3) Synthesis of Compound 10

Compound 10 was synthesized according to the Reaction Scheme below.

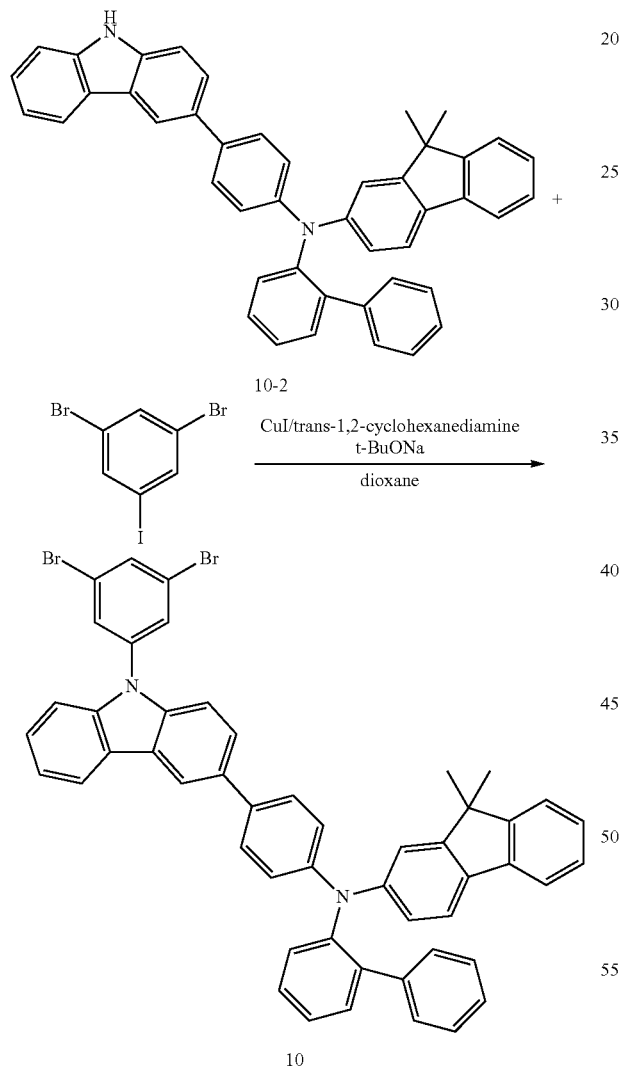

7.00 g (11.6 mmol) of Compound 10-2, 4.62 g (12.77 mmol) of 1,3-dibromo-5-iodine benzene, 0.11 g (0.58 mmol) of silver (I) iodide, 0.29 g (2.55 mmol) of trans-1,2-cyclohexanediamine, 2.23 g (23.23 mmol) of sodium tert-butoxide, and 35 ml of dioxane were additionally mixed in a reaction vessel in an argon atmosphere. The mixture was stirred at a temperature of 90° C. for 6 hours. After the reaction was completed, the mixture was cooled to room temperature. Then, impurities were filtered through Celite (registered trademark) and discarded. The solvent was distilled off, and the residue was purified by column chromatography to obtain 5.2 g of Compound 10.

Synthesis Example 11: Synthesis of Polymer A-1

Polymer A-1 having the following constituent units was synthesized by using Compound 1, Compound 2, Compound 3, and Compound 4.

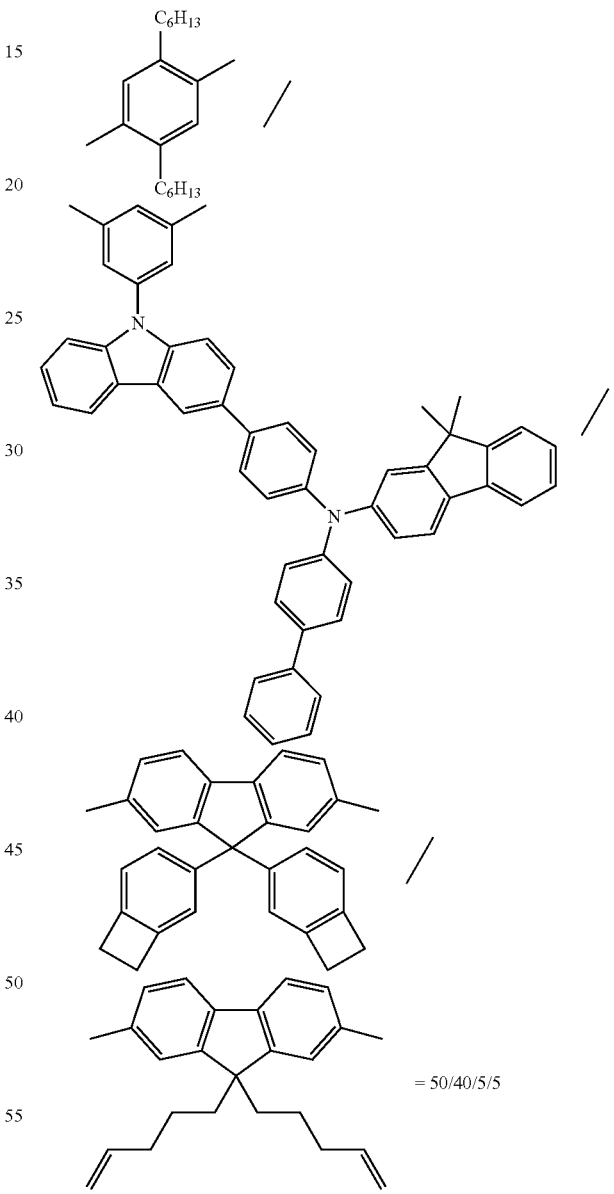

1.96 g of Compound 1, 0.184 g of Compound 2, 0.211 g of Compound 3, 2.576 g of Compound 4, 4.3 mg of palladium acetate, 27.0 mg of tris(2-methoxyphenyl)phosphine, 55 mL of toluene, and 15.2 g of 20 percent by weight (wt %) tetraethyl ammonium hydroxide aqueous solution (15.2 g) were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through column chromatography charged with silica/alumina, and the solvent in the obtained solution was distilled under reduced pressure to obtain 0.79 g of Polymer A-1.

From the addition ratio of the monomers, it was assumed that the ratio of the constituent unit derived from Compound 1:the constituent unit derived from Compound 5:the constituent unit derived from Compound 3:the constituent unit derived from Compound 2 in Polymer A-1 was 50:40:5:5 (molar ratio) and the constituent units were alternately polymerized. Also, it was estimated by size-exclusion chromatography (SEC) that the number average molecular weight ($M_n$), the weight average molecular weight ($M_w$), and the molecular weight distribution ($M_w/M_n$) of Polymer A-1 were $M_n$=42,000, $M_w$=80,000, and $M_w/M_n$=1.85.

Synthesis Example 12: Synthesis of Polymer A-2

Polymer A-2 having the following constituents unit was synthesized by using Compound 6, Compound 7, and Compound 8.

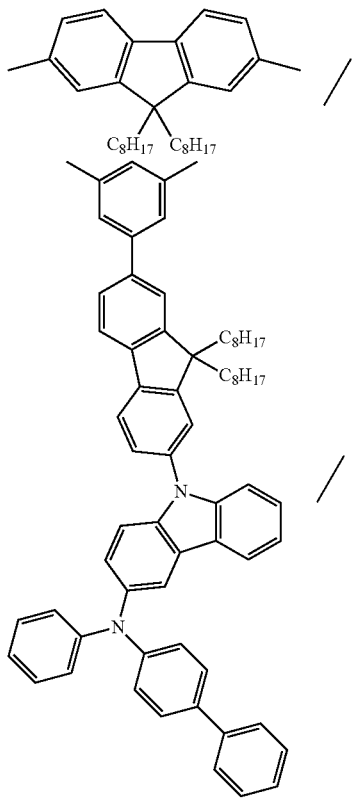

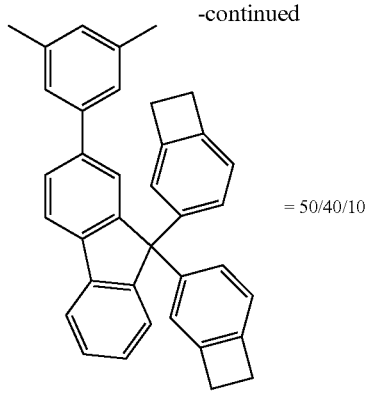

= 50/40/10

2.53 g of Compound 6, 3.30 g of Compound 7, 0.48 g of Compound 8, 4.3 mg of palladium acetate, 27.0 mg of tris(2-methoxyphenyl) phosphine, 55 mL of toluene, and 15.2 g of 20 wt % tetraethyl ammonium hydroxide aqueous solution were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through a chromatography column charged with silica/alumina, and the solvent in the obtained solution was distilled under reduced pressure to obtain 0.8 g of Polymer A-2.

From the addition ratio of the monomers, it was assumed that the ratio of the constituent unit derived from Compound 6:the constituent unit derived from Compound 7:the constituent unit derived from Compound 8 in Polymer A-2 was 50:40:10 (molar ratio) and the constituent units were alternately polymerized. Also, it was estimated by SEC that the number average molecular weight ($M_n$), the weight average molecular weight ($M_w$), and the molecular weight distribution ($M_w/M_n$) of Polymer A-2 were $M_n$=110,000, $M_w$=252,000, and $M_w/M_n$=2.30.

Synthesis Example 13: Synthesis of Polymer A-3

Polymer A-3 having the following constituent units was synthesized by using Compound 2, Compound 3, and Compound 4.

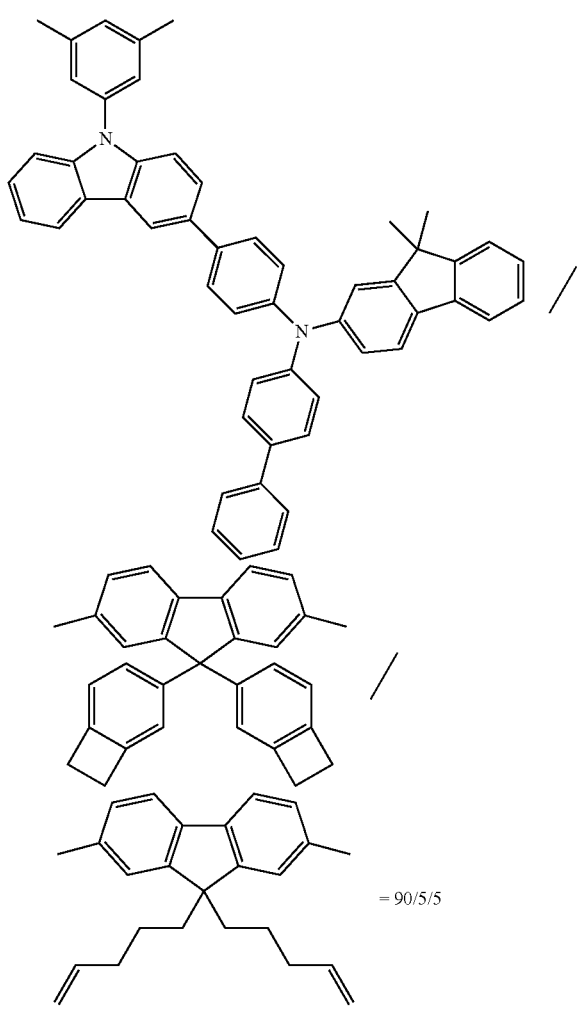

= 90/5/5

0.16 g of Compound 2, 0.19 g of Compound 3, 2.25 g of Compound 4, 3.21 g of Compound 5, 4.3 mg of palladium acetate, 27.0 mg of tris(2-methoxyphenyl) phosphine, 55 mL of toluene, and 15.2 g of 20 wt % tetraethyl ammonium hydroxide aqueous solution were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through column chromatography charged with silica/alumina, and the solvent in the obtained solution was distilled under reduced pressure to obtain 0.85 g of Polymer A-3.

From the addition ratio of the monomers, it was assumed that the ratio of the constituent unit derived from Compounds 4 and 5:the constituent unit derived from Compound 3:the constituent unit derived from Compound 4:the constituent unit derived from Compound 2 in Polymer A-3 was 90:5:5 (molar ratio) and the constituent units were alternately polymerized. Also, it was estimated by SEC that the number average molecular weight ($M_n$), the weight average molecular weight ($M_w$), and the molecular weight distribution ($M_w/M_n$) of Polymer A-3 were $M_n$=27,000, $M_w$=60,000, and $M_w/M_n$=2.23.

Synthesis Example 14: Synthesis of Polymer A-4

Polymer A-4 having the following constituent units was synthesized by using Compound 3, Compound 4, and Compound 5.

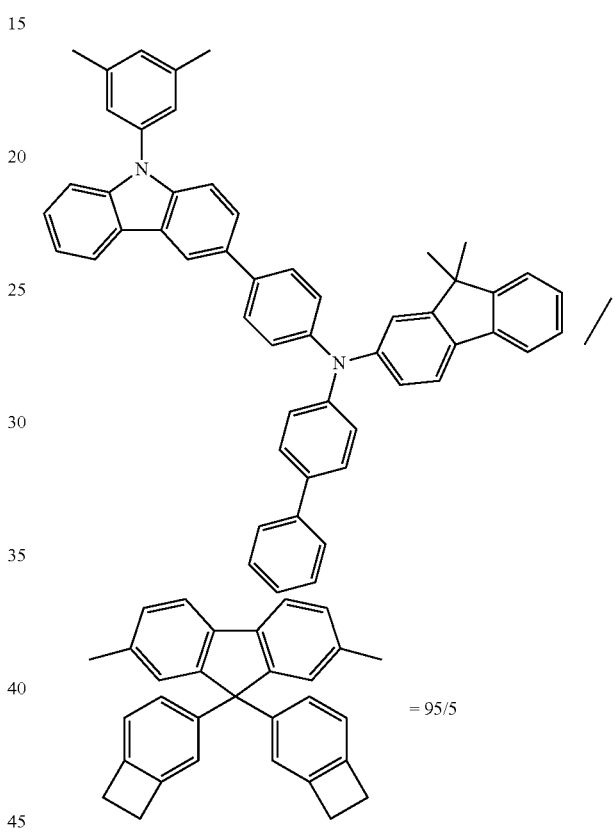

= 95/5

0.19 g of Compound 3, 2.64 g of Compound 4, 3.21 g of Compound 5, 4.3 mg of palladium acetate, 27.0 mg of tris(2-methoxyphenyl) phosphine, 55 mL of toluene, and 15.2 g of 20 wt % tetraethyl ammonium hydroxide aqueous solution were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through column chromatography charged with silica/alumina, and the solvent in the obtained solution was distilled under reduced pressure to obtain 0.85 g of Polymer A-4.

From the addition ratio of the monomers, it was assumed that the ratio of the constituent unit derived from Compounds 4 and 5:the constituent unit derived from Compound 3 in Polymer A-4 was 95:5 (molar ratio) and the constituent units were alternately polymerized. Also, it was estimated by SEC that the number average molecular weight ($M_n$), the weight average molecular weight ($M_w$), and the molecular weight distribution ($M_w/M_n$) of Polymer A-3 were $M_n$=25,000, $M_w$=59,000, and $M_w/M_n$=2.36.

Synthesis Example 15: Synthesis of Polymer A-5

Polymer A-5 having the following constituent units was synthesized by using Compound 1, Compound 2, Compound 3, and Compound 9.

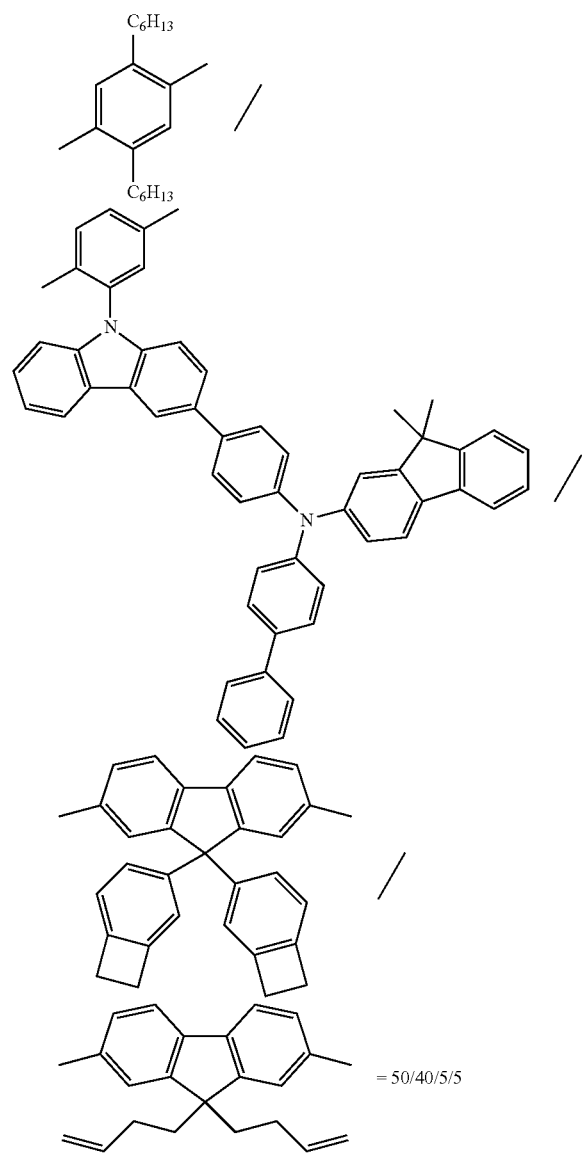

= 50/40/5/5

1.96 g of Compound 1, 0.184 g of Compound 2, 0.211 g of Compound 3, 2.576 g of Compound 9, 4.3 mg of palladium acetate, 27.0 mg of tris(2-methoxyphenyl) phosphine, 55 mL of toluene, and 15.2 g of 20 wt % tetraethyl ammonium hydroxide aqueous solution were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through column chromatography charged with silica/alumina, and the solvent in the obtained solution was distilled under reduced pressure to obtain 0.85 g of Polymer A-5.

From the addition ratio of the monomers, it was assumed that the ratio of the constituent unit derived from Compound 1:the constituent unit derived from Compound 9:the constituent unit derived from Compound 3:the constituent unit derived from Compound 2 in Polymer A-5 was 50:40:5:5 (molar ratio) and the constituent units were alternately polymerized. Also, it was estimated by SEC that the number average molecular weight ($M_n$), the weight average molecular weight ($M_w$), and the molecular weight distribution ($M_w/M_n$) of Polymer A-3 were $M_n$=62,000, $M_w$=138,200, and $M_w/M_n$=2.23.

Synthesis Example 16: Synthesis of Polymer A-6

Polymer A-6 having the following constituent units was synthesized by using Compound 6, Compound 10, and Compound 8.

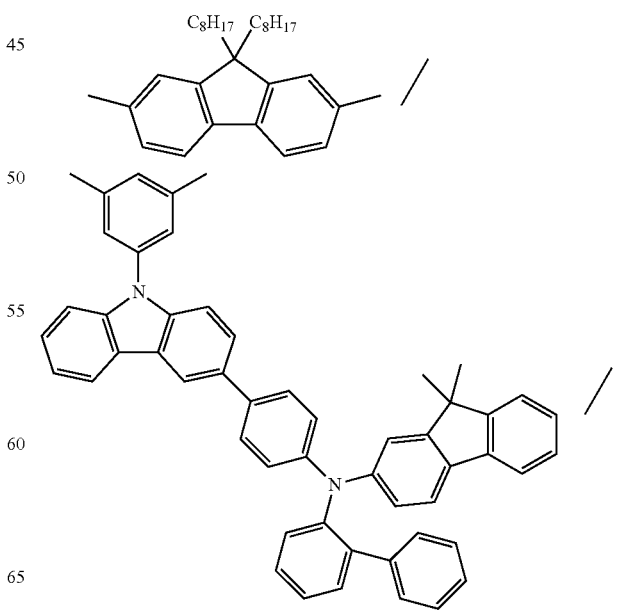

-continued

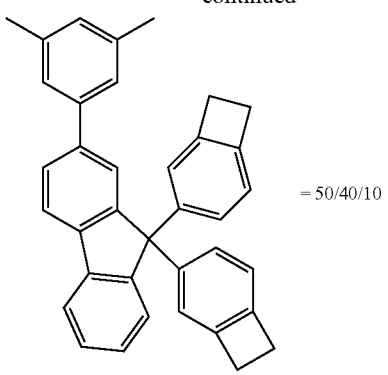

= 50/40/10

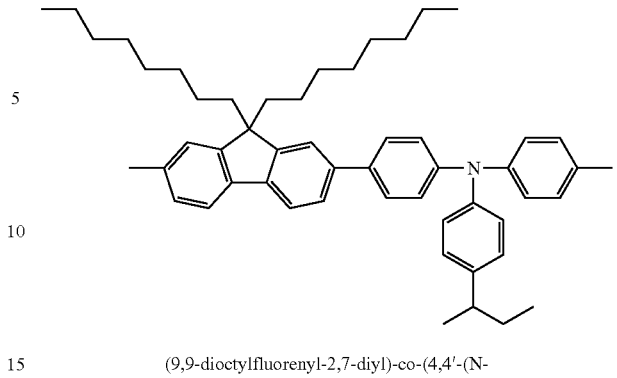

(9,9-dioctylfluorenyl-2,7-diyl)-co-(4,4'-(N-
(4-sec-butylphenyl)diphenylamine)](TFB)

2.53 g of Compound 6, 2.67 g of Compound 10, 0.48 g of Compound 8, 4.3 mg of palladium acetate, 27.0 mg of tris(2-methoxyphenyl) phosphine, 55 mL of toluene, and 15.2 g of 20 wt % tetraethyl ammonium hydroxide aqueous solution were added in an argon atmosphere, and the mixture was stirred for 8 hours under reflux. Then, 0.023 g of phenylboronic acid, 4.3 mg of palladium acetate, 27.0 mg of tris(2-methoxyphenyl)phosphine, and 15.2 g of 20 wt % tetraethyl ammonium hydroxide aqueous solution were added thereto, and the mixture was stirred for 7 hours under reflux. The aqueous layer was removed, 5.4 g of N,N-diethyldithiocarbamate sodium trihydrate and 50 mL of ion-exchange water were added thereto, and the mixture was stirred at a temperature of 85° C. for 2 hours. After the organic layer was separated, the organic layer was sequentially washed with water, 3 wt % of acetic acid aqueous solution, and water again. The organic layer was added dropwise to methanol, and a solid was precipitated, filtered, and dried to obtain a product. The product was dissolved in toluene and passed through column chromatography charged with silica/alumina, and the solvent in the obtained solution was distilled under reduced pressure to obtain 1.0 g of Polymer A-6.

From the addition ratio of the monomers, it was assumed that the ratio of the constituent unit derived from Compound 6:the constituent unit derived from Compound 10:the constituent unit derived from Compound 8 in Polymer A-6 was 50:40:10 (molar ratio) and the constituent units were alternately polymerized. Also, it was estimated by SEC that the number average molecular weight ($M_n$), the weight average molecular weight ($M_w$), and the molecular weight distribution ($M_w/M_n$) of Polymer A-3 were $M_n$=140,000, $M_w$=352,200, and $M_w/M_n$=2.51.

Evaluation Example 1: Measurement of Triplet Energy Level

The triplet energy level (electron volts, eV) of the polymer TFB (manufactured by Luminescence Technology Corp.) including Polymers A-1, A-2, and A-3 prepared according to Synthesis Examples 9 to 11 and the following constituent units was measured according to the following method.

A coating solution was prepared by dissolving each polymer in toluene such that the concentration thereof was 3.2 wt %. The coating solution was spin-coated at a rotating speed of 1,600 revolutions per minute (rpm) and dried at a temperature of 250° C. for 60 minutes to obtain a thin film sample having a thickness of about 70 nanometers (nm) (thickness after drying). The thin film sample was cooled to 77 Kelvins (K) (−196° C.) and a photoluminescence (PL) spectrum was measured. The triplet energy level (eV) was calculated from the peak value of the shortest wave side of the PL spectrum, and results thereof are shown in Table 1.

TABLE 1

| Polymer | $M_n$ (×10$^4$) | $M_w$ (×10$^4$) | Triplet energy level (eV) |
|---------|------|------|------|
| A-1 | 4.2 | 8.0 | 2.51 |
| A-2 | 11.0 | 25.2 | 2.39 |
| A-3 | 2.7 | 6.0 | 2.51 |
| TFB | 8.6 | 18.3 | 2.30 |

From Table 1, it is confirmed that the polymer according to the embodiment has a high triplet energy level in TFB.

Example 1

As an anode, a hole injection layer was formed on an ITO glass substrate, on which stripe-shaped indium tin oxide (ITO) was deposited to a film thickness of 150 nm, by spin coating, such that poly(3,4-ethylene dioxythiophene)/poly (4-styrenesulfonate (PEDOT/PSS) (product of Sigma-Aldrich) had a dry film thickness of 30 nm.

Then, a solution (concentration of 1 wt %) in which Polymer A-1 was dissolved in xylene was applied on the hole injection layer by spin coating, so that a thickness after drying was 30 nm, and heat treatment was performed thereon at a temperature of 230° C. for 1 hour to form a hole transport layer.

Then, a toluene solution (a concentration of Compound h-1 was 0.49 grams per milliliter (g/ml), and a concentration of Compound h-2 was 0.05 g/ml) including Compound h-1 (6,9-diphenyl-9'-(5'-phenyl-[1,1':3',1''-terphenyl]-3-yl)3,3'-bi[9H-carbazole) (first host), Compound h-2 (3,9-diphenyl-5-(3-(4-phenyl-6-(5'-phenyl-[1,1':3',1''-terphenyl]-3-yl)-1,3,5-triazine-2-yl)phenyl)-9H-carbazole) (second host), and tris(2-(3-p-xylyl)phenyl)pyridine iridium(III) (dopant) was applied on the hole transport layer by spin coating, so that a dry film thickness was 30 nm, thereby forming an emission layer. At this time, the dopant was 10 wt % based on the total weight of the emission layer.

Then, the substrate in which the emission layer was formed was provided to a vacuum deposition apparatus, and Compound X was deposited to form a hole blocking layer having a thickness of 10 nm.

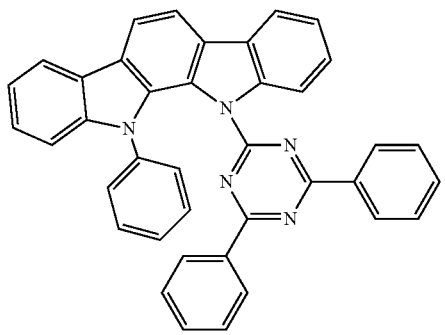

X

Then, LiQ and KLET-03 (product of Chemipro Kasei) were co-deposited on the hole blocking layer to form an electron transport layer having a thickness of 50 nm.

Then, an electron injection material (LiF) was deposited to a thickness of 1 nm.

Then, aluminum was deposited on the electron injection layer to form a cathode having a thickness of 100 nm, thereby completing the manufacture of an organic light-emitting device.

Example 2

An organic light-emitting device was manufactured in the same manner as in Example 1, except that Polymer A-2 was used instead of Polymer A-1 in forming a hole transport layer.

Example 3

An organic light-emitting device was manufactured in the same manner as in Example 1, except that Polymer A-3 was used instead of Polymer A-1 in forming a hole transport layer.

Example 4

An organic light-emitting device was manufactured in the same manner as in Example 1, except that a thickness of an anode was modified to 100 nm, and Polymer A-3 was used instead of Polymer A-1 in forming a hole transport layer.

Example 5

An organic light-emitting device was manufactured in the same manner as in Example 1, except that Polymer A-4 was used instead of Polymer A-1 in forming a hole transport layer.

Comparative Example 1

An organic light-emitting device was manufactured in the same manner as in Example 1, except that TFB (manufactured by Luminescence Technology Corp.) was used instead of Polymer A-1 in forming a hole transport layer.

Evaluation Example 2

The driving voltage, current efficiency, and luminescent efficiency of the organic light-emitting devices of Examples 1 to 4 and Comparative Example 1 were evaluated according to the following method, and results thereof are shown in Table 2.

A DC constant voltage source (source meter, manufactured by KEYENCE) was used to apply a predetermined voltage to the respective organic light-emitting devices so as to make the organic light-emitting devices to emit light. While the light emission of the organic light-emitting device was measured by using a luminance measurement apparatus (SR-3, manufactured by Topcom), a current applied to the organic light-emitting device was gradually increased. A current at which luminance reached 6,000 candelas per square meter ($cd/m^2$) was constantly maintained. The voltage at that time was set as a "driving voltage (V)".

A current density that was a current value per unit area of the organic light-emitting device was calculated, and current efficiency (candelas per ampere, cd/A) was calculated by dividing luminance ($cd/m^2$) by the current density (amperes per square meter, $A/m^2$).

The emission lifespan ($LT_{95}$) (hr) indicates an amount of time that lapsed when luminance measured by the measurement apparatus was reduced to 95% of initial luminance (100%).

Also, the current efficiency indicates efficiency (conversion efficiency) of converting a current into luminescence energy. As the current efficiency is higher, the organic light-emitting device has higher performance.

TABLE 2

| | Material for hole transport layer | Driving voltage (V) | Current efficiency (cd/A) | Emission lifespan (time) |
|---|---|---|---|---|
| Example 1 | Polymer A-1 | 5.2 | 67 | 190 |
| Example 2 | Polymer A-2 | 5.9 | 61 | 80 |
| Example 3 | Polymer A-3 | 4.5 | 69 | 410 |
| Example 4 | Polymer A-3 | 5.1 | 91 | 440 |
| Example 5 | Polymer A-4 | 4.4 | 70 | 350 |
| Comparative Example 1 | TFB | 6.4 | 20 | 10 |

Referring to Table 2, it is confirmed that the organic light-emitting devices of Examples 1 to 4 have a low driving voltage, high current efficiency, and a long emission lifespan, as compared with the organic light-emitting device of Comparative Example 1.

Example 5

First, as a first electrode (anode), a glass substrate on which ITO was patterned was sequentially washed with neutral detergent, deionized water, and isopropyl alcohol, and UV-ozone-treated. PEDOT/PSS (manufactured by Sigma-Aldrich) was applied on the glass substrate by spin coating, so that a dry film thickness was 30 nm, thereby forming a hole injection layer.

Then, a solution (concentration of 1 wt %) in which Polymer A-1 was dissolved in toluene was applied on the hole injection layer by spin coating, so that a dry film thickness was 25 nm, and heated at a temperature of 150° C. for 30 minutes, thereby forming a hole transport layer.

Figure 2:
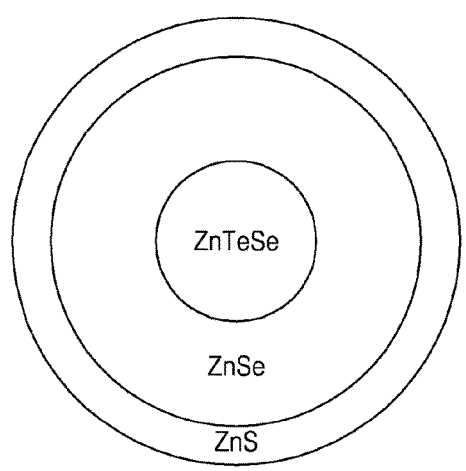
FIG. 2 is a cross-sectional view illustrating a structure of a blue quantum dot of Example 7.
Figure 3:
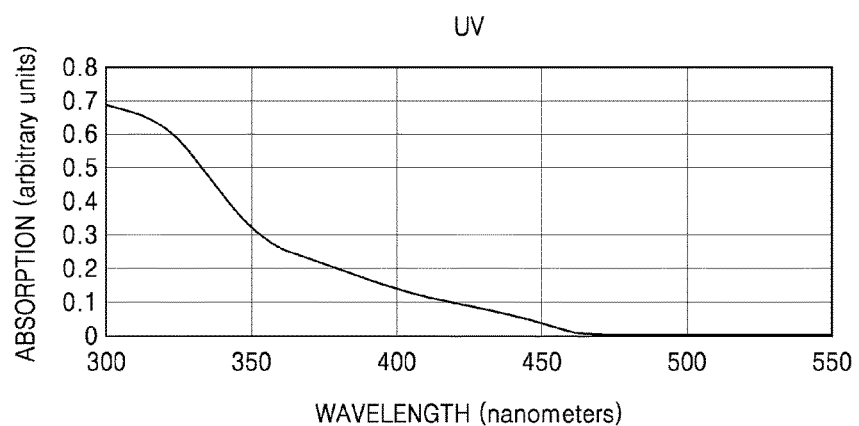
FIG. 3 is an ultraviolet (UV) absorption spectrum of the blue quantum dot of Example 7.
Figure 4:
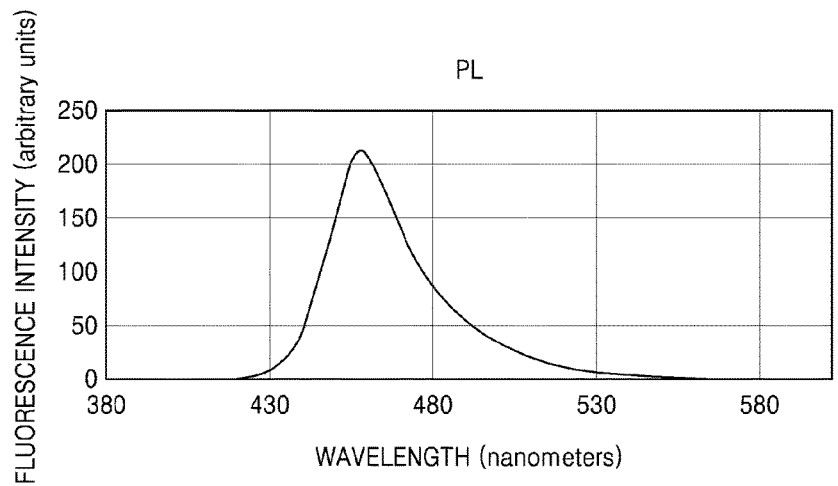
FIG. 4 is a fluorescent spectrum of the blue quantum dot of Example 7.

Then, a dispersion liquid in which a blue quantum dot (see FIG. 2) of ZnTeSe/ZnSe/ZnS (core/shell/shell) was dispersed in hexane at a concentration of 1.0 wt % in a cycle of not dissolving the hole transport layer was applied on the hole transport layer by spin coating, so that a dry film thickness was 25 nm, and then dried to form a quantum-dot emission layer. Also, the blue quantum dot has an emission wavelength center of 458 nm in the dispersion liquid and a full width at half maximum of 29 nm (see FIGS. 3 and 4).

The quantum-dot emission layer was completely dried, and lithium quinolate (LiQ) and an electron transport material TPBI (manufactured by Sigma-Aldrich) was co-deposited on the quantum-dot emission layer by using a vacuum deposition apparatus to form an electron transport layer having a thickness of 36 nm.

LiQ was deposited on the electron transport layer by using a vacuum deposition apparatus to form an electron injection layer having a thickness of 0.5 nm.

Aluminum was deposited on the electron injection layer by using a vacuum deposition apparatus to form a second electrode (cathode) having a thickness of 100 nm, thereby obtaining a quantum-dot light-emitting device.

Example 6

A quantum-dot light-emitting device was manufactured in the same manner as in Example 5, except that Polymer A-5 was used instead of Polymer A-1.

Comparative Example 2

A quantum-dot light-emitting device was manufactured in the same manner as in Example 5, except that TFB was used instead of Polymer A-1.

Evaluation Example 2

The driving voltage, luminescent efficiency (EQE), color purity, and emission wavelength of the quantum-dot light-emitting devices of Examples 5 to 6 and Comparative Example 2 were evaluated by the following method, and results thereof are shown in Table 3.

A DC constant voltage source (source meter, manufactured by KEYENCE) was used to apply a predetermined voltage to the respective organic light-emitting devices so as to make the organic light-emitting devices to emit light. The voltage at the current density of 10 milliamperes per square centimeter (mA/cm$^2$) was set as a "driving voltage (volts, V)".

While the light emission of the organic light-emitting device was measured by using a luminance measurement apparatus (SR-3, manufactured by Topcom), a current applied to the organic light-emitting device was gradually increased. A current at which luminance reached 1,000 cd/m$^2$ was constantly maintained and left alone.

The color purity was measured by using a luminance measurement apparatus.

TABLE 3

| | Material for hole transport layer | Driving voltage@ 10 mA/cm$^2$ (V) | EQE@ 100 nit | Color purity | Emission wavelength |
|---|---|---|---|---|---|
| Example 5 | Polymer A-1 | 4.88 | 3.54% | X = 0.146 Y = 0.056 | 454 nm |
| Example 6 | Polymer A-5 | 4.78 | 3.72% | X = 0.148 Y = 0.058 | 454 nm |
| Comparative Example 2 | TFB | 5.03 | 3.16% | X = 0.148 Y = 0.058 | 454 nm |

Referring to Table 3, it is confirmed that the polymer compound according to one or more embodiments is applicable to a quantum-dot light-emitting device, for instance, the quantum-dot light-emitting devices of Examples 5 to 6 have a low driving voltage and high luminescent efficiency (EQEfmf), as compared with those of the quantum-dot light-emitting device of Comparative Example 2.

The polymer may have a high minimum excitation triplet energy level and have characteristics suitable for use in solution coating. Also, the light-emitting device including the polymer may provide a driving voltage, high current efficiency, and a long lifespan. Furthermore, the use of the polymer may provide a larger-area light emitting device and may increase productivity.

It should be understood that embodiments described herein should be considered in a descriptive sense only and not for purposes of limitation. Descriptions of features or aspects within each embodiment should typically be considered as available for other similar features or aspects in other embodiments of the present disclosure.

While one or more embodiments have been described with reference to the figures, it will be understood by those of ordinary skill in the art that various changes in form and details may be made therein without departing from the spirit and scope of the present disclosure as defined by the following claims.

What is claimed is:
1. A polymer comprising a first repeating unit represented by Formula 1 and a second repeating unit represented by Formula 2:

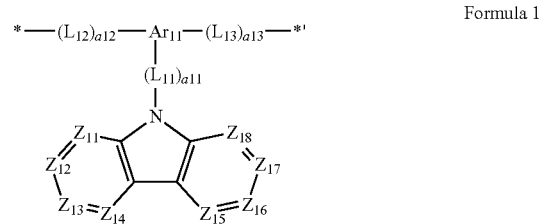

Formula 1

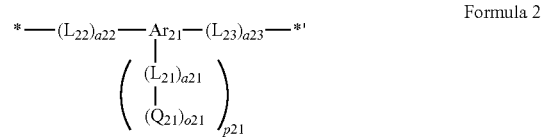

Formula 2

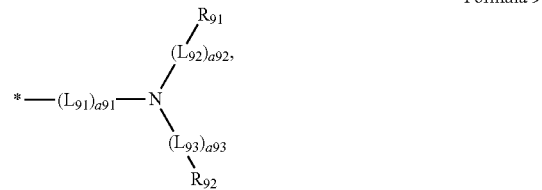

Formula 9 wherein, in Formulae 1, 2, and 9,
$Z_{11}$ is selected from N and C($R_{11}$), $Z_{12}$ is selected from N and C($R_{12}$), $Z_{13}$ is selected from N and C($R_{13}$), $Z_{14}$ is selected from N and C($R_{14}$), $Z_{15}$ is selected from N and C($R_{15}$), $Z_{16}$ is selected from N and C($R_{16}$), $Z_{17}$ is selected from N and C($R_{17}$), and $Z_{18}$ is selected from N and C($R_{18}$), $Ar_{11}$ and $Ar_{21}$ are each independently selected from a substituted or unsubstituted $C_5$-$C_{30}$ carbocyclic group and a substituted or unsubstituted $C_1$-$C_{30}$ heterocyclic group, $L_{11}$ to $L_{13}$, $L_{21}$ to $L_{23}$, and $L_{91}$ to $L_{93}$ are each independently selected from a single bond, a substituted or unsubstituted $C_1$-$C_{24}$ alkylene group, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, and a substituted or unsubstituted divalent non-aromatic condensed heteropolycyclic group, a11 to a13, a21 to a23, and a91 to a93 are each independently selected from 0, 1, 2, and 3, $R_{11}$ to $R_{18}$ are each independently selected from a group represented by Formula 9, hydrogen, a substituted or unsubstituted $C_1$-$C_{24}$ alkyl group, a substituted or unsubstituted $C_1$-$C_{24}$ alkoxy group, a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group, wherein at least one of $R_{11}$ to $R_{18}$ is a group represented by Formula 9, and two neighboring groups selected from $R_{11}$ to $R_{18}$ are optionally linked to form a ring, $R_{91}$ and $R_{92}$ are each independently selected from a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, and a substituted or unsubstituted monovalent non-aromatic condensed heteropolycyclic group, $Q_{21}$ is a crosslinking group, o21 is an integer greater than or equal to 1, p21 is an integer greater than or equal to 1, and

* and *' each indicate a binding site to a neighboring atom.

2. The polymer of claim 1, wherein $Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is $C(R_{18})$, $Z_{11}$ is N, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is $C(R_{18})$;

$Z_{11}$ is $C(R_{11})$, $Z_{12}$ is N, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is $C(R_{18})$;

$Z_{11}$ is $C(R_{11})$, $Z_{12}$ is $C(R_{12})$, $Z_{13}$ is N, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is $C(R_{18})$;

$Z_{11}$ is $C(R_{11})$, $Z_{12}$ is $C(R_{12})$, $Z_{13}$ is $C(R_{13})$, $Z_{14}$ is N, $Z_{15}$ is $C(R_{15})$, $Z_{16}$ is $C(R_{16})$, $Z_{17}$ is $C(R_{17})$, and $Z_{18}$ is $C(R_{18})$;

$Z_{11}$ is $C(R_{11})$, $Z_{12}$ is $C(R_{12})$, $Z_{13}$ is $C(R_{13})$, $Z_{14}$ is $C(R_{14})$, $Z_{15}$ is N, $Z_{16}$ is $C(R_{16})$, $Z_{17}$ is $C(R_{17})$, and $Z_{18}$ is $C(R_{18})$;

$Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is N, $Z_{17}$ is $C(R_{17})$, and $Z_{18}$ is $C(R_{18})$;

$Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is N, and $Z_{18}$ is $C(R_{18})$; or $Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is N.

3. The polymer of claim 1, wherein $Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, and $Z_{18}$ is $C(R_{18})$, and $R_{16}$ is a group represented by Formula 9.

4. The polymer of claim 1, wherein $Ar_{11}$ and $Ar_{21}$ are each independently selected from:

a benzene group, a pentalene group, an indene group, a naphthalene group, an anthracene group, an azulene group, a heptacene group, an acenaphthalene group, a phenalene group, a fluorene group, an antraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group;

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO ($Q_{21}$), —$O_2C(Q_{21})$, —$CO_2(Q_{21})$, —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ are each independently selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group.

5. The polymer of claim 1, wherein
$Ar_{11}$ is selected from Formulae 4-1 to 4-11, and
$Ar_{21}$ is selected from Formulae 4-12 and 4-13:

4-1
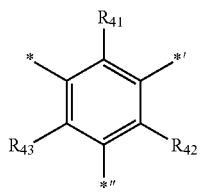

4-2
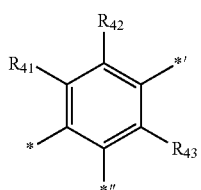

4-3
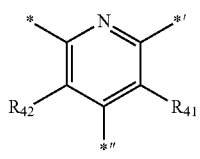

4-4
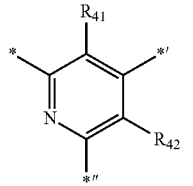

4-5
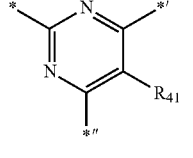

4-6
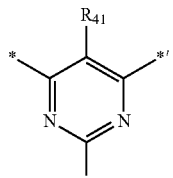

4-7
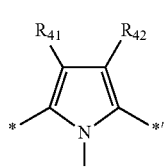

4-8
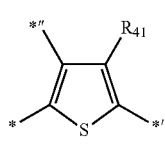

4-9
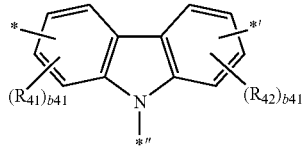

4-10
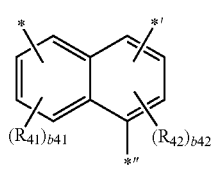

4-11
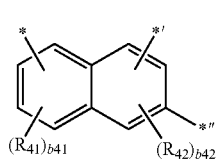

4-12
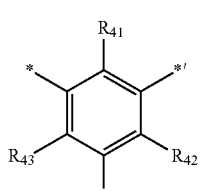

4-13
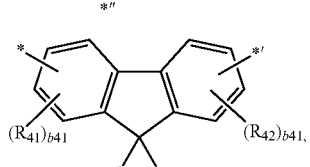

wherein, in Formulae 4-1 to 4-11,
$R_{41}$ to $R_{43}$ are each independently selected from hydrogen, a methyl group, an ethyl group, an n-propyl group, and an iso-propyl group,
b41 is selected from 1, 2, and 3,
b42 is 1 or 2,
* and *' each indicate a binding site to an atom constituting a main chain of Formula 1, and
*" indicates a binding site to an atom constituting a side chain of Formula 1, wherein, in Formulae 4-12 and 4-13, $R_{41}$ to $R_{43}$ are each independently selected from hydrogen, a methyl group, an ethyl group, an n-propyl group, and an iso-propyl group, b41 is selected from 1, 2, and 3, b42 is 1 or 2,

* and *' each indicate a binding site to an atom constituting a main chain of Formula 2, and

*'' indicates a binding site to an atom constituting a side chain of Formula 2.

6. The polymer of claim 1, wherein $L_{11}$ to $L_{13}$, $L_{21}$ to $L_{23}$, and $L_{91}$ to $L_{93}$ are each independently selected from:

a single bond, a methylene group, an ethylene group, a trimethylene group, a propylene group, a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group;

a methylene group, an ethylene group, a trimethylene group, a propylene group, a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a methylene group, an ethylene group, a trimethylene group, a propylene group, a tetramethylene group, a pentamethylene group, a phenylene group, a biphenylene group, a terphenylene group, a pentalenylene group, an indenylene group, a naphthylene group, an anthracenylene group, an azulenylene group, a heptacenylene group, an acenaphthylene group, a phenalenylene group, a fluorenylene group, an antraquinolinylene group, a naphthacenylene group, a phenanthrenylene group, a triphenylenylene group, a pyrenylene group, a chrysenylene group, a picenylene group, a perylenylene group, a pentaphenylene group, a pentacenylene group, a tetraphenylene group, a hexaphenylene group, a hexacenylene group, a rubicenylene group, a trinaphthylene group, a heptaphenylene group, a pyranthrenylene group, a pyrrolylene group, a pyrazolylene group, an imidazolylene group, an oxazolylene group, a thiazolylene group, a triazolylene group, a tetrazolylene group, an oxadiazolylene group, a pyridinylene group, a pyridazinylene group, a pyrimidinylene group, a triazinylene group, a carbazolylene group, an indolylene group, a quinolinylene group, an isoquinolinylene group, a benzimidazolylene group, an imidazopyridinylene group, and an imidazopyrimidinylene group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ are each independently selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group.

7. The polymer of claim 1, wherein $R_{11}$ to $R_{18}$ are each independently selected from:

a group represented by Formula 9, hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-eicosyloxy group, a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-haptadecyloxy group, an n-octadecyloxy group, and an n-eicosyloxy group.

8. The polymer of claim 1, wherein
$R_{91}$ and $R_{92}$ are each independently selected from:
a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group; and a phenyl group, a biphenyl group, a terphenyl group, a pentalenyl group, an indenyl group, a naphthyl group, an anthryl group, an azulenyl group, a heptacenyl group, an acenaphthyl group, a phenalenyl group, a fluorenyl group, an antraquinol group, a naphthacenyl group, a phenanthrenyl group, a triphenyl group, a pyrenyl group, a chrysenyl group, a picenyl group, a phenylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyrrolyl group, a pyrazolyl group, an imidazolyl group, an oxazolyl group, a thiazolyl group, a thiazolyl group, a tetrazolyl group, an oxadiazolyl group, a pyridyl group, a bipyridyl group, a pyridazinyl group, a pyrazinyl group, a pyrimidinyl group, a triazinyl group, a carbazolyl group, an indolyl group, a furyl group, a benzofuranyl group, a dibenzofuranyl group, a quinolinyl group, an isoquinolinyl group, a quinoxanyl group, a benzimidazolyl group, an imidazopyridyl group, an imidazopyrimidyl group, a carbazolyl group, a phenanthridinyl group, an acridinyl group, a phenazinyl group, a phenothiazinyl group, a phenothiazinyl group, an oxazolyl group, an oxadiazolyl group, a furazanyl group, a thienyl group, a thiophenyl group, an iso-thiophenyl group, and a dibenzothiophenyl group, each substituted with at least one selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, a methoxy group, an ethoxy group, a propoxy group, an iso-propoxy group, an n-butoxy group, an isobutoxy group, a sec-butoxy group, a tert-butoxy group, an n-pentoxy group, an iso-pentoxy group, a tert-pentoxy group, a neopentoxy group, a 1,2-dimethylpropoxy group, an n-hexyloxy group, an isohexyloxy group, a 1,3-dimethylbutoxy group, a 1-isopropylpropyloxy group, a 1,2-dimethylbutoxy group, an n-heptyloxy group, a 1,4-dimethylpentyloxy group, a 3-ethylpentyloxy group, a 2-methyl-1-isopropylpropoxy group, an 1-ethyl-3-methylbutoxy group, an n-octyloxy group, a 2-ethylhepxyloxy group, a 3-methyl-1-isopropylbutoxy group, a 2-methyl-1-iso-propoxy group, a 1-tert-butyl-2-methylpropoxy group, an n-nonyloxy group, a 3,5,5-trimethyldecyloxy group, an n-decyloxy group, an isodecyl group, an n-undecyloxy group, an n-dodecyloxy group, an n-tridecyloxy group, an n-tetradecyloxy group, an n-pentadecyloxy group, an n-hexadecyloxy group, an n-haptadecyloxy group, an n-octadecyloxy group, and an n-eicosyloxy group.

9. The polymer of claim 1, wherein $Q_{21}$ is represented by one of Formulae 6-1 to 6-9:

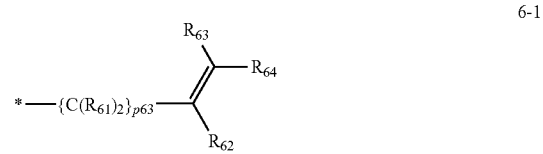

6-1

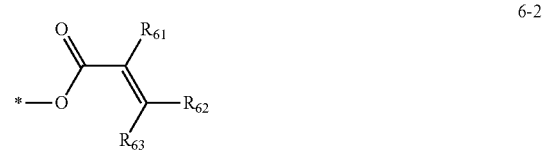

6-2

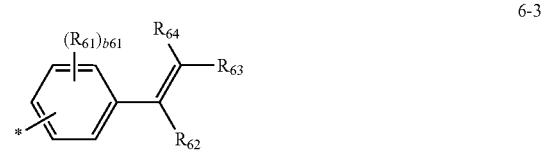

6-3

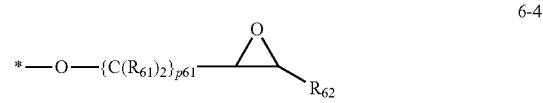

6-4

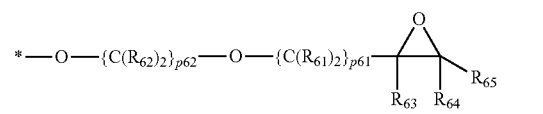

6-5

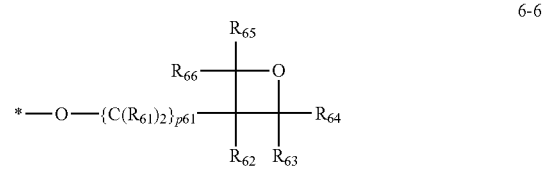

6-6

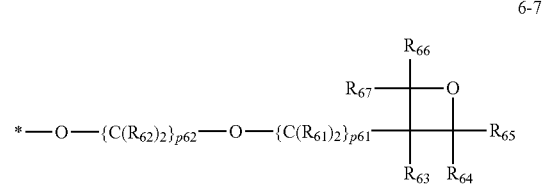

6-7

-continued

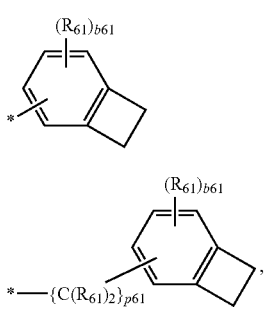

wherein, in Formulae 6-1 to 6-9,
$R_{61}$ to $R_{68}$ are each independently selected from hydrogen, a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, and an iso-decyl group,
p61 and p62 are each independently selected from 1, 2, 3, and 4,
p63 is selected from 0, 1, 2, and 3,
b61 is selected from 1, 2, 3, and 4,
b62 is selected from 1, 2, and 3, and
* indicates a binding site to a neighboring atom.
10. The polymer of claim 1, wherein
the first repeating unit represented by Formula 1 is selected from Formulae 1-1 to 1-42:

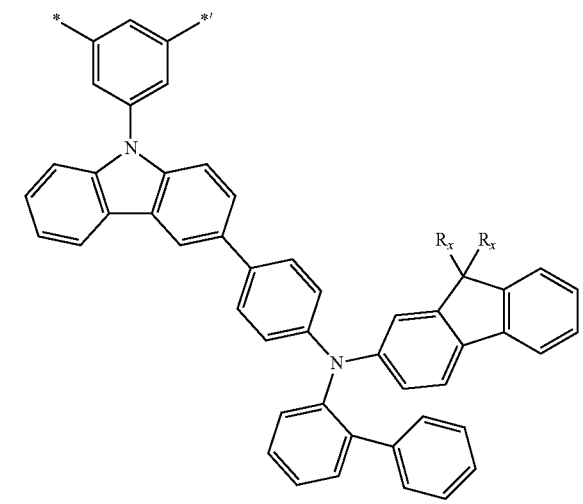

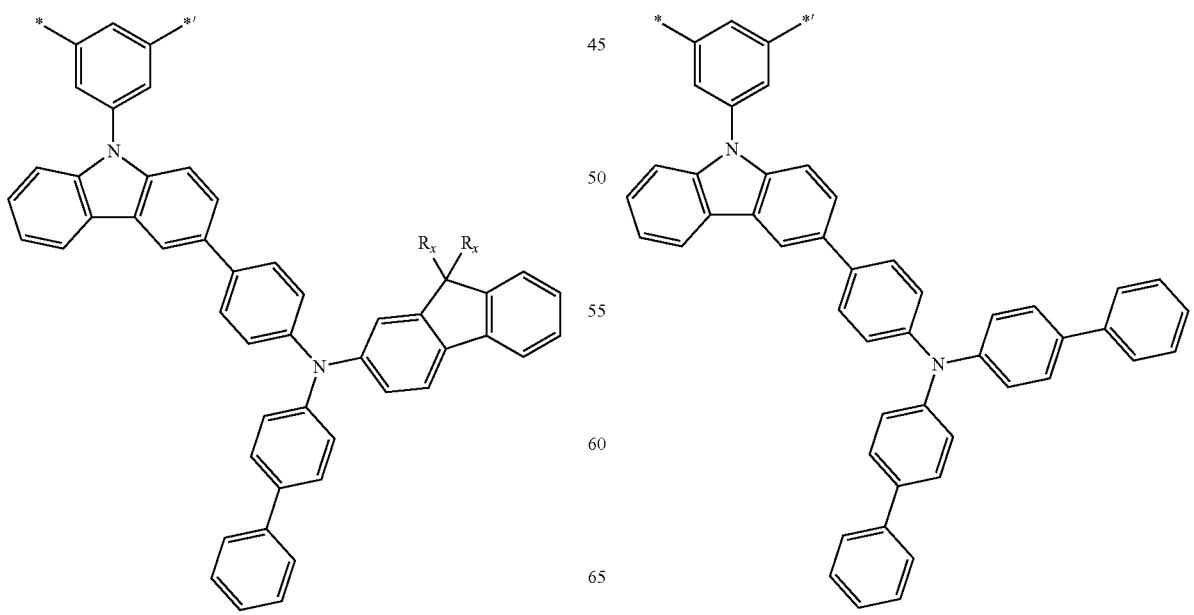

1-4
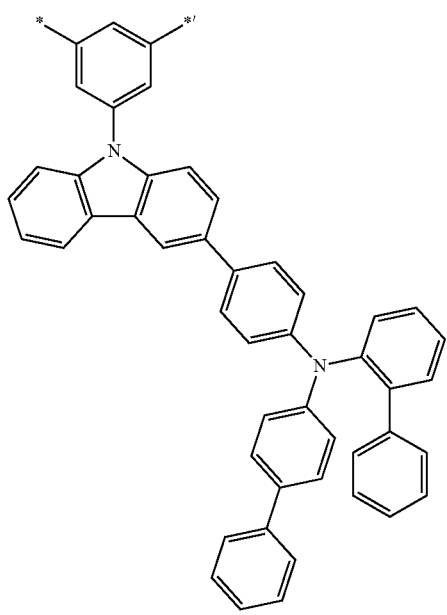
1-6
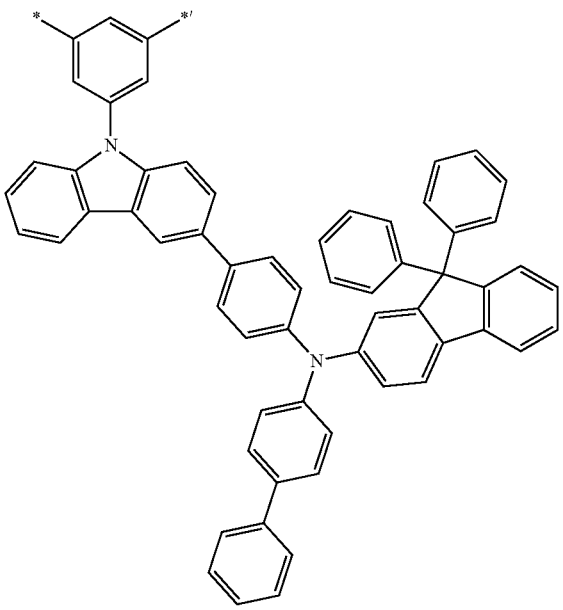
1-5
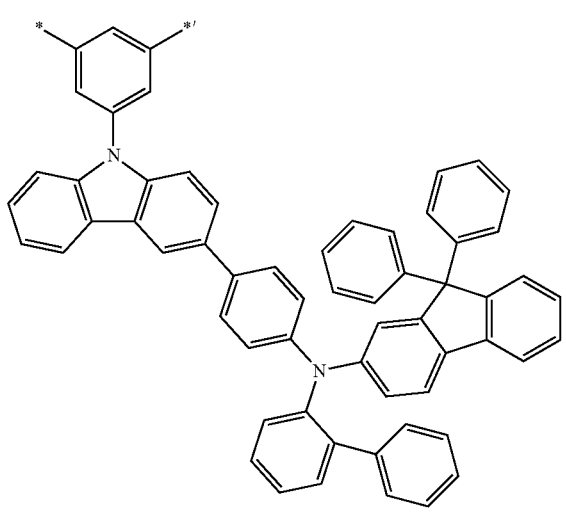
1-7

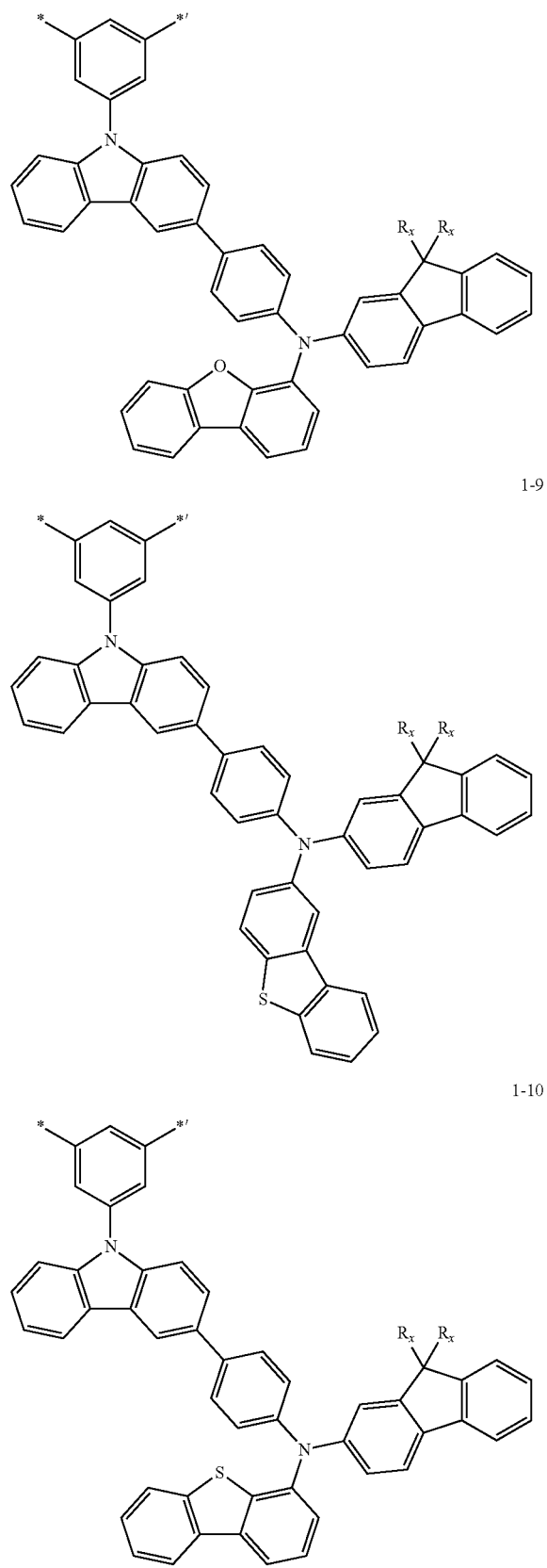
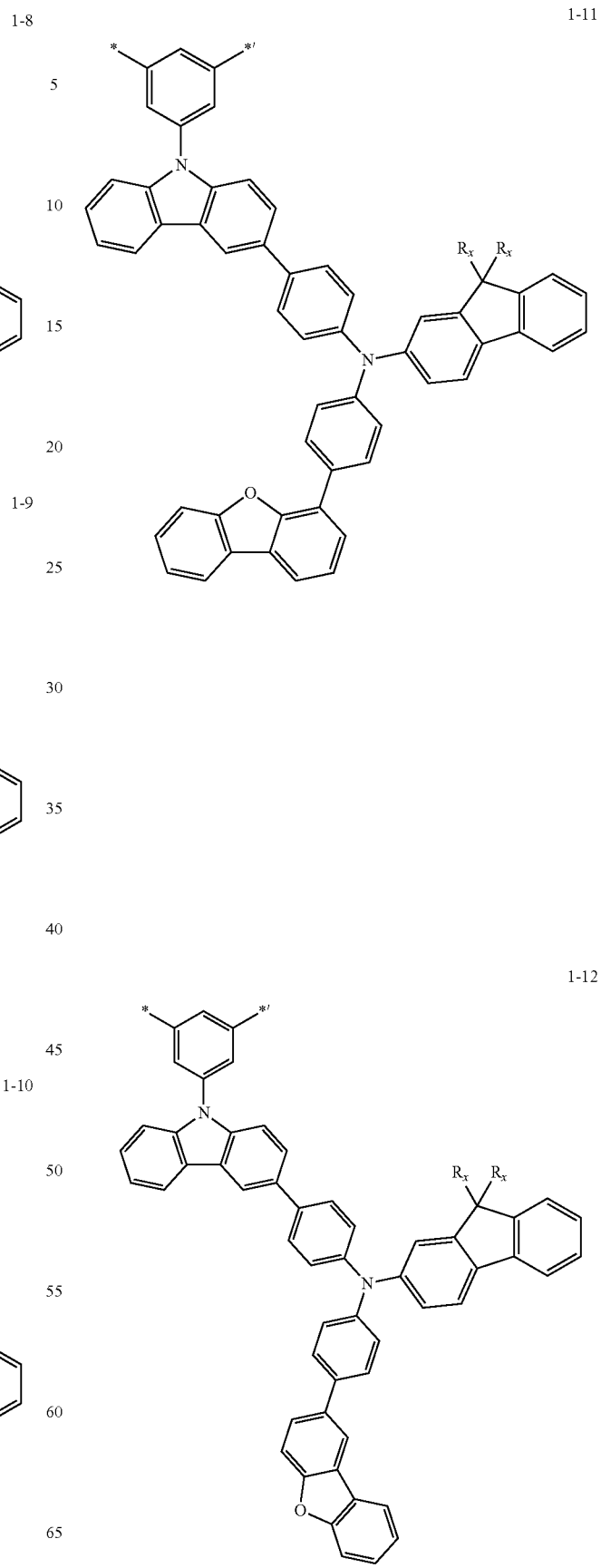

1-13
1-14
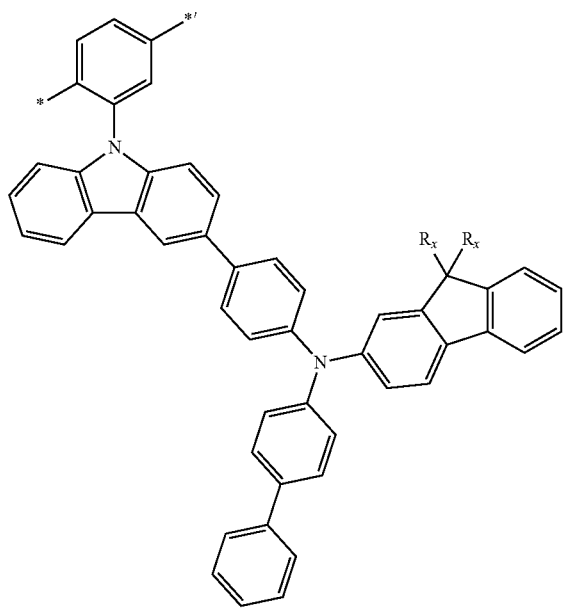
1-15
1-16
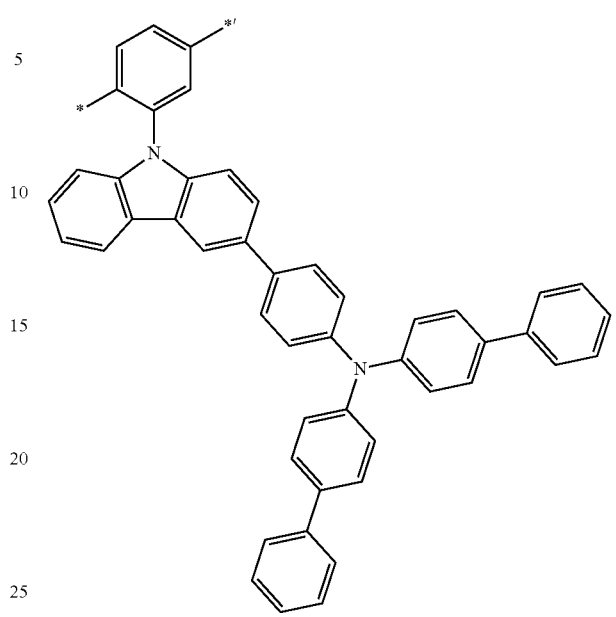

1-17
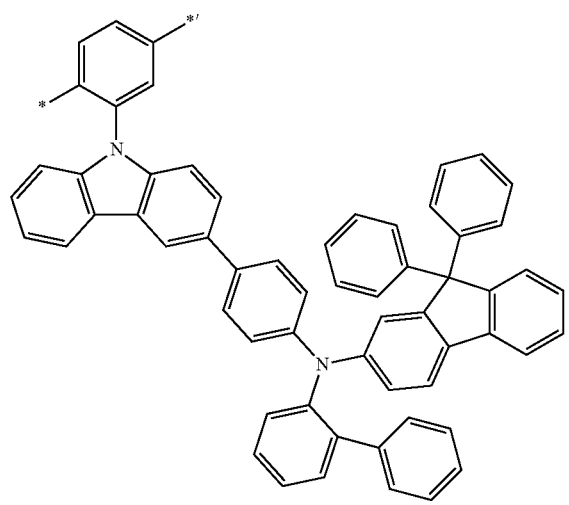
1-18
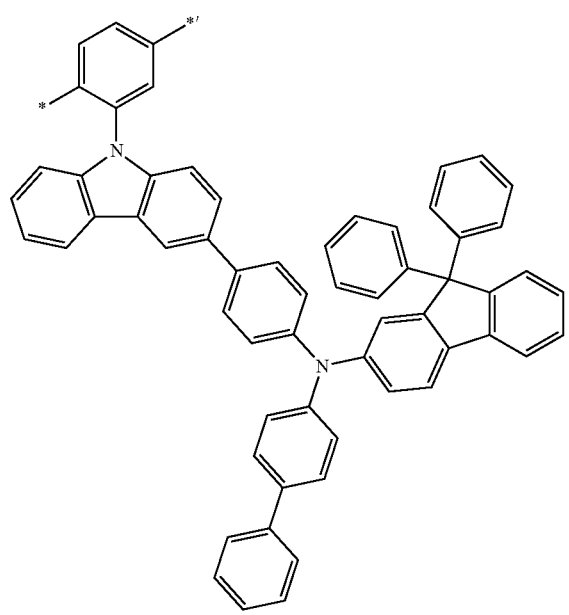
1-19
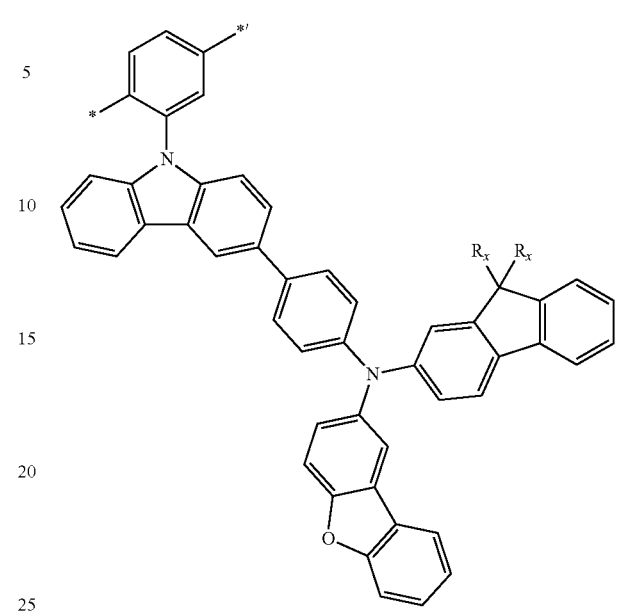
1-20
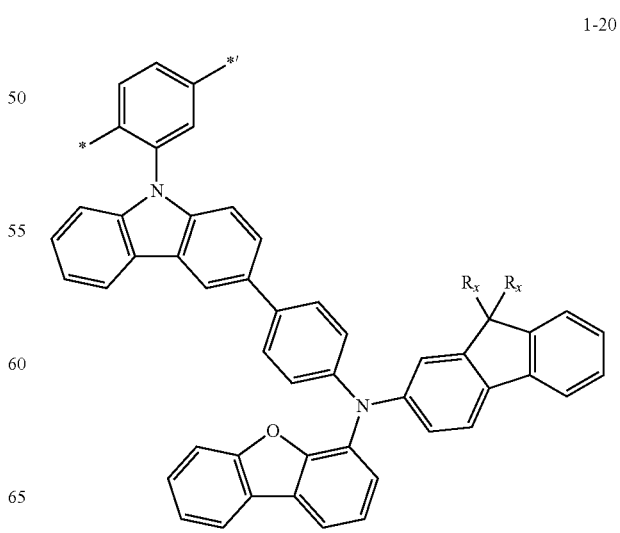

1-21
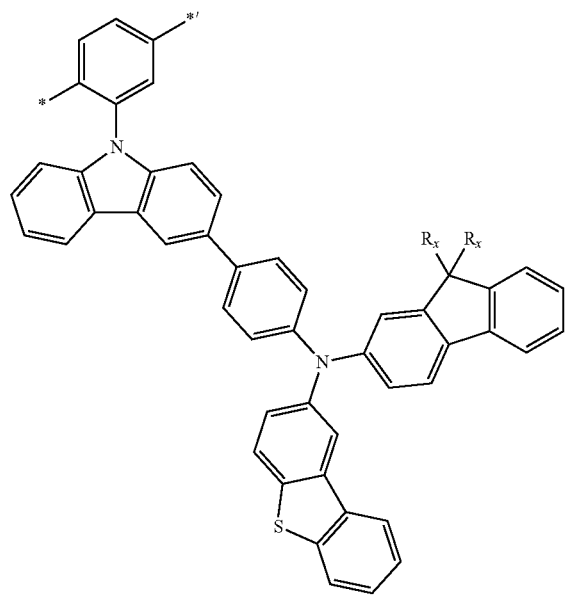
1-23
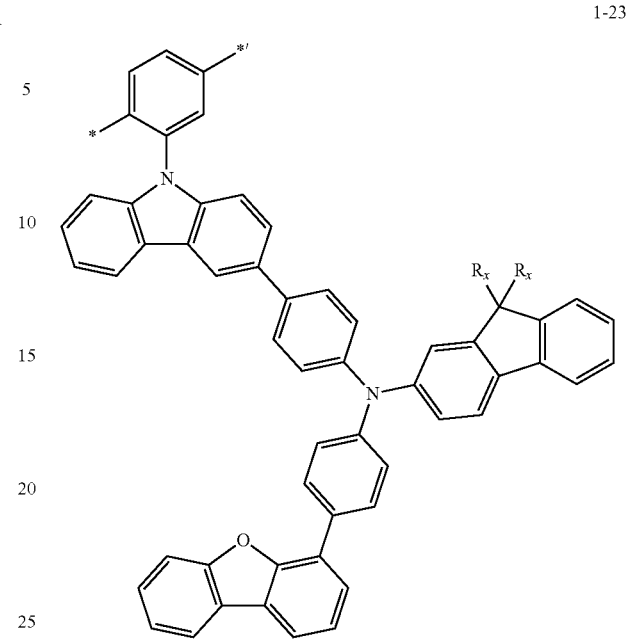
1-22
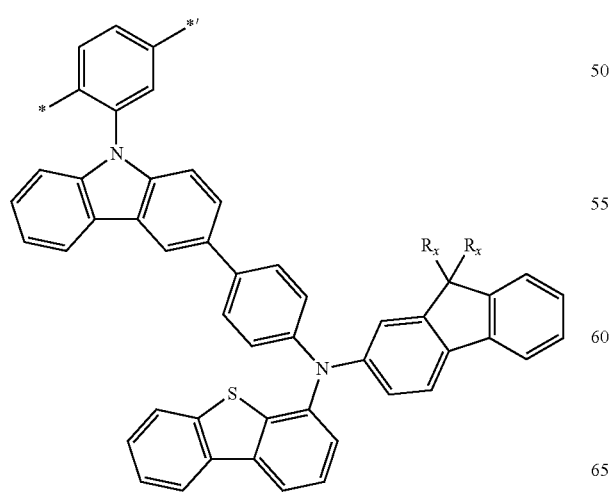
1-24
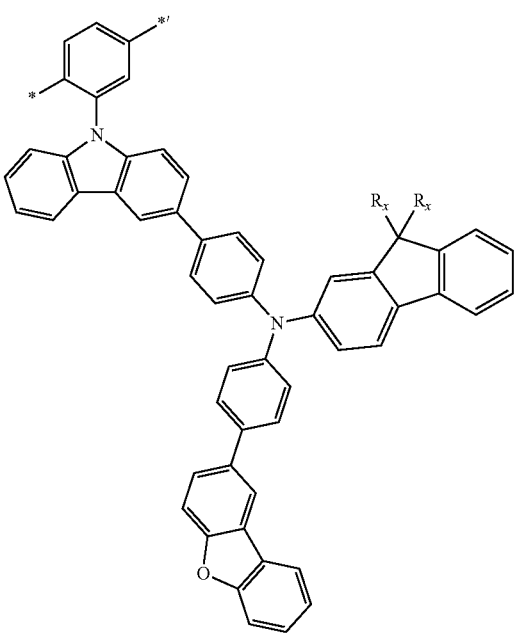

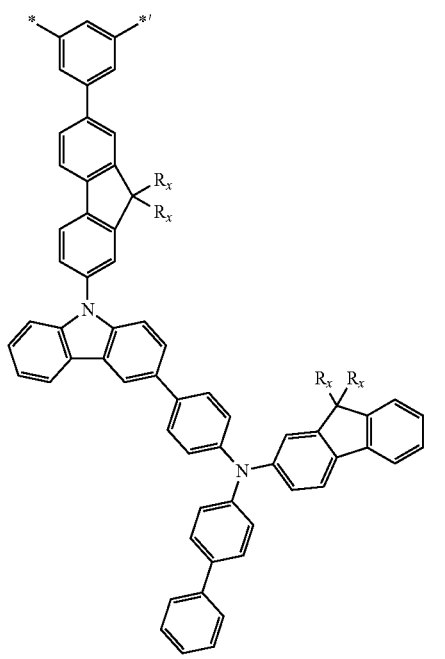
1-25
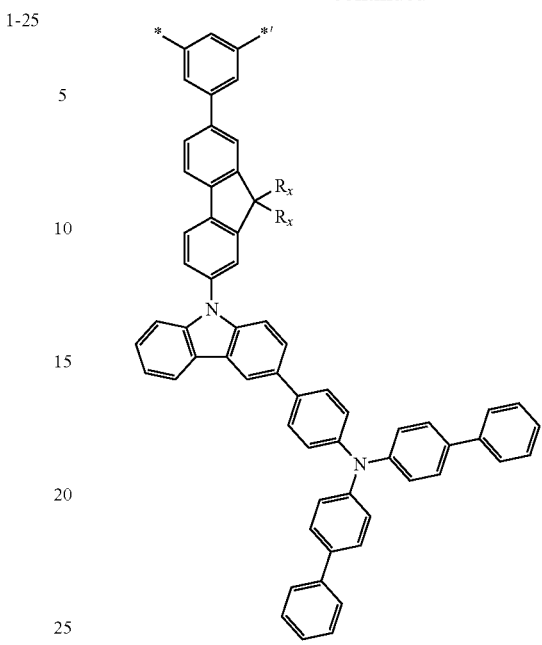
1-27
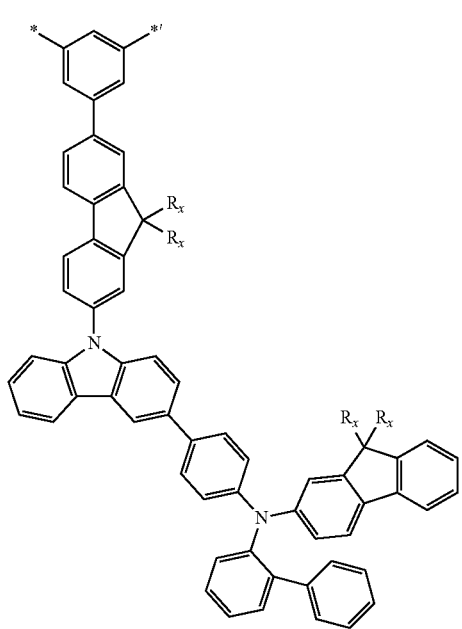
1-26
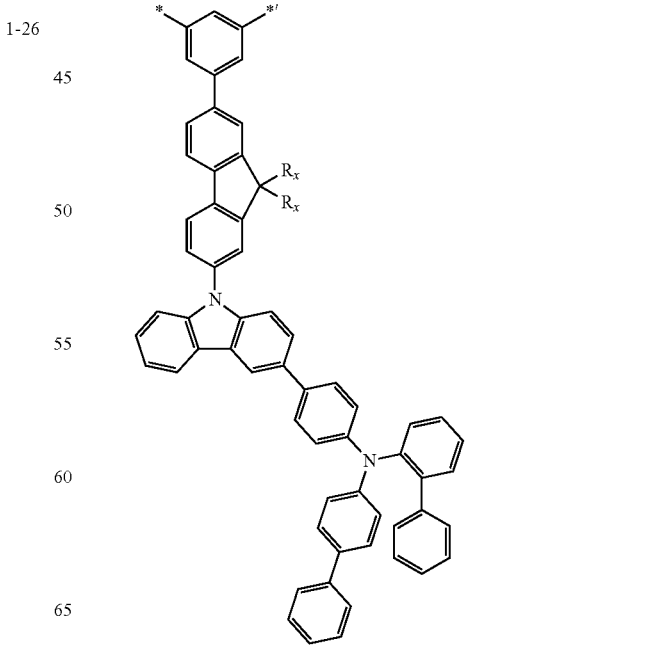
1-28

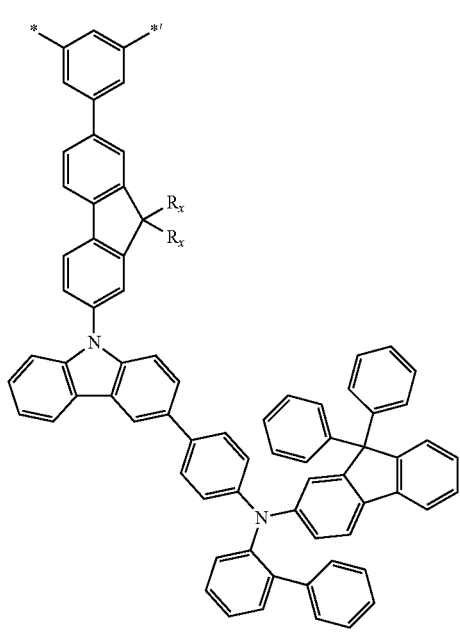
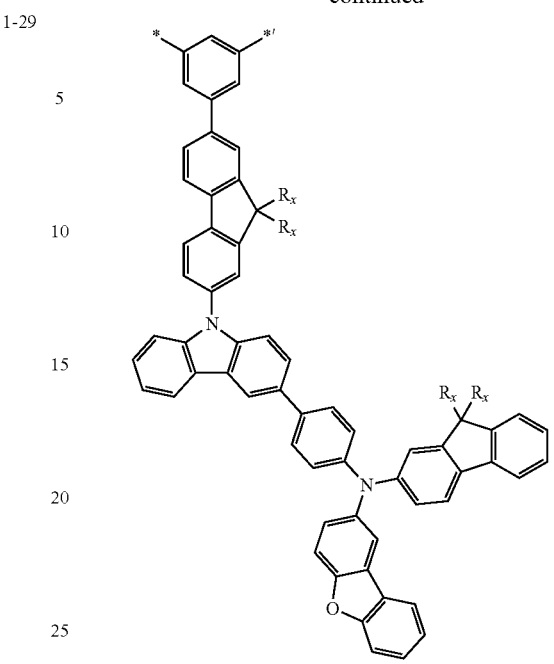

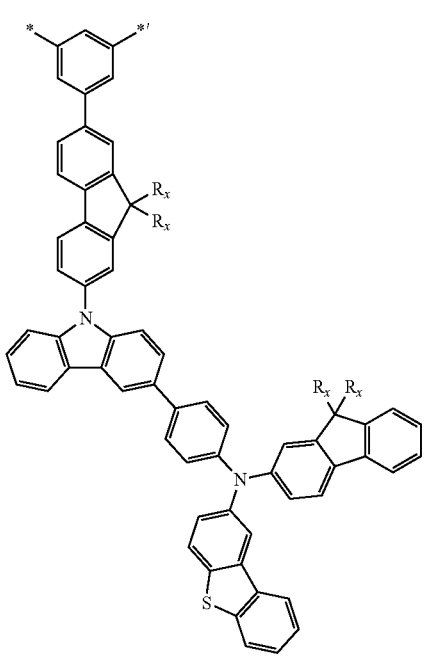
1-33
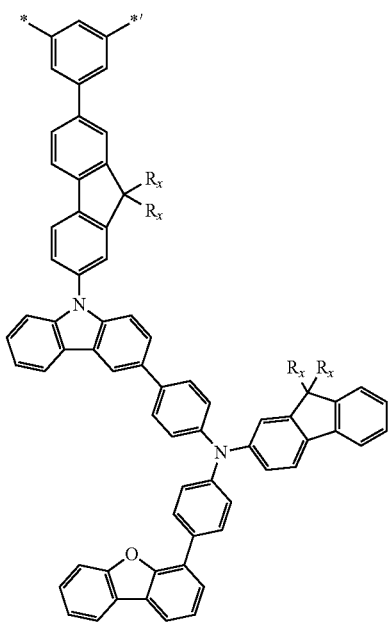
1-35
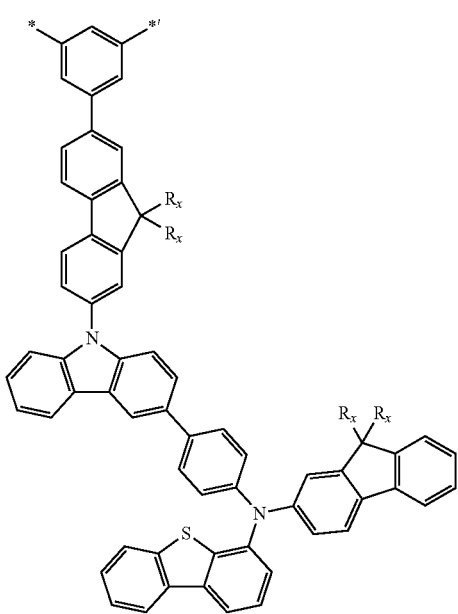
1-34
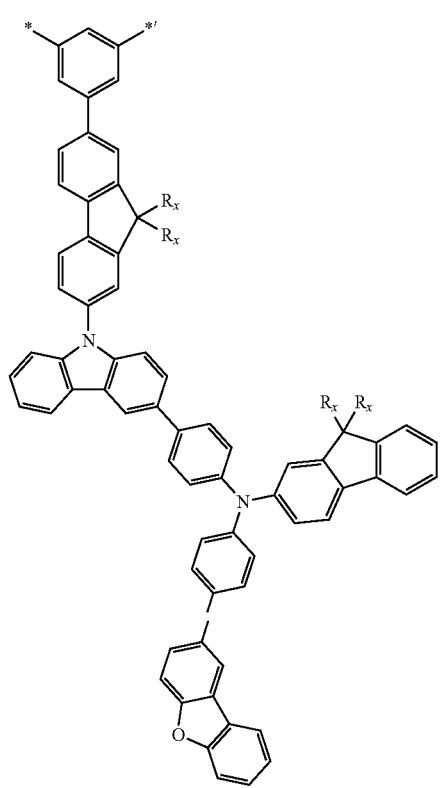
1-36

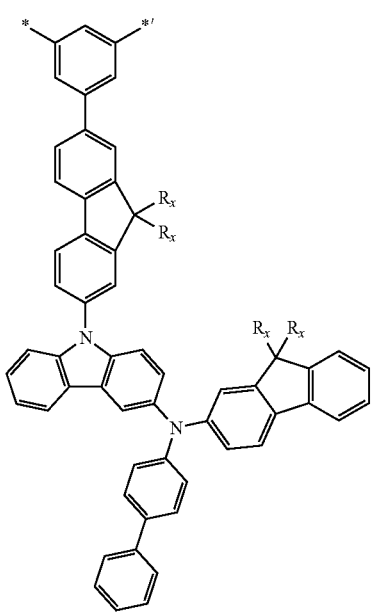
1-37
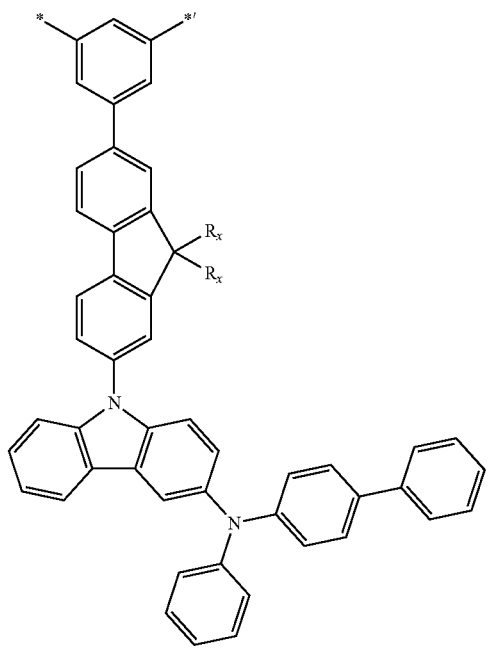
1-39
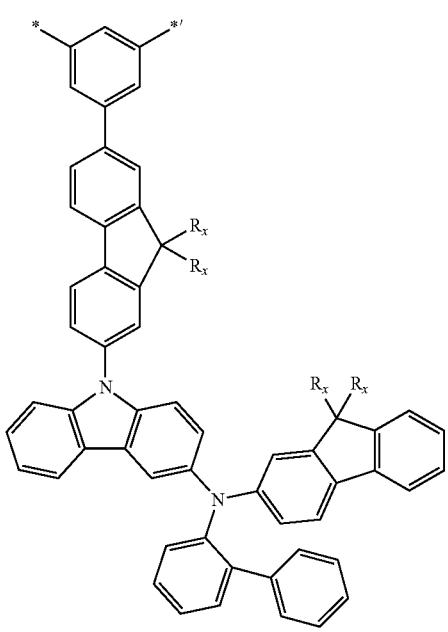
1-38
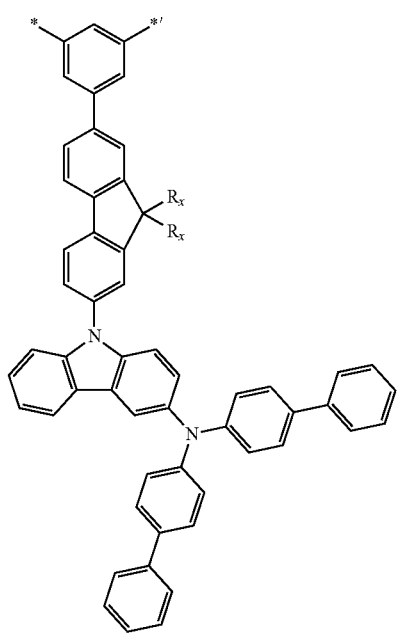
1-40

1-41

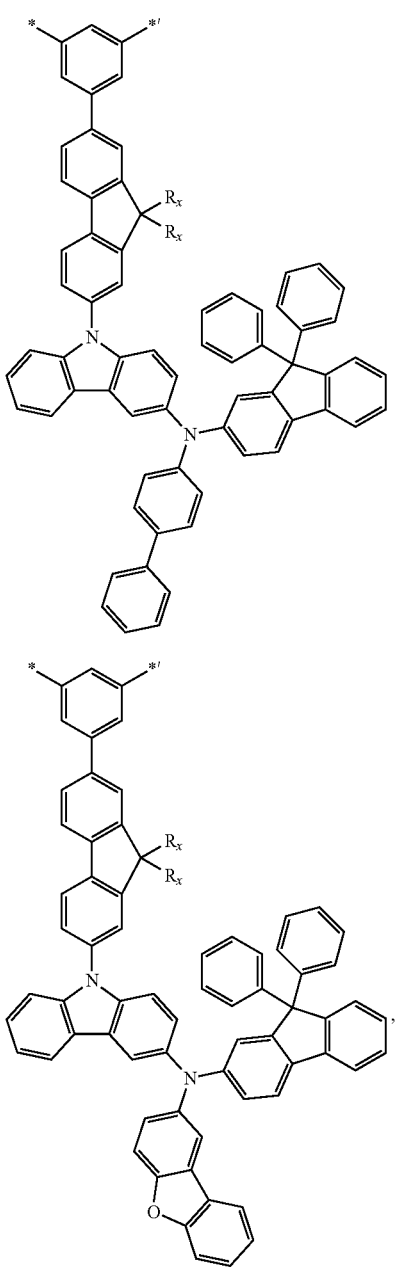

1-42 wherein, in Formulae 1-1 to 1-42,
$R_x$ is selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, and an n-eicosyl group, and
* and *' each indicate a binding site to a neighboring atom.

11. The polymer of claim 1, wherein
the second repeating unit represented by Formula 2 is selected from one of Formulae 2-1 to 2-3:

2-1

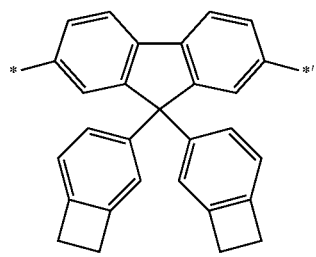

2-2

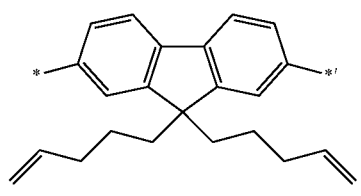

2-3

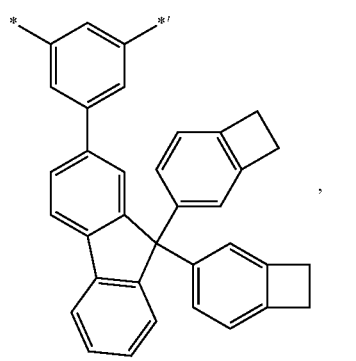

wherein, in Formulae 2-1 to 2-3,
* and *' each indicate a binding site to a neighboring atom.

12. The polymer of claim 1, further comprising a third repeating unit represented by Formula 3:

$$*—Ar_{31}—*',$$  Formula 3 wherein, in Formula 3,
$Ar_{31}$ is selected from a substituted or unsubstituted $C_5$-$C_{30}$ carbocyclic group and a substituted or unsubstituted $C_1$-$C_{30}$ heterocyclic group, and
* and *' each indicate a binding site to a neighboring atom.

13. The polymer of claim 12, wherein
$Ar_{31}$ is selected from:
a benzene group, a pentalene group, an indene group, a naphthalene group, an anthracene group, an azulene group, a heptacene group, an acenaphthalene group, a phenalene group, a fluorene group, an antraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group;

a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{21}$)($Q_{22}$), —Si($Q_{21}$)($Q_{22}$)($Q_{23}$), —CO($Q_{21}$), —O$_2$C($Q_{21}$), —CO$_2$($Q_{21}$), —C(O)N($Q_{21}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group; and a benzene group, a pentalene group, an indene group, a naphthalene group, an anthracene group, an azulene group, a heptacene group, an acenaphthalene group, a phenalene group, a fluorene group, an anthraquinone group, a naphthacene group, a phenanthrene group, a triphenylene group, a pyrene group, a chrysene group, a picene group, a perylene group, a pentaphene group, a pentacene group, a tetraphene group, a hexaphene group, a hexacene group, a rubicene group, a trinaphthalene group, a heptaphene group, a pyranthrene group, a pyrrole group, a pyrazole group, an imidazole group, an oxazole group, a thiazole group, a triazole group, a tetrazole group, an oxadiazole group, a pyridine group, a pyridazine group, a pyrimidine group, a triazine group, a carbazole group, an indole group, a quinoline group, an isoquinoline group, a benzimidazole group, an imidazopyridine group, and an imidazopyrimidine group, each substituted with at least one selected from a $C_6$-$C_{30}$ aryl group, a $C_1$-$C_{30}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a cyano group, a nitro group, a $C_1$-$C_{24}$ alkyl group, a $C_1$-$C_{24}$ alkoxy group, a $C_1$-$C_{24}$ alkylthio group, —N($Q_{31}$)($Q_{32}$), —Si($Q_{31}$)($Q_{32}$)($Q_{33}$), —CO($Q_{31}$), —O$_2$C($Q_{31}$), —CO$_2$($Q_{31}$), —C(O)N($Q_{31}$), an imine group, an imidic acid group, a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, a $C_7$-$C_{30}$ aryl alkyl group, a $C_7$-$C_{30}$ aryl alkoxy group, a $C_7$-$C_{30}$ aryl alkylthio group, a $C_8$-$C_{30}$ aryl alkenyl group, a $C_8$-$C_{30}$ aryl alkynyl group, a $C_1$-$C_{30}$ heteroaryl group, a monovalent non-aromatic condensed polycyclic group, and a monovalent non-aromatic condensed heteropolycyclic group, and $Q_{21}$ to $Q_{23}$ and $Q_{31}$ to $Q_{33}$ are each independently selected from hydrogen, a $C_1$-$C_{24}$ alkyl group, a $C_1$-$C_{30}$ heterocycloalkyl group, a $C_3$-$C_{30}$ cycloalkyl group, a $C_6$-$C_{30}$ aryl group, a $C_1$-$C_{30}$ heteroaryl group, a monovalent non-aromatic condensed polycyclic group, and a monovalent non-aromatic condensed heteropolycyclic group.

14. The polymer of claim 12, wherein
the third repeating unit represented by Formula 3 is selected from Formulae 3-1 and 3-2:

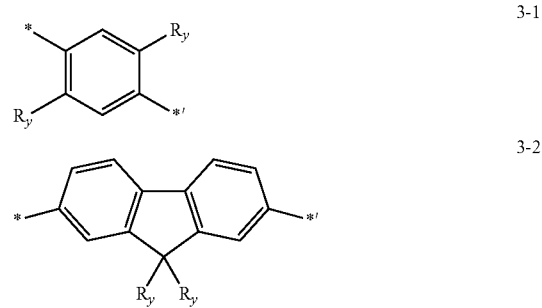

wherein, in Formulae 3-1 and 3-2,
$R_y$ is selected from a methyl group, an ethyl group, an n-propyl group, an iso-propyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an iso-hexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isppropylpropyl group, a 1-ethyl-3-methylbutyl group, an n-octyl group, a 2-ethylhexyl group, a 3-methyl-1-isopropylbutyl group, a 2-methyl-1-iso-propyl group, and a 1-tert-butyl-2-methylpropyl group, and

* and *' each indicate a binding site to a neighboring atom.

15. The polymer of claim 1, wherein
a number average molecular weight ($M_n$) of the polymer is in a range of about 10,000 Daltons to about 500,000 Daltons, or
a weight average molecular weight ($M_w$) of the polymer is in a range of about 1,000 Daltons to about 1,000,000 Daltons.

16. A composition comprising the polymer of claim 1.
17. The composition of claim 16, further comprising at least one selected from a hole transport material, an electron transport material, a light-emitting material, and an organometallic compound.

18. A light-emitting device comprising:
a first electrode;
a second electrode; and
an intermediate layer disposed between the first electrode and the second electrode,
wherein the intermediate layer comprises an emission layer, and
wherein the intermediate layer comprises at least one of the polymer of claim 1.

19. The light-emitting device of claim 18, wherein the emission layer comprises at least one selected from an organic compound and a semiconductor compound.

20. The light-emitting device of claim 19, wherein
the organic compound is a compound that emits light from triplet excitons, and
the semiconductor compound is a quantum dot.

* * * * *